(12) United States Patent
Nakano et al.

(10) Patent No.: US 7,846,560 B2
(45) Date of Patent: *Dec. 7, 2010

(54) MATERIAL FOR ORGANIC ELECTROLUMINESCENCE DEVICE AND ELECTROLUMINESCENCE DEVICE EMPLOYING THE SAME

(75) Inventors: Yuki Nakano, Chiba (JP); Masahide Matsuura, Chiba (JP); Hidetsugu Ikeda, Chiba (JP); Toshihiro Iwakuma, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/632,988

(22) Filed: Dec. 8, 2009

(65) Prior Publication Data

US 2010/0084971 A1  Apr. 8, 2010

Related U.S. Application Data

(63) Continuation of application No. 11/300,368, filed on Dec. 15, 2005, now Pat. No. 7,651,791.

(51) Int. Cl.
*H01J 1/63* (2006.01)
*C07D 307/91* (2006.01)
*C07D 333/52* (2006.01)
*C07D 401/10* (2006.01)

(52) U.S. Cl. .................. 428/690; 428/917; 313/504; 313/506; 549/43; 549/49; 549/460; 549/462; 556/406; 544/242; 546/268.1

(58) Field of Classification Search .................. None
See application file for complete search history.

(56) References Cited

U.S. PATENT DOCUMENTS

| 6,097,147 | A | 8/2000 | Baldo et al. ............. 313/506 |
| 6,229,012 | B1 | 5/2001 | Hu et al. ................. 544/180 |
| 7,128,982 | B2 | 10/2006 | Oshiyama et al. ......... 428/690 |
| 7,345,301 | B2 | 3/2008 | Gerhard et al. ............ 257/40 |
| 2003/0068535 | A1 | 4/2003 | Takiguchi et al. ......... 428/704 |
| 2005/0260441 | A1 | 11/2005 | Thompson et al. ......... 428/690 |
| 2006/0134538 | A1 | 6/2006 | Radu et al. ............. 430/58.16 |
| 2007/0141387 | A1* | 6/2007 | Nakano et al. ............ 428/690 |
| 2007/0224446 | A1 | 9/2007 | Nakano et al. |
| 2009/0224658 | A1 | 9/2009 | Iwakuma et al. |

FOREIGN PATENT DOCUMENTS

| JP | 3-200889 | 9/1991 |
| JP | 5-109485 | 4/1993 |
| JP | 7-138561 | 5/1995 |
| JP | 8-239655 | 9/1996 |
| JP | 2004-2351 | 1/2004 |
| JP | 2004-214050 | 7/2004 |
| JP | 2004-311404 | 11/2004 |
| JP | 2005-47868 | 2/2005 |
| WO | WO 01/41512 A1 | 6/2001 |
| WO | WO 2004/013080 | 2/2004 |
| WO | WO 2004/009645 A1 | 11/2004 |
| WO | WO 2005/054212 A3 | 6/2005 |

OTHER PUBLICATIONS

C.W. Tang, et al. "Organic Electroluminescent Diodes", Appl. Phys. Lett., vol. 51, No. 12, Sep. 21, 1987, pp. 913-915.
F.D. O'Brien, et al. "Improved Energy Transfer in Electrophosphorescent Devices", Applied Physics Letters, vol. 74, No. 3, Jan. 18, 1999, pp. 442-444.
M.A. Baldo, et al., "Very High-Efficiency Green Organic Light-Emitting Devices Based on Electrophosphorescence", Applied Physics Letters, vol. 75, No. 1, Jul. 5, 1999, pp. 4-7.
Machine Translation of JP 2004-311404.

* cited by examiner

*Primary Examiner*—D. Lawrence Tarazano
*Assistant Examiner*—Camie S Thompson
(74) *Attorney, Agent, or Firm*—Oblon, Spivak, McClelland, Maier & Neustadt, L.L.P.

(57) ABSTRACT

A material for organic electroluminescence devices comprising a compound having a specific structure and an organic electroluminescence device comprising an organic thin film layer which comprises one layer or a plurality of layers comprising at least a light emitting layer and disposed between a cathode and an anode, wherein at least one layer in the organic thin film layer comprises the material for organic electroluminescence devices, are provided. The material provides the organic electroluminescence device exhibiting a great efficiency of light emission, having no defect pixels, exhibiting excellent heat resistance and having a long life.

11 Claims, No Drawings

MATERIAL FOR ORGANIC ELECTROLUMINESCENCE DEVICE AND ELECTROLUMINESCENCE DEVICE EMPLOYING THE SAME

REFERENCE TO RELATED APPLICATIONS

The present application is a Continuation of U.S. application Ser. No. 11/300,368, Dec. 15, 2005, the entire contents of which are incorporated herein by reference.

TECHNICAL FIELD

The present invention relates to a material for organic electroluminescence devices and an organic electroluminescence device using the material and, more particularly, to a material for organic electroluminescence devices providing an electroluminescence device exhibiting a great efficiency of light emission, having no defect pixels, exhibiting excellent heat resistance and having a long life and an organic electroluminescence device using the material.

BACKGROUND ART

An organic electroluminescence ("electroluminescence" will be referred to as "EL", hereinafter) device is a spontaneous light emitting device which utilizes the principle that a fluorescent substance emits light by energy of recombination of holes injected from an anode and electrons injected from a cathode when an electric field is applied. Since an organic EL device of the laminate type driven under a low electric voltage was reported by C. W. Tang of Eastman Kodak Company (C. W. Tang and S. A. Vanslyke, Applied Physics Letters, Volume 51, Pages 913, 1987), many studies have been conducted on organic EL devices using organic materials as the constituting materials. Tang et al. used a laminate structure using tris(8-quinolinolato)aluminum for the light emitting layer and a triphenyldiamine derivative for the hole transport layer. Advantages of the laminate structure are that the efficiency of hole injection into the light emitting layer can be increased, that the efficiency of forming excitons by recombination can be increased by blocking electrons injected from the cathode, and that excitons formed can be enclosed within the light emitting layer. As the structure of the organic EL device, a two-layered structure having a hole transport (injection) layer and an electron transport and light emitting layer and a three-layered structure having a hole transport (injection) layer, a light emitting layer and an electron transport (injection) layer are well known. To increase the efficiency of recombination of injected holes and electrons in the devices of the laminate type, the structure of the device and the process for forming the device have been studied.

As the light emitting material of the organic EL device, chelate complexes such as tris(8-quinolinolato)aluminum, coumarine derivatives, tetraphenylbutadiene derivatives, distyrylarylene derivatives and oxadiazole derivatives are known. It is reported that light in the visible region ranging from blue light to red light can be obtained by using these light emitting materials, and development of a device exhibiting color images is expected (For example, Patent Reference 1, Patent Reference 2 and Patent Reference 3).

It is recently proposed that an organic phosphorescent material other than a fluorescent material is used in the light emitting layer of an organic EL device (for example, Non-Patent Reference 1 and Non-Patent Reference 2). A great efficiency of light emission is achieved, as described above, by utilizing an organic phosphorescent material excited to the singlet state and the triplet state in the light emitting layer of an organic EL device. It is considered that singlet and triplet of the excited state are formed in relative amounts of 1:3 due to the difference in the multiplicity of spin when electrons and holes are recombined in an organic EL device. Therefore, it is expected that an efficiency of light emission 3 to 4 times as great as that of a device utilizing fluorescence alone can be achieved by utilizing a material emitting phosphorescent light.

In the organic EL devices described above, a construction formed by successively laminating layers such as an anode, a hole transport layer, an organic light emitting layer, an electron transport layer (a hole blocking layer), an electron transport layer and a cathode is used so that the excited state of the triplet or the excitons of the triplet do not disappear, and a host compound and a phosphorescent compound are used for the organic light emitting layer (for example, Patent Reference 4 and Patent Reference 5). In these patent references, 4,4-N,N-dicarbazole-biphenyl is used as the host compound. This compound has a glass transition temperature of 110° C. or lower, and the symmetry is excessively excellent since the skeleton structure of biphenyl is bonded to the nitrogen atom on the central line of the skeleton structure of carbazole molecule. Therefore, problems arise in that this compound is easily crystallized and that short circuit takes place and defect pixels are formed in the test of heat resistance of the device.

It is also found that, when the compound is vapor deposited, growth of crystals takes place at portions where foreign substances or protrusions are present, and defects are formed at an early time before the test of heat resistance and continue to grow with time. Carbazole derivatives having the threefold symmetry are also used as the host compound. However, since these compounds have structures exhibiting an excellent symmetry with respect to the nitrogen atom on the central line of the skeleton structure of carbazole in the molecule, it is inevitable that growth of crystals takes place in the vapor deposition at portions where foreign substances or protrusions are present, and defects are formed at an early time before the test of heat resistance and continue to grow with time.

Devices having a fluorescent benzofuran compound or a fluorescent dibenzofuran compound are disclosed (Patent Reference 6). However, no specific descriptions are found on compounds having a substituent at the 7-position of benzofuran or at the 4-position or the 6-position of dibenzofuran, or no descriptions are found on exhibition of a unique property.

A compound having a 4-biphenylindol structure at the 4-position of benzofuran as the substituent is shown as an example of the host compound in a phosphorescent device, and an example using the compound as the host for an iridium complex which is a phosphorescent light emitting material emitting bluish green light is shown (Patent Reference 7). However, since substituents are present at all positions of the benzene ring substituted at the 4-position of benzofuran, the compound is unstable due to the great steric hindrance, and there is the possibility that the obtained EL device has a short life. No compounds having bonding at the 4-position of benzothiophene are clearly disclosed.

A compound having a skeleton structure of benzothiophene in which the skeleton structure of anthracene is essential is disclosed (Patent Reference 8). However, it is considered that application of this compound to a phosphorescence device is difficult since this compound has the skeleton structure of anthracene having a narrow triplet energy gap. A furan-based compound in which the skeleton structure of anthracene is essential is disclosed (Patent Reference 9). However, no descriptions are found on compounds having a substituent at the 7-position of benzofuran or at the 4-position or 6-position of dibenzofuran, or no excellent properties of these compounds are found. A benzofuran compound bonded to the skeleton structure of pyrene is disclosed (Patent Reference 10). However, it is considered that the application of the compound to the organic EL device of the phosphorescent type is difficult due to the narrow triplet state energy gap of the skeleton structure of pyrene. No examples using the compound are found.

In Patent Reference 11, a dibenzofuran compound having the skeleton structure of benzotriazole is described. However, it is considered that that the application of the compound to the organic EL device of the phosphorescent type is difficult due to the narrow triplet state energy gap. No examples using the compound are found.

[Patent Reference 1] Japanese Patent Application Laid-Open No. Heisei 8 (1996)-239655

[Patent Reference 2] Japanese Patent Application Laid-Open No. Heisei 7 (1995)-138561

[Patent Reference 3] Japanese Patent Application Laid-Open No. Heisei 3 (1991)-200289

[Patent Reference 4] U.S. Pat. No. 6,097,147

[Patent Reference 5] International Patent Publication No. WO 2001/41512

[Patent Reference 6] Japanese Patent Application Laid-Open No. Heisei 5 (1993)-109485

[Patent Reference 7] Japanese Patent Application Laid-Open No. 2004-214050

[Patent Reference 8] Japanese Patent Application Laid-Open No. 2004-002351

[Patent Reference 9] Japanese Patent Application Laid-Open No. 2005-047868

[Patent Reference 10] International Patent Publication No. WO 2004/096945

[Patent Reference 11] International Patent Publication No. WO 2005/054212

[Non-Patent Reference 1] D. F. O'Brien, M. A. Baldo et al., "Improved energy transfer in electrophosphorescent devices", Vol. 74, No. 3, pp 442 to 444, Jan. 18, 1999

[Non-Patent Reference 2] M. A. Baldo et al., "Very high-efficiency green organic light-emitting devices based on electrophosphorescence", Applied Physics letters, Vol. 75, No. 1, pp 4-6, Jul. 5, 1999

DISCLOSURE OF THE INVENTION

Problems to be Overcome by the Invention

The present invention has been made to overcome the above problems and has an object of providing a material for organic EL devices which provides an EL device exhibiting a great efficiency of light emission, having no defect pixels, exhibiting excellent heat resistance and having a long life and an organic EL device using the material.

Means for Overcoming the Problems

As the result of intensive studies by the present inventors to achieve the above object, it was found that an EL device exhibiting a great efficiency of light emission, having no defect pixels, exhibiting excellent heat resistance and having a long life could be obtained by using a compound represented by the following general formula (1) as the material of the organic EL device. The present invention has been completed based on this knowledge.

The present invention provides a material for organic EL devices which comprises a compound represented by any one of the following general formulae (1) to (14):

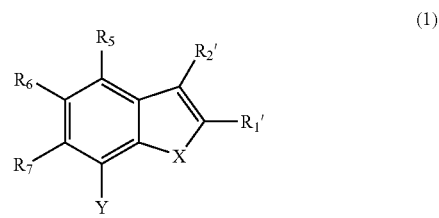

In the above general formula (1), $R_1'$, $R_2'$ and $R_5$ to $R_7$ each independently represent hydrogen atom, a halogen atom, an alkyl group having 1 to 40 carbon atoms which may have substituents, a heterocyclic group having 3 to 60 carbon atoms and having no skeleton structure of benzotriazole which may have substituents, an alkoxyl group having 1 to 40 carbon atoms which may have substituents, an aryl group having 6 to 60 carbon atoms which may have substituents, an aryloxyl group having 6 to 60 carbon atoms which may have substituents, an aralkyl group having 7 to 60 carbon atoms which may have substituents, an alkenyl group having 2 to 40 carbon atoms which may have substituents, an alkylamino group having 1 to 40 carbon atoms which may have substituents, an aralkylamino group having 7 to 60 carbon atoms which may have substituents, an alkylsilyl group having 3 to 20 carbon atoms which may have substituents, an arylsilyl group having 8 to 40 carbon atoms which may have substituents, a ketoaryl group having 7 to 40 carbon atoms which may have substituents, a halogenated alkyl group having 1 to 40 carbon atoms which may have substituents or cyano group;

a pair of groups represented by $R_1'$ and $R_2'$, $R_5$ and $R_6$ or $R_6$ and $R_7$ may be bonded to each other to form a saturated or unsaturated cyclic structure;

X represents sulfur atom, oxygen atom or a substituted silicon atom represented by SiRaRb, Ra and Rb each independently representing an alkyl group having 1 to 40 carbon atoms; and Y represents an alkyl group having 1 to 40 carbon atoms which may have substituents, a heterocyclic group having 3 to 60 carbon atoms and having no skeleton structure of benzotriazole which may have substituents, an alkoxyl group having 1 to 40 carbon atoms which may have substituents, an aryl group having 6 to 60 carbon atoms which may have substituents, an aryloxyl group having 6 to 60 carbon atoms which may have substituents, an aralkyl group having 7 to 60 carbon atoms which may have substituents, an alkenyl group having 2 to 40 carbon atoms which may have substituents, an alkylamino group having 1 to 40 carbon atoms which may have substituents, an aralkylamino group having 7 to 60 carbon atoms which may have substituents, an alkylsilyl group having 3 to 20 carbon atoms which may have substituents, an arylsilyl group having 8 to 40 carbon atoms which may have substituents or a halogenated alkyl group having 1 to 40 carbon atoms which may have substituents.

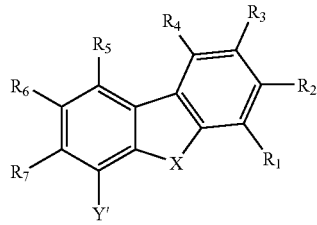

(2)

In the above general formula (2), $R_1$ to $R_7$ each independently represent a same atom or group as that represented by $R_1'$, $R_2'$, $R_5$, $R_6$ or $R_7$ in general formula (1), $R_1$ not representing a group having a skeleton structure of anthracene;

adjacent groups among groups represented by $R_1$ to $R_4$ and among groups represented by $R_5$ to $R_7$ may be bonded to each other to form a saturated or unsaturated cyclic structure;

X is as defined for general formula (1); and

Y' represents an alkyl group having 1 to 40 carbon atoms which may have substituents, a heterocyclic group having 3 to 60 carbon atoms and having no skeleton structure of benzotriazole which may have substituents, an alkoxyl group having 1 to 40 carbon atoms which may have substituents, an aryl group having 6 to 60 carbon atoms and having no skeleton structure of pyrene which may have substituents, an aryloxyl group having 6 to 60 carbon atoms which may have substituents, an aralkyl group having 7 to 60 carbon atoms which may have substituents, an alkenyl group having 2 to 40 carbon atoms which may have substituents, an alkylamino group having 1 to 40 carbon atoms which may have substituents, an aralkylamino group having 7 to 60 carbon atoms which may have substituents, an alkylsilyl group having 3 to 20 carbon atoms which may have substituents, an arylsilyl group having 8 to 40 carbon atoms which may have substituents or a halogenated alkyl group having 1 to 40 carbon atoms which may have substituents.

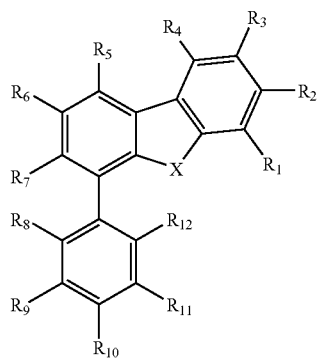

(3)

In the above general formula (3), $R_1$ to $R_{12}$ each independently represent a same atom or group as that represented by $R_1'$, $R_2'$, $R_5$, $R_6$ or $R_7$ in general formula (1), at least one of $R_8$ to $R_{12}$ representing hydrogen atom;

adjacent groups among groups represented by $R_1$ to $R_4$, among groups represented by $R_5$ to $R_7$ and among groups represented by $R_8$ to $R_{12}$ may be bonded to each other to form a saturated or unsaturated cyclic structure; and X is as defined for general formula (1).

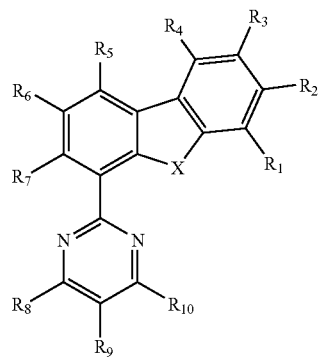

(4)

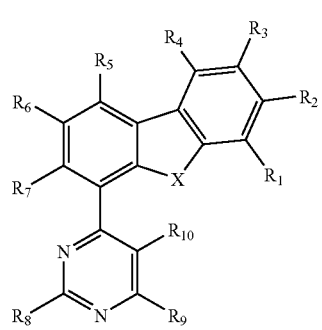

(5)

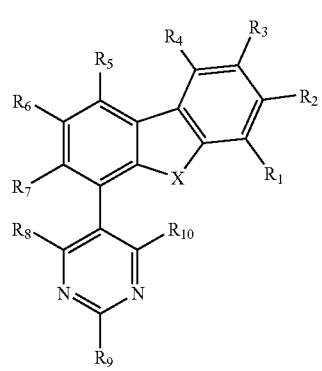

(6)

In the above general formulae (4), (5) and (6), $R_1$ to $R_{10}$ each independently represent a same atom or group as that represented by $R_1'$, $R_2'$, $R_5$, $R_6$ or $R_7$ in general formula (1);

adjacent groups among groups represented by $R_1$ to $R_4$, among groups represented by $R_5$ to $R_7$ and among groups represented by $R_8$ to $R_{10}$ in general formula (4), adjacent groups among groups represented by $R_1$ to $R_4$ and among groups represented by $R_5$ to $R_7$ and adjacent groups represented by $R_9$ and $R_{10}$ in general formula (5), and adjacent groups among groups represented by $R_1$ to $R_4$ and among groups represented by $R_5$ to $R_7$ and groups represented by $R_7$ and $R_8$ in general formula (6) may be bonded to each other to form a saturated or unsaturated cyclic structure; and X is as defined for general formula (1).

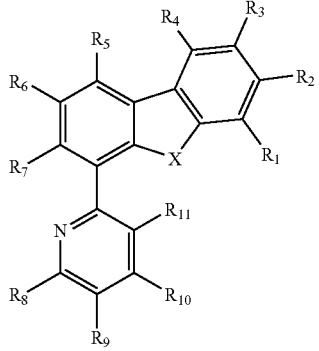
(7)

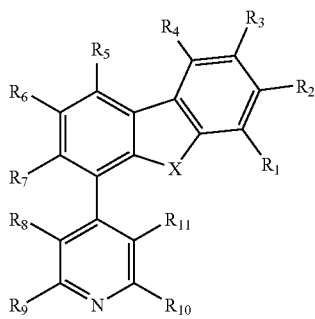
(8)

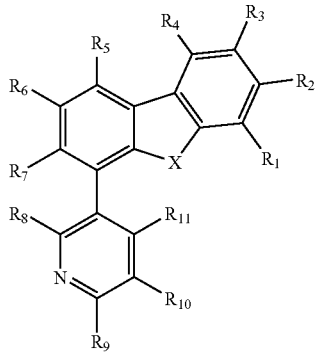
(9)

In the above general formulae (7), (8) and (9), $R_1$ to $R_{11}$ each independently represent a same atom or group as that represented by $R_1'$, $R_2'$, $R_5$, $R_6$ or $R_7$ in general formula (1);

adjacent groups among groups represented by $R_1$ to $R_4$, among groups represented by $R_5$ to $R_7$ and among groups represented by $R_8$ to $R_{11}$ in general formula (7), adjacent groups among groups represented by $R_1$ to $R_4$ and among groups represented by $R_5$ to $R_7$, adjacent groups represented by $R_8$ and $R_9$, adjacent groups represented by $R_{10}$ and $R_{11}$ and adjacent groups represented by $R_7$ and $R_8$ in general formula (5), and adjacent groups among groups represented by $R_1$ to $R_4$, among groups represented by $R_5$ to $R_7$ and among groups represented by $R_9$ to $R_{11}$ and groups represented by $R_7$ and $R_8$ in general formula (6) may be bonded to each other to form a saturated or unsaturated cyclic structure; and X is as defined for general formula (1).

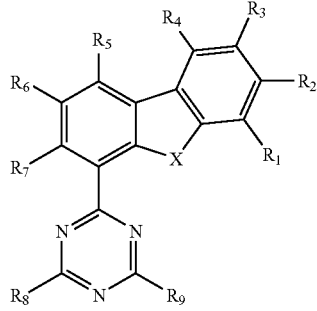
(10)

In the above general formula (10), $R_1$ to $R_9$ each independently represent a same atom or group as that represented by $R_1'$, $R_2'$, $R_5$, $R_6$ or $R_7$ in general formula (1);

adjacent groups among groups represented by $R_1$ to $R_4$ and among groups represented by $R_5$ to $R_7$ may be bonded to each other to form a saturated or unsaturated cyclic structure; and X is as defined for general formula (1).

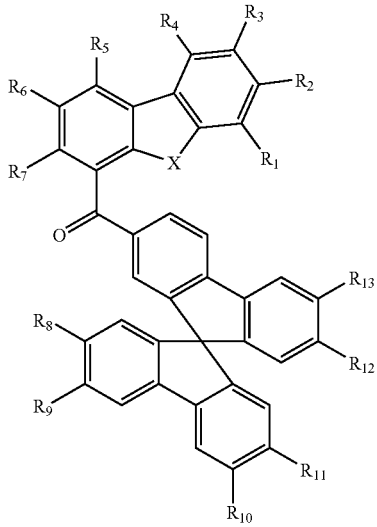
(11)

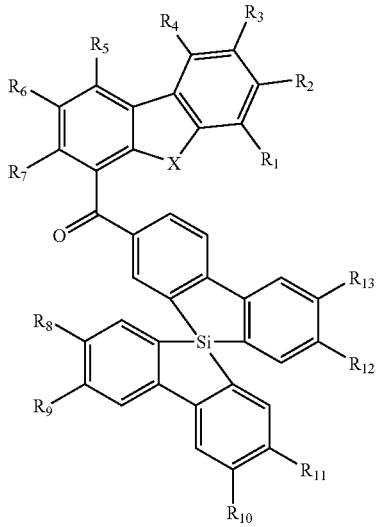
(12)

In the above general formulae (11) and (12), $R_1$ to $R_{13}$ each independently represent a same atom or group as that represented by $R_1'$, $R_2'$, $R_5$, $R_6$ or $R_7$ in general formula (1);

adjacent groups among groups represented by $R_1$ to $R_4$ and among groups represented by $R_5$ to $R_7$, adjacent groups represented by $R_8$ and $R_9$, adjacent groups represented by $R_{10}$ and $R_{11}$ and adjacent groups represented by $R_{12}$ and $R_{13}$ may be bonded to each other to form a saturated or unsaturated cyclic structure; and X is as defined for general formula (1).

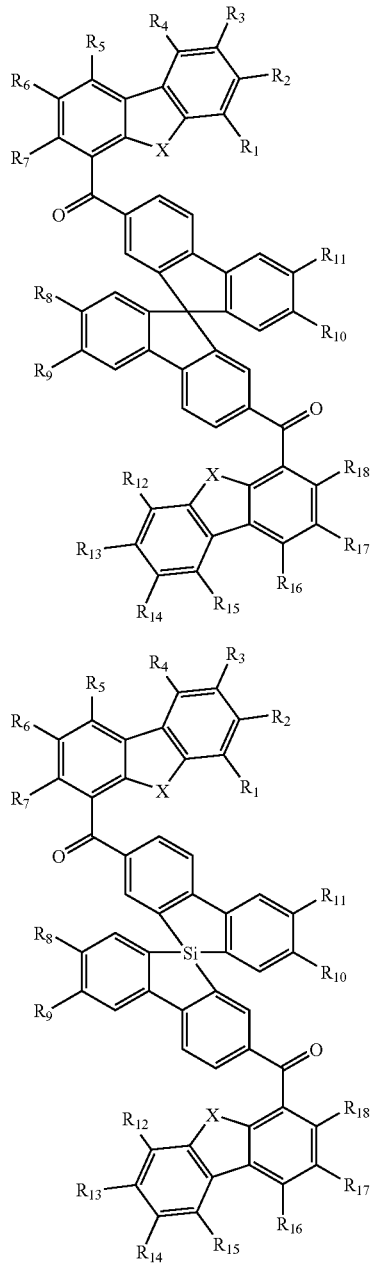

In the above general formulae (13) and (14), $R_1$ to $R_{18}$ each independently represent a same atom or group as that represented by $R_1'$, $R_2'$, $R_5$, $R_6$ or $R_7$ in general formula (1);

adjacent groups among groups represented by $R_1$ to $R_4$, among groups represented by $R_5$ to $R_7$, among groups represented by $R_{12}$ to $R_{15}$ and among groups represented by $R_{16}$ to $R_{18}$, adjacent groups represented by $R_8$ and $R_9$ and adjacent groups represented by $R_{10}$ and $R_{11}$ may be bonded to each other to form a saturated or unsaturated cyclic structure; and X is as defined for general formula (1).

The present invention further provides an organic electroluminescence device comprising a cathode, an anode and an organic thin film layer which comprises one layer or a plurality of layers comprising at least a light emitting layer and is disposed between the anode and the cathode, wherein at least one layer in the organic thin film layer comprises the material for organic electroluminescence devices described above.

The Effect of the Invention

To summarize the advantages of the present invention, the organic EL device exhibiting a great efficiency of light emission, having no defect pixels, exhibiting excellent heat resistance and having a long life can be obtained by utilizing the material for organic EL devices which comprises the compound represented by general formula (1) and, therefore, the organic EL device of the present invention is very useful as the light source for various electronic instruments.

THE MOST PREFERRED EMBODIMENT TO CARRY OUT THE INVENTION

The material for organic EL devices of the present invention comprises a compound represented by any one of the following general formulae (1) to (14);

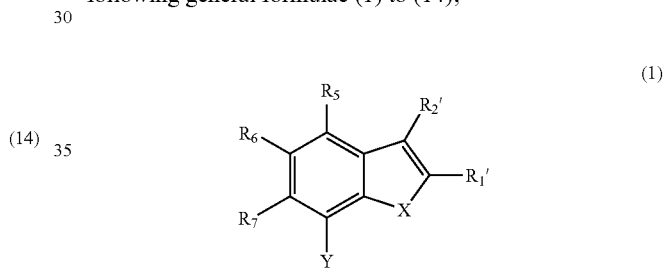

In the above general formula (1), $R_1'$, $R_2'$ and $R_5$ to $R_7$ each independently represent hydrogen atom, a halogen atom, an alkyl group having 1 to 40 carbon atoms which may have substituents, a heterocyclic group having 3 to 60 carbon atoms and having no skeleton structure of benzotriazole which may have substituents, an alkoxyl group having 1 to 40 carbon atoms which may have substituents, an aryl group having 6 to 60 carbon atoms which may have substituents, an aryloxyl group having 6 to 60 carbon atoms which may have substituents, an aralkyl group having 7 to 60 carbon atoms which may have substituents, an alkenyl group having 2 to 40 carbon atoms which may have substituents, an alkylamino group having 1 to 40 carbon atoms which may have substituents, an aralkylamino group having 7 to 60 carbon atoms which may have substituents, an alkylsilyl group having 3 to 20 carbon atoms which may have substituents, an arylsilyl group having 8 to 40 carbon atoms which may have substituents, a ketoaryl group having 7 to 40 carbon atoms which may have substituents, a halogenated alkyl group having 1 to 40 carbon atoms which may have substituents or cyano group; a pair of groups represented by $R_1'$ and $R_2'$, $R_5$ and $R_6$ or $R_6$ and $R_7$ may be bonded to each other to form a saturated or unsaturated cyclic structure; X represents sulfur atom, oxygen atom or a substituted silicon atom represented by SiRaRb, Ra and Rb each independently representing an alkyl group having 1 to 40 carbon atoms; and Y represents an alkyl group having 1 to 40 carbon atoms which may have substituents, a heterocyclic group having 3 to 60 carbon atoms and having no skeleton structure of benzotriazole which may have substituents, an alkoxyl group having 1 to 40 carbon atoms which may have substituents, an aryl group having 6 to 60 carbon atoms which may have substituents, an aryloxyl group having 6 to 60 carbon atoms which may have substituents, an aralkyl group having 7 to 60 carbon atoms which may have substituents, an alkenyl group having 2 to 40 carbon atoms which may have substituents, an alkylamino group having 1 to 40 carbon atoms which may have substituents, an aralkylamino group having 7 to 60 carbon atoms which may have substituents, an alkylsilyl group having 3 to 20 carbon atoms which may have substituents, an arylsilyl group having 8 to 40 carbon atoms which may have substituents or a halogenated alkyl group having 1 to 40 carbon atoms which may have substituents.

In the above general formula (3), $R_1$ to $R_{12}$ each independently represent the same atom or group as that represented by $R_1'$, $R_2'$, $R_5$, $R_6$ or $R_7$ in general formula (1), at least one of $R_8$ to $R_{12}$ representing hydrogen atom; adjacent groups among groups represented by $R_1$ to $R_4$, among groups represented by $R_5$ to $R_7$ and among groups represented by $R_8$ to $R_{12}$ may be bonded to each other to form a saturated or unsaturated cyclic structure; and X is as defined for general formula (1).

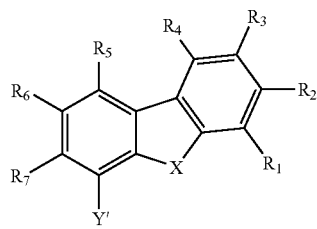

(2)

In the above general formula (2), $R_1$ to $R_7$ each independently represent the same atom or group as that represented by $R_1'$, $R_2'$, $R_5$, $R_6$ or $R_7$ in general formula (1), $R_1$ not representing a group having a skeleton structure of anthracene; adjacent groups among groups represented by $R_1$ to $R_4$ and among groups represented by $R_5$ to $R_7$ may be bonded to each other to form a saturated or unsaturated cyclic structure; X is as defined for general formula (1); and Y' represents an alkyl group having 1 to 40 carbon atoms which may have substituents, a heterocyclic group having 3 to 60 carbon atoms and having no skeleton structure of benzotriazole which may have substituents, an alkoxyl group having 1 to 40 carbon atoms which may have substituents, an aryl group having 6 to 60 carbon atoms and having no skeleton structure of pyrene which may have substituents, an aryloxyl group having 6 to 60 carbon atoms which may have substituents, an aralkyl group having 7 to 60 carbon atoms which may have substituents, an alkenyl group having 2 to 40 carbon atoms which may have substituents, an alkylamino group having 1 to 40 carbon atoms which may have substituents, an aralkylamino group having 7 to 60 carbon atoms which may have substituents, an alkylsilyl group having 3 to 20 carbon atoms which may have substituents, an arylsilyl group having 8 to 40 carbon atoms which may have substituents or a halogenated alkyl group having 1 to 40 carbon atoms which may have substituents.

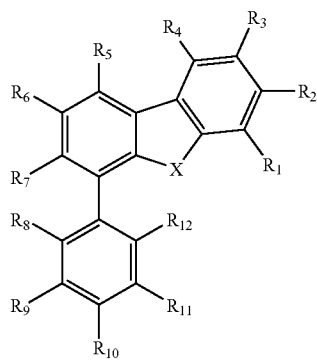

(3)

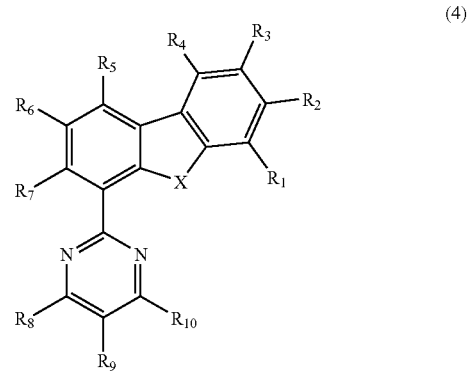

(4)

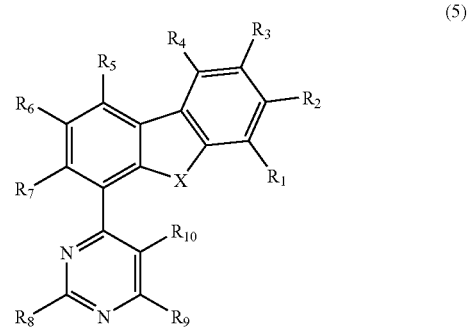

(5)

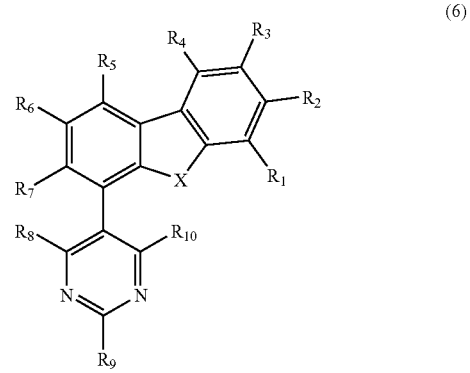

(6)

In the above general formulae (4) to (6), $R_1$ to $R_{10}$ each independently represent the same atom or group as that represented by $R_1'$, $R_2'$, $R_5$, $R_6$ or $R_7$ in general formula (1); adjacent groups among groups represented by $R_1$ to $R_4$, among groups represented by $R_5$ to $R_7$ and among groups represented by $R_8$ to $R_{10}$ in general formula (4), adjacent groups among groups represented by $R_1$ to $R_4$ and among groups represented by $R_5$ to $R_7$ and adjacent groups represented by $R_9$ and $R_{10}$ in general formula (5), and adjacent groups among groups represented by $R_1$ to $R_4$ and among groups represented by $R_5$ to $R_7$ and groups represented by $R_7$ and $R_8$ in general formula (6) may be bonded to each other to form a saturated or unsaturated cyclic structure; and X is as defined for general formula (1).

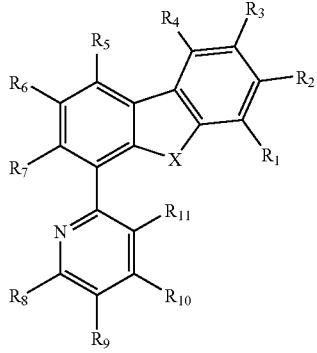
(7)

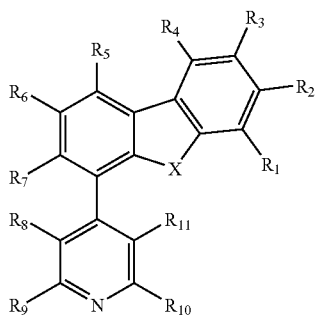
(8)

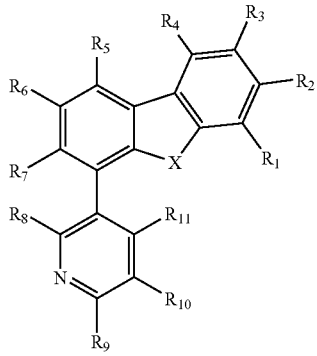
(9)

In the above general formulae (7) to (9), $R_1$ to $R_{11}$ each independently represent the same atom or group as that represented by $R_1'$, $R_2'$, $R_5$, $R_6$ or $R_7$ in general formula (1); adjacent groups among groups represented by $R_1$ to $R_4$, among groups represented by $R_5$ to $R_7$ and among groups represented by $R_8$ to $R_{11}$ in general formula (7), adjacent groups among groups represented by $R_1$ to $R_4$ and among groups represented by $R_5$ to $R_7$, adjacent groups represented by $R_8$ and $R_9$, adjacent groups represented by $R_{10}$ and $R_{11}$ and adjacent groups represented by $R_7$ and $R_8$ in general formula (5), and adjacent groups among groups represented by $R_1$ to $R_4$, among groups represented by $R_5$ to $R_7$ and among groups represented by $R_9$ to $R_{11}$ and groups represented by $R_7$ and $R_8$ in general formula (6) may be bonded to each other to form a saturated or unsaturated cyclic structure; and X is as defined for general formula (1).

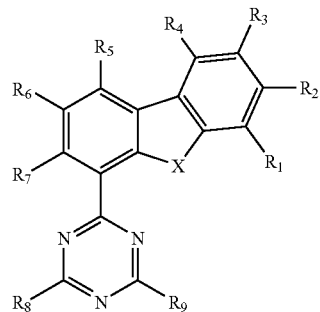
(10)

In the above general formula (10), $R_1$ to $R_9$ each independently represent the same atom or group as that represented by $R_1'$, $R_2'$, $R_5$, $R_6$ or $R_7$ in general formula (1); adjacent groups among groups represented by $R_1$ to $R_4$ and among groups represented by $R_5$ to $R_7$ may be bonded to each other to form a saturated or unsaturated cyclic structure; and X is as defined for general formula (1).

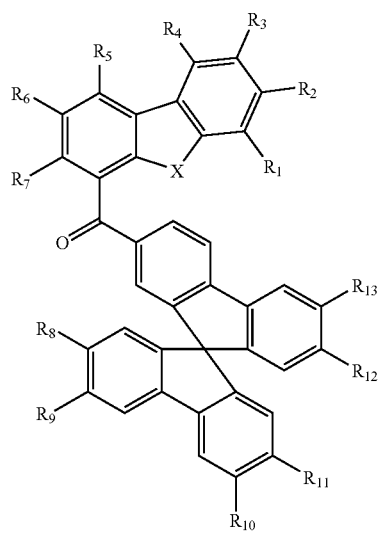
(11)

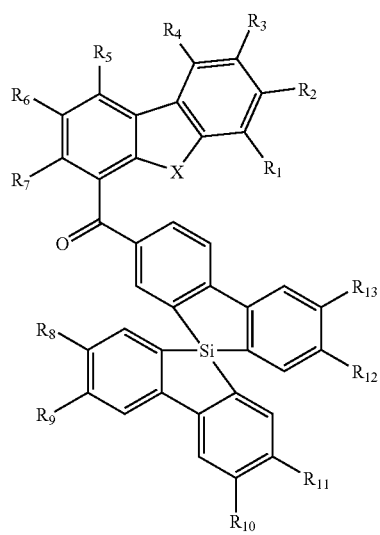
(12)

In the above general formulae (11) and (12), $R_1$ to $R_{13}$ each independently represent the same atom or group as that represented by $R_1'$, $R_2'$, $R_5$, $R_6$ or $R_7$ in general formula (1); adjacent groups among groups represented by $R_1$ to $R_4$ and among groups represented by $R_5$ to $R_7$, adjacent groups represented by $R_8$ and $R_9$, adjacent groups represented by $R_{10}$ and $R_{11}$ and adjacent groups represented by $R_{12}$ and $R_{13}$ may be bonded to each other to form a saturated or unsaturated cyclic structure; and X is as defined for general formula (1).

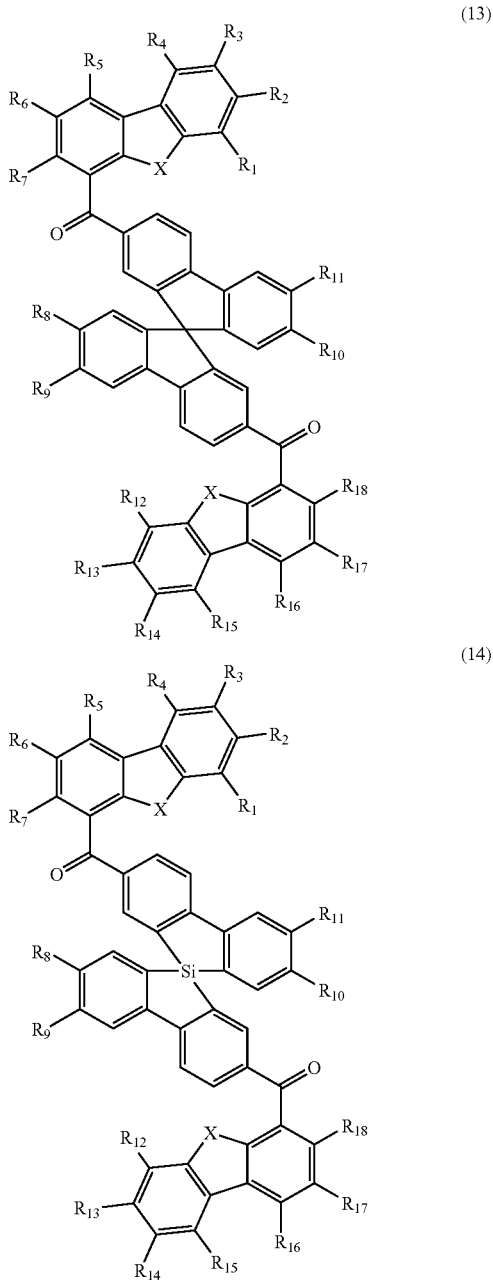

In the above general formulae (13) and (14), $R_1$ to $R_{18}$ each independently represent the same atom or group as that represented by $R_1'$, $R_2'$, $R_5$, $R_6$ or $R_7$ in general formula (1); adjacent groups among groups represented by $R_1$ to $R_4$, among groups represented by $R_5$ to $R_7$, among groups represented by $R_{12}$ to $R_{15}$ and among groups represented by $R_{16}$ to $R_{18}$, adjacent groups represented by $R_8$ and $R_9$ and adjacent groups represented by $R_{10}$ and $R_{11}$ may be bonded to each other to form a saturated or unsaturated cyclic structure; and X is as defined for general formula (1).

Examples of the halogen atom represented by $R_1'$, $R_2'$ and $R_1$ to $R_{18}$ include fluorine atom, chlorine atom, bromine atom and iodine atom.

Examples of the alkyl group having 1 to 40 carbon atoms and may have substituents, which is represented by $R_1'$, $R_2'$, $R_1$ to $R_{18}$, Y and Y', include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 1,2-dinitroethyl group, 2,3-dinitro-t-butyl group, 1,2,3-trinitropropyl group, cyclopentyl group, cyclohexyl group, cyclooctyl group and 3,5-dimethylcyclohexyl group.

Among these alkyl groups, methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 1-pentylhexyl group, 1-butylpentyl group, 1-heptyloctyl group, cyclohexyl group, cyclooctyl group and 3,5-dimethylcyclohexyl group are preferable.

Examples of the heterocyclic group having 3 to 60 carbon atoms and having no skeleton structure of benzotriazole which may have substituents, which is represented by $R_1'$, $R_2'$, $R_1$ to $R_{18}$, Y and Y', include 1-pyrrolyl group, 2-pyrrolyl group, 3-pyrrolyl group, pyrazinyl group, 2-pyridinyl group, 1-imidazolyl group, 2-imidazolyl group, 1-pyrazolyl group, 1-indolidinyl group, 2-indolidinyl group, 3-indolidinyl group, 5-indolidinyl group, 6-indolidinyl group, 7-indolidinyl group, 8-indolidinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 9-carbazolyl group, β-carbolin-1-yl, β-carbolin-3-yl, β-carbolin-4-yl, β-carbolin-5-yl, β-carbolin-6-yl, β-carbolin-7-yl, β-carbolin-8-yl, β-carbolin-9-yl, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group, 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzo-thiophenyl group, 4-dibenzothiophenyl group, 1-dibenzosilolyl group, 2-dibenzosilolyl group, 3-dibenzosilolyl group and 4-dibenzosilolyl group.

Among these heterocyclic groups, 2-pyridinyl group, 1-indolidinyl group, 2-indolidinyl group, 3-indolidinyl group, 5-indolidinyl group, 6-indolidinyl group, 7-indolidinyl group, 8-indolidinyl group, 2-imidazopyridinyl group, 3-imidazopyridinyl group, 5-imidazopyridinyl group, 6-imidazopyridinyl group, 7-imidazopyridinyl group, 8-imidazo-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 1-carbazolyl group, 2-carbazolyl group, 3-carbazolyl group, 4-carbazolyl group, 9-carbazolyl group, 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzo-thiophenyl group, 4-dibenzothiophenyl group, 1-dibenzosilolyl group, 2-dibenzosilolyl group, 3-dibenzosilolyl group and 4-dibenzosilolyl group are preferable.

The alkoxyl group having 1 to 40 carbon atoms which may have substituents, which is represented by $R_1'$, $R_2'$, $R_1$ to $R_{18}$, Y and Y', is a group represented by —OY. Examples of the group represented by Y include the groups described above as the examples of the alkyl group.

Examples of the aryl group having 6 to 60 carbon atoms which may have substituents, which is represented by $R_1'$, $R_2'$, $R_1$ to $R_{18}$ and Y include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, o-cumenyl group, m-cumenyl group, p-cumenyl group, 2,3-xylyl group, 3,4-xylyl group, 2,5-xylyl group and mesityl group.

Among these aryl groups, phenyl group, 1-naphthyl group, 2-naphthyl group, 9-phenanthryl group, 2-biphenylyl group, 3-biphenylyl group, 4-biphenylyl group, p-tolyl group and 3,4-xylyl group are preferable.

Examples of the aryl group having 6 to 60 carbon atoms and having no skeleton structure of pyrene which may have substituents, which is represented by Y', include the groups described above as the examples of the aryl group except the groups having the skeleton structure of pyrene.

The aryloxyl group having 6 to 60 carbon atoms which may have substituents, which is represented by $R_1'$, $R_2'$, $R_1$ to $R_{18}$, Y and Y', is a group represented by —OAr. Examples of the group represented by Ar include the groups described above as the examples of the aryl group. Preferable examples of the group represented by Ar include the groups described above as the preferable examples of the aryl group.

Examples of the aralkyl group having 7 to 60 carbon atoms which may have substituents, which is represented by $R_1'$, $R_2'$, $R_1$ to $R_{18}$, Y and Y', include benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

Among these aralkyl groups, benzyl group, p-cyanobenzyl group, m-cyanobenzyl group, o-cyanobenzyl group, 1-phenylethyl group, 2-phenylethyl group, 1-phenylisopropyl group and 2-phenylisopropyl groups are preferable.

Examples of the alkenyl group having 2 to 40 carbon atoms which may have substituents, which is represented by $R_1'$, $R_2'$, $R_1$ to $R_{18}$, Y and Y', include vinyl group, allyl group, 1-butenyl group, 2-butenyl group, 3-butenyl group, 1,3-butadienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group. Among these alkenyl groups, styryl group, 2,2-diphenylvinyl group and 1,2-diphenylvinyl groups are preferable.

The alkylamino group having 1 to 40 carbon atoms which may have substituents and the aralkylamino group having 7 to 60 carbon atoms which may have substituents, which are represented by $R_1'$, $R_2'$, $R_1$ to $R_{18}$, Y and Y', are represented by —NQ1Q2. Examples of the groups represented by Q1 and Q2 include the groups described above as the examples of the alkyl group, the aryl group and the aralkyl group. Preferable examples of the groups represented by Q1 and Q2 include the groups described above as the preferable examples of the alkyl group, the aryl group and the aralkyl group.

Examples of the alkylsilyl group having 3 to 20 carbon atoms which may have substituents, which is represented by $R_1'$, $R_2'$, $R_1$ to $R_{18}$, Y and Y', include trimethylsilyl group, triethylsilyl group, t-butyldimethylsilyl group, vinyldimethylsilyl group and propyldimethylsilyl group.

Examples of the arylsilyl group having 8 to 40 carbon atoms which may have substituents, which is represented by $R_1'$, $R_2'$, $R_1$ to $R_{18}$, Y and Y', include triphenylsilyl group, phenyldimethylsilyl group and t-butyldiphenylsilyl group.

The ketoaryl group having 7 to 40 carbon atoms which may have substituents, which is represented by $R_1'$, $R_2'$ and $R_1$ to $R_{18}$, is represented by —$COAr_2$. Examples of the group represented by $Ar_2$ include the groups described above as the examples of the aryl group. Preferable examples of the group represented by Ar include the groups described above as the preferable examples of the aryl group.

Examples of the halogenated alkyl group having 1 to 40 carbon atoms which may have substituents, which is represented by $R_1'$, $R_2'$, $R_1$ to $R_{18}$, Y and Y', include groups obtained by substituting at least one of hydrogen atoms in the groups described above as the examples of the alkyl group with a halogen atom. Preferable examples of the halogenated alkyl group include groups obtained by substituting at least one of hydrogen atoms in the groups described above as the preferable examples of the alkyl group with a halogen atom.

Examples of the cyclic structure formed from a plurality of groups represented by $R_1'$, $R_2'$ and $R_1$ to $R_{18}$ include unsaturated six-membered rings such as benzene ring and saturated and unsaturated five-membered rings and seven-membered rings.

Examples of the alkyl group represented by Ra and Rb include the groups described above as the examples of the alkyl group. Methyl group, ethyl group, propyl group and butyl group are preferable.

Specific examples of the material for organic EL devices of the present invention which is represented by any one of general formulae (1) to (14) are shown in the following. However, the material for organic EL devices of the present invention is not limited to those shown as the examples.

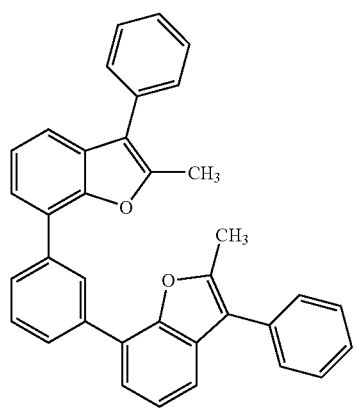

A1

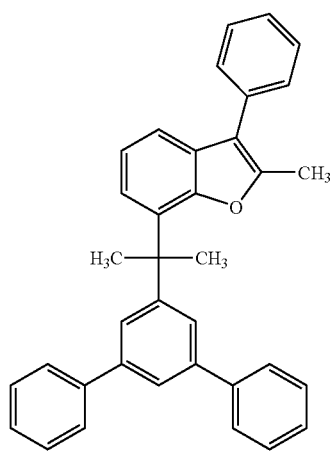

A2

-continued
A3
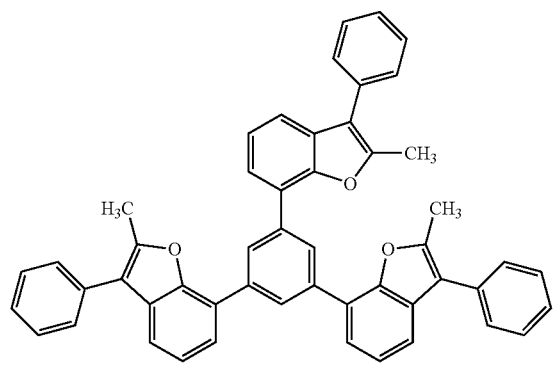
A4
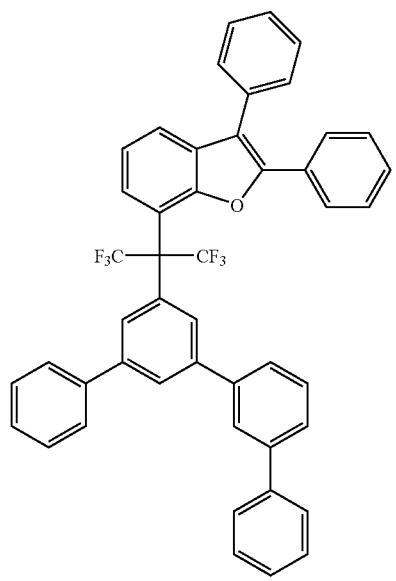
A5
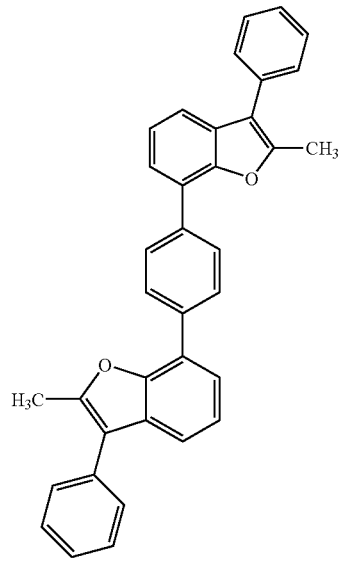
A6
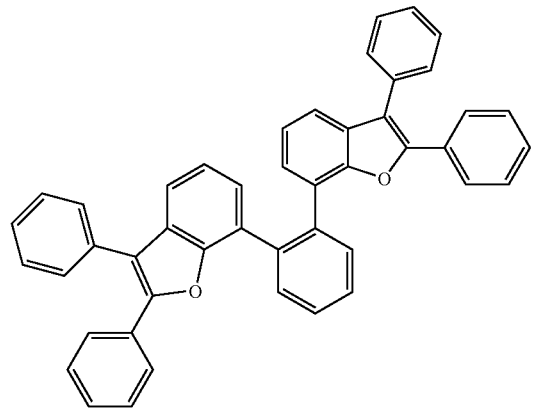

-continued
A7
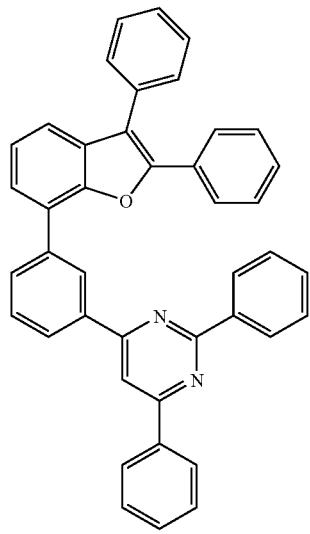
A8
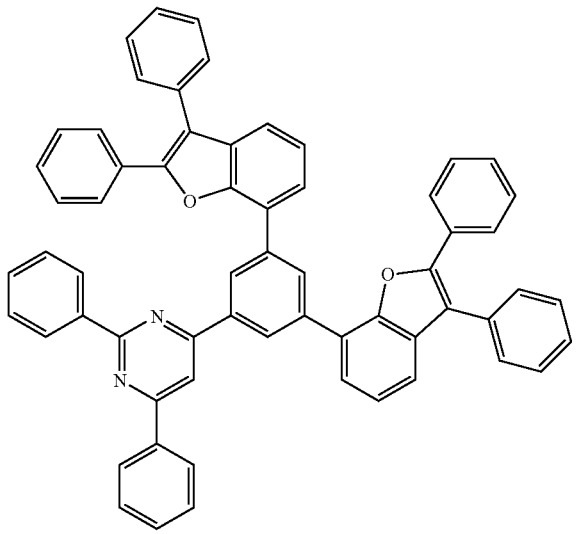
A9
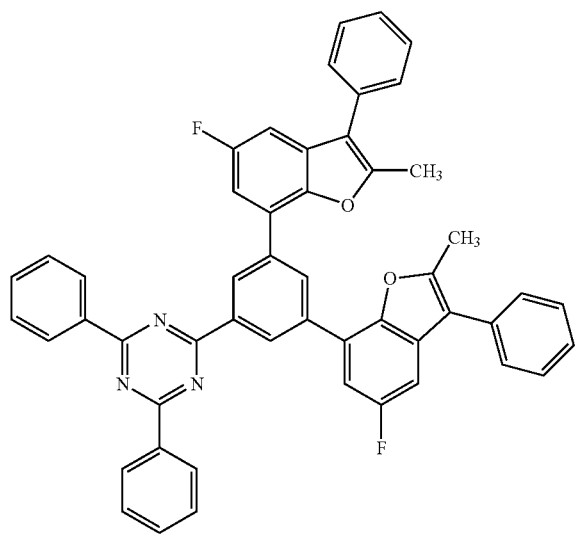
A10
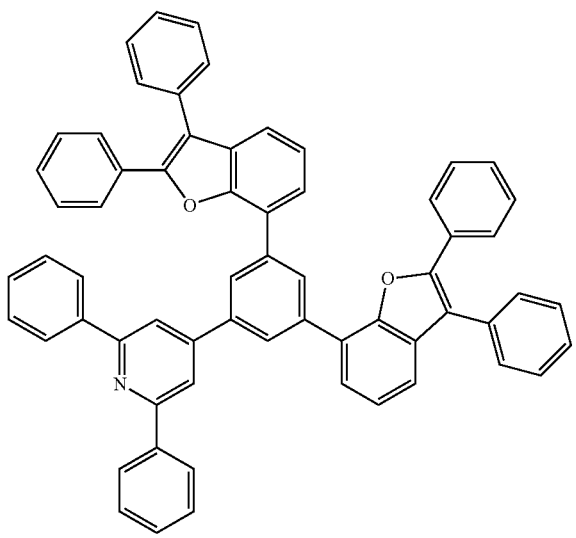
A11
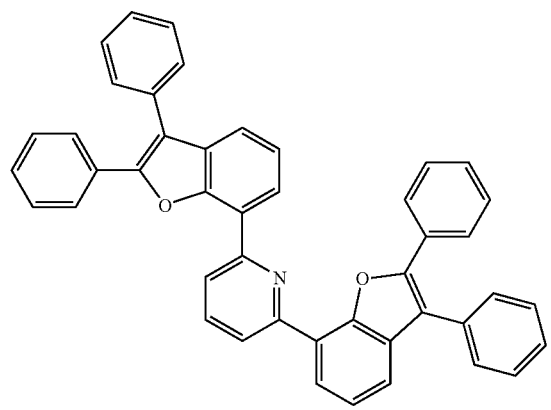
A12
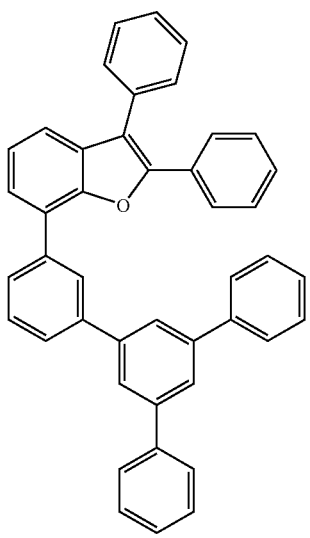

-continued
A13
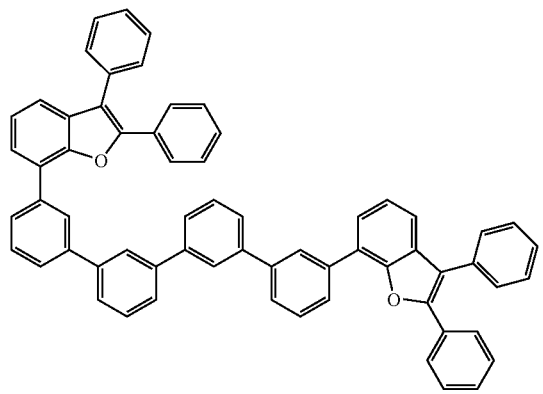
A14
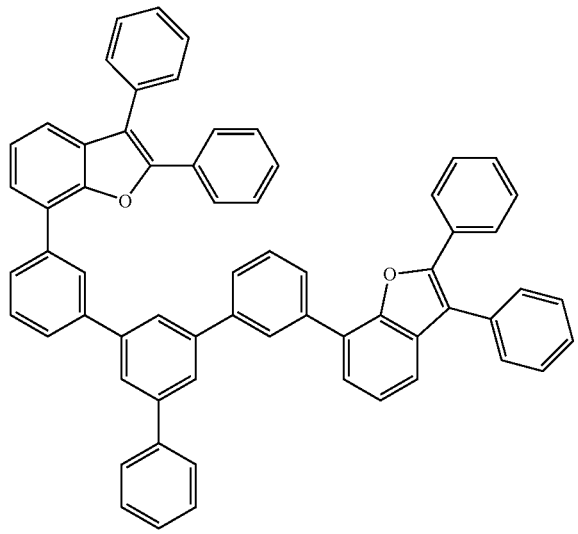
B1
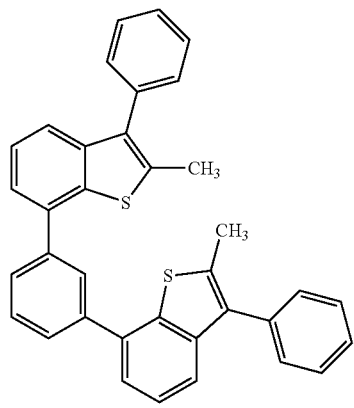
B2
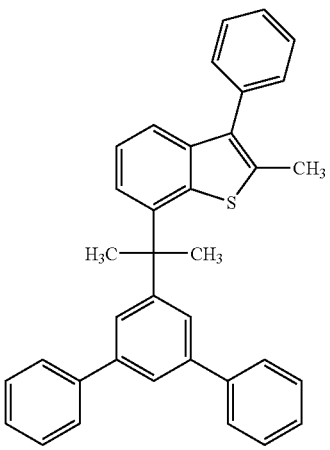
B3
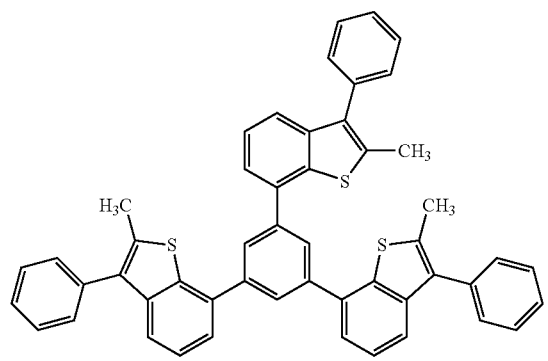
B4
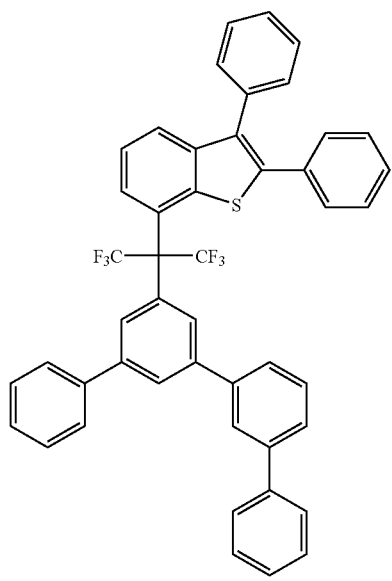

-continued
B5
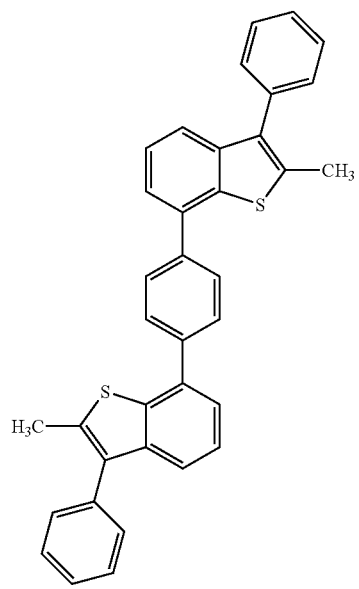
B6
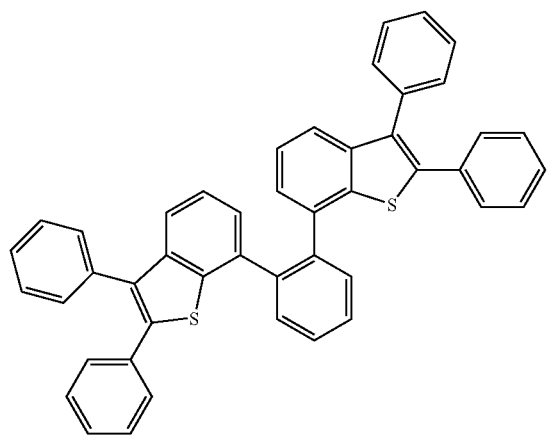
B7
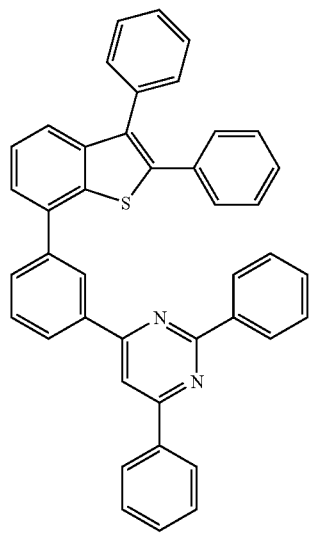
B8
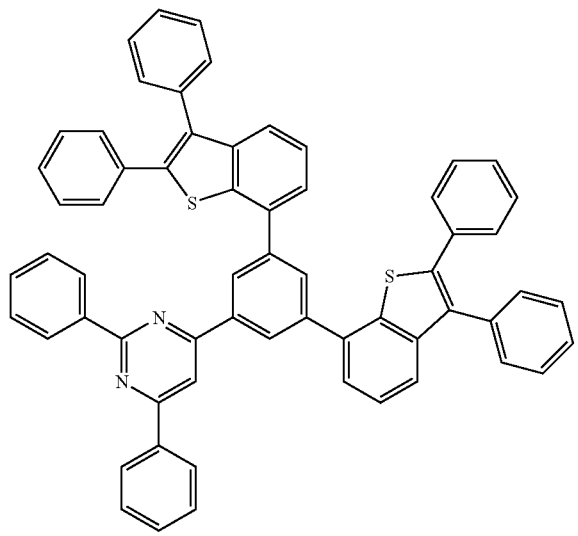

-continued
B9
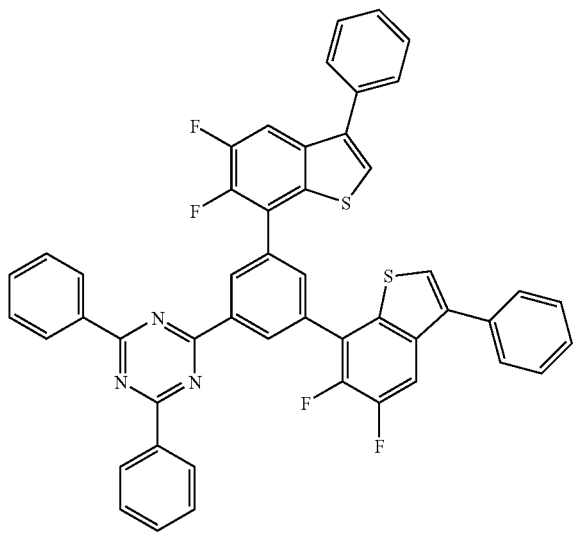
B10
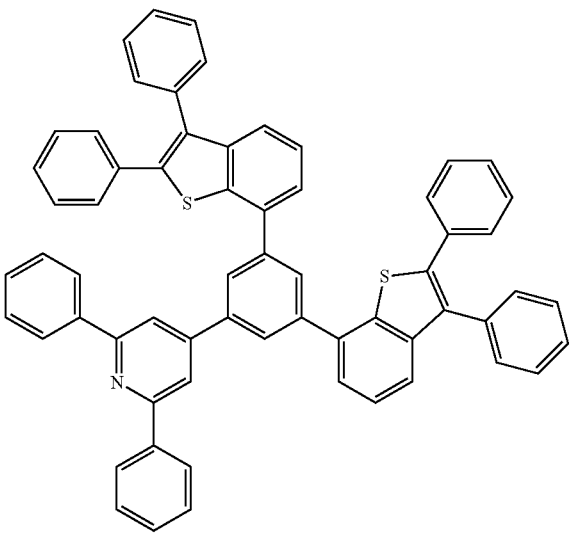
B11
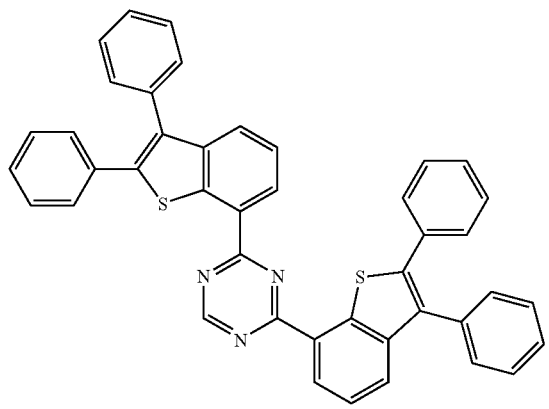
B12
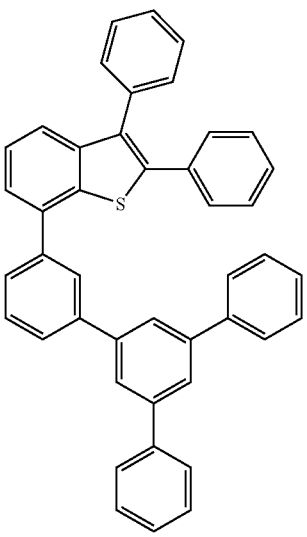
B13
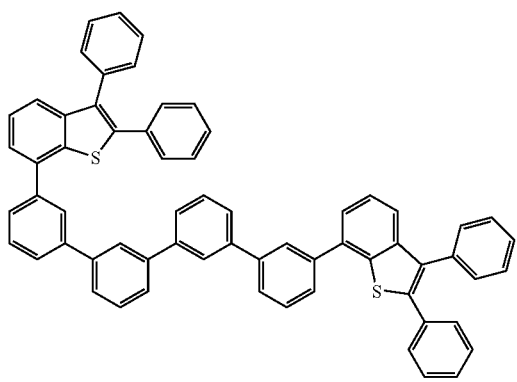
B14
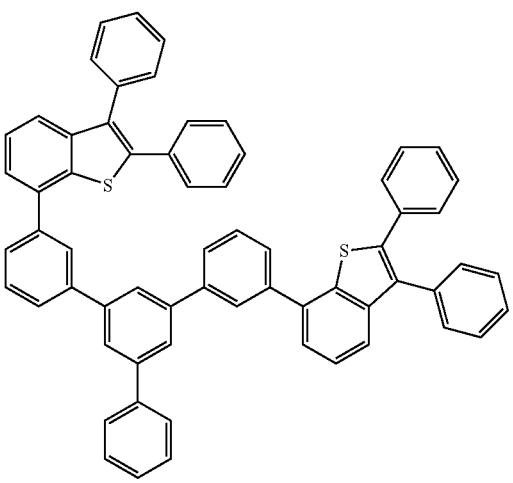

-continued
C1
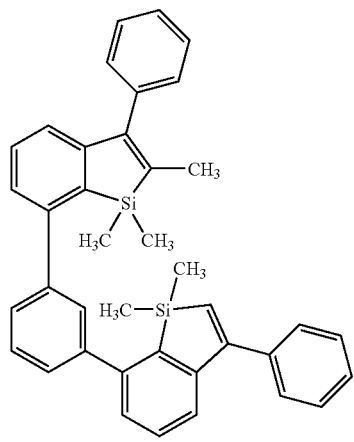
C2
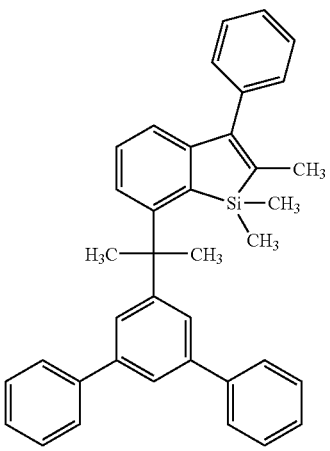
C3
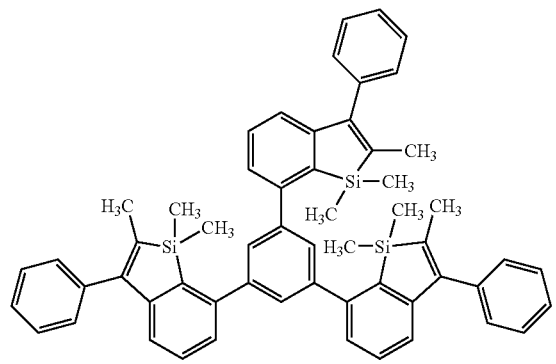
C4
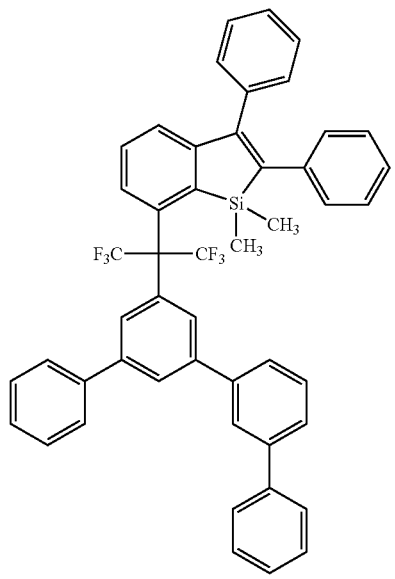
C5
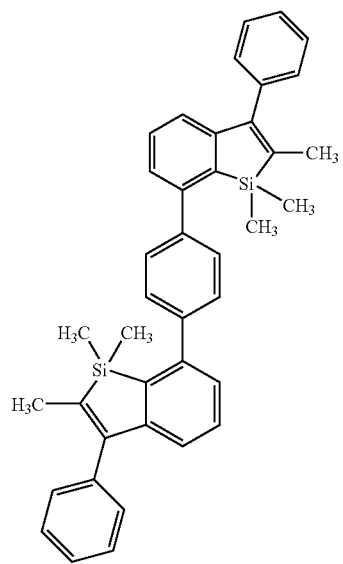
C6
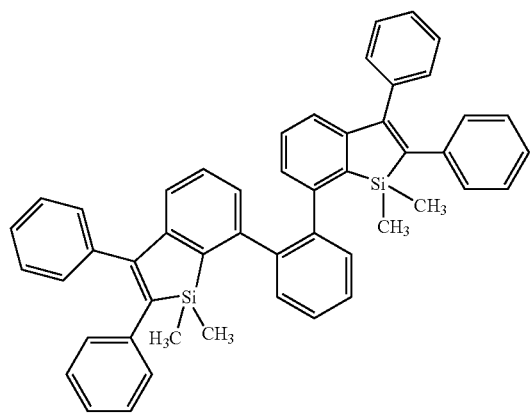

-continued
C7
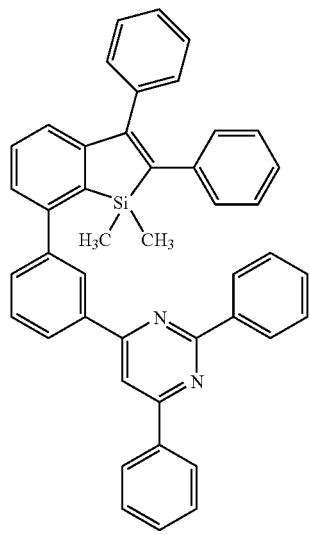
C8
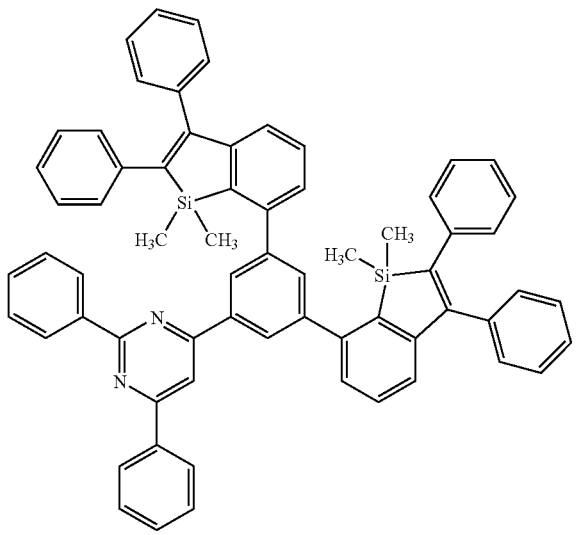
C9
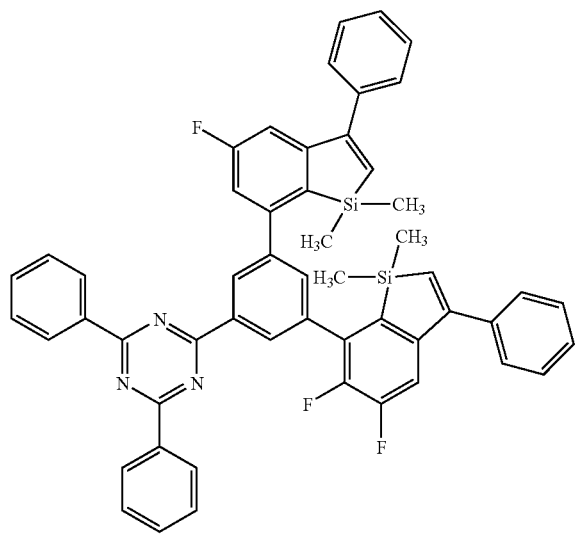
C10
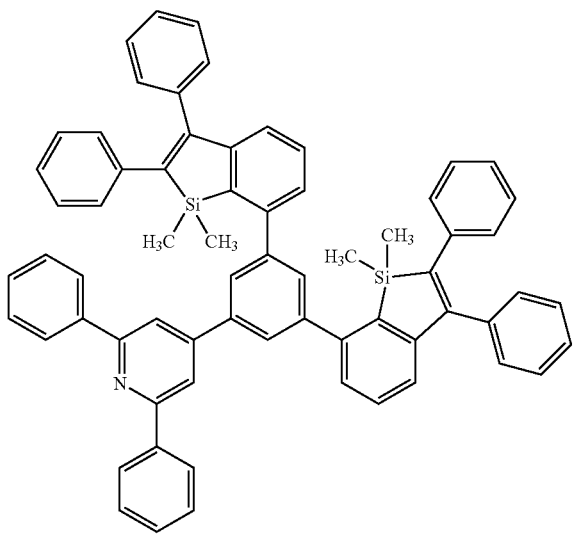
C11
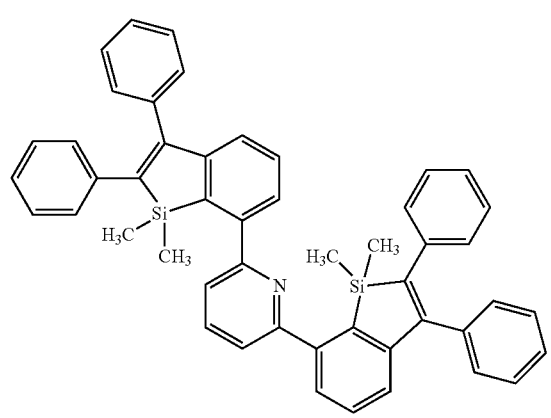
C12
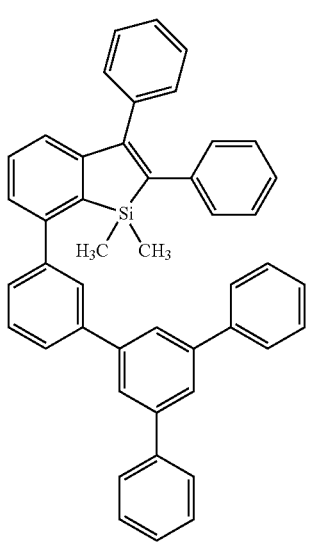

-continued
C13
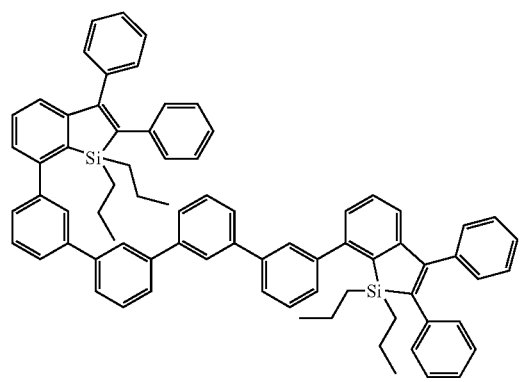
C14
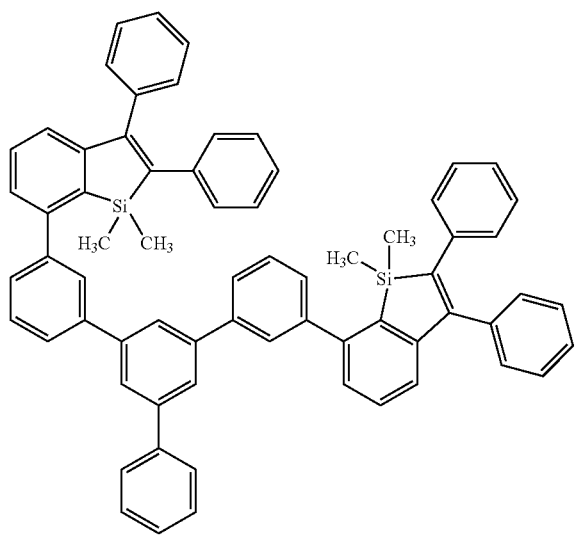
D1
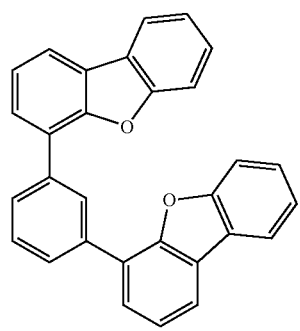
D2
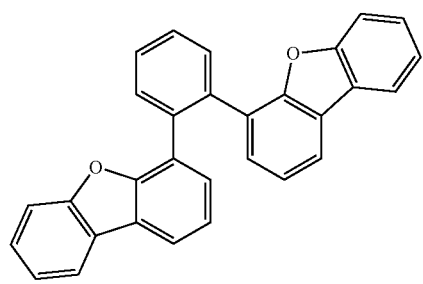
D3
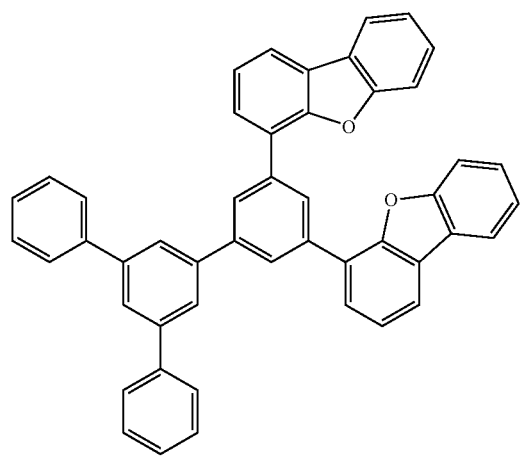
D4
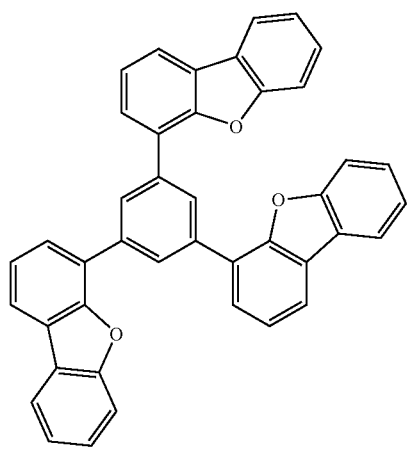

-continued
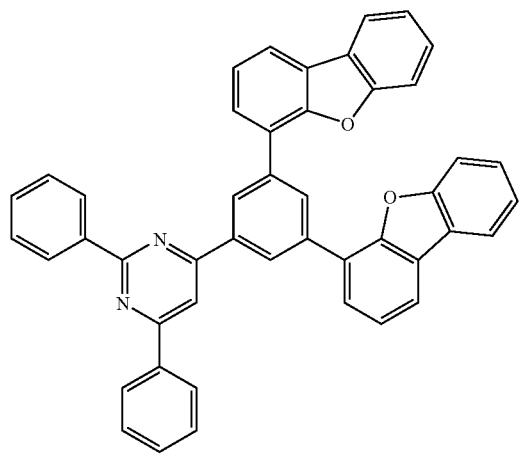
D5
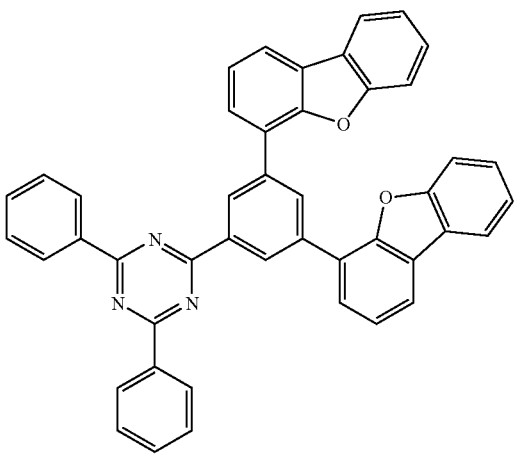
D6
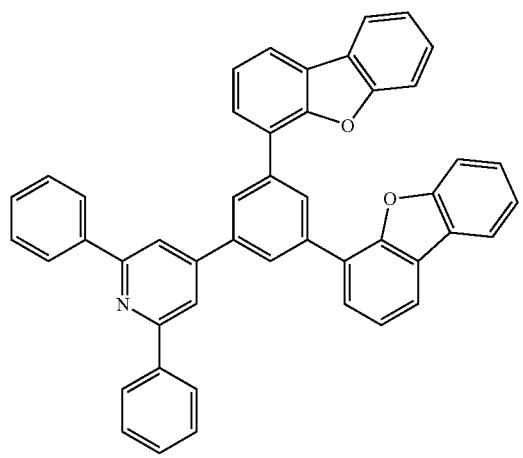
D7
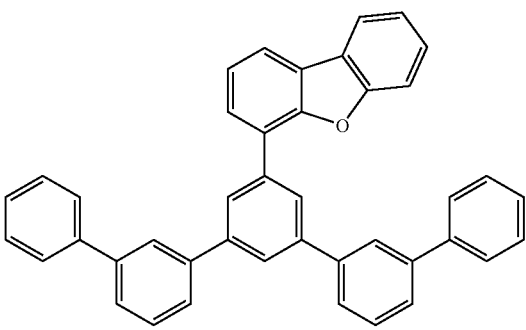
D8
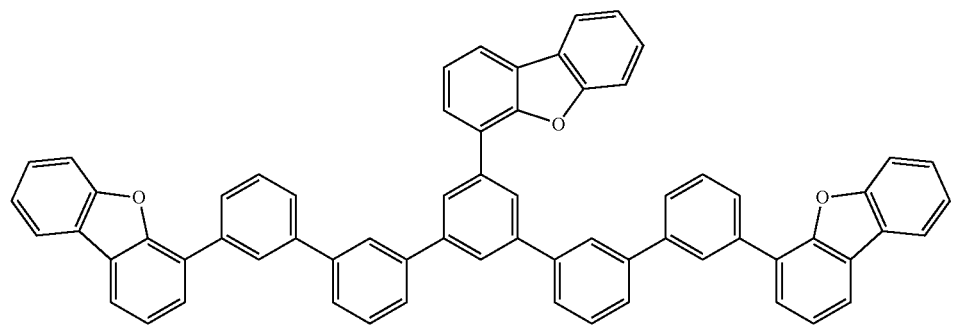
D9

-continued
D10
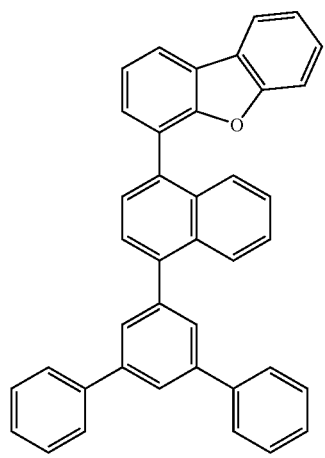
D11
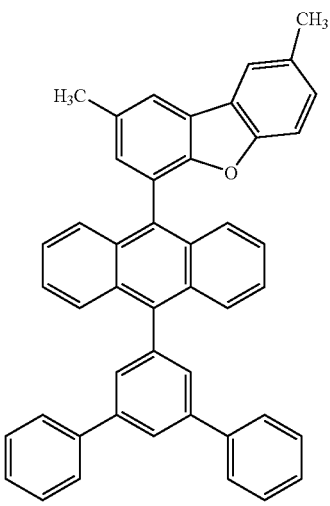
D12
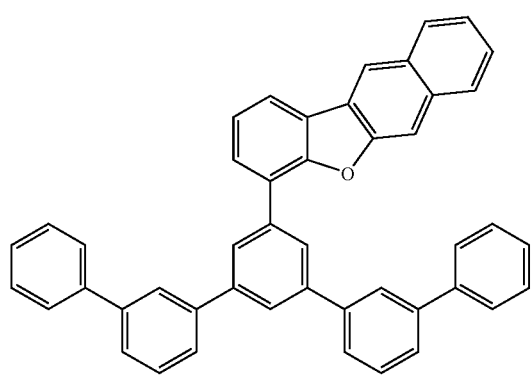
D13
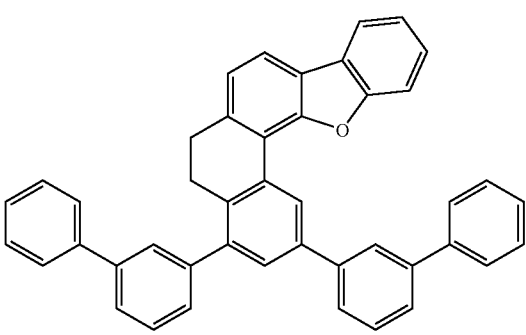
D14
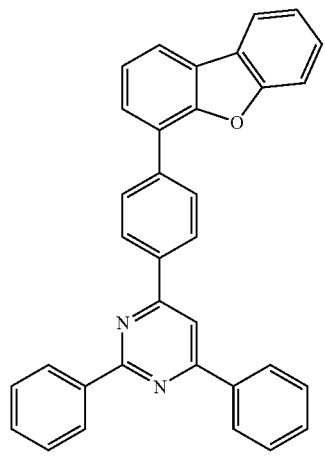
D15
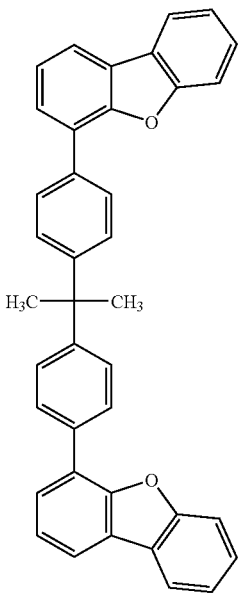

-continued
D16
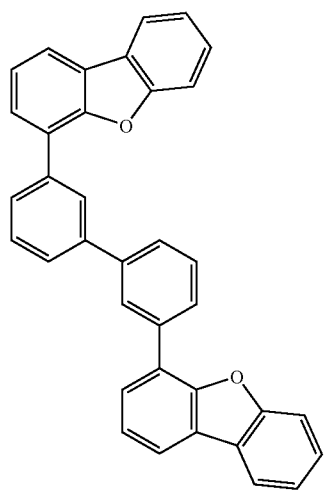
E1
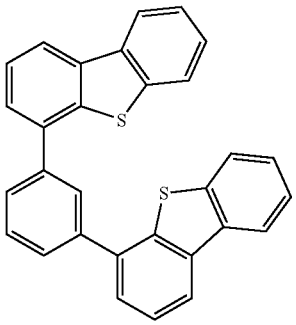
E2
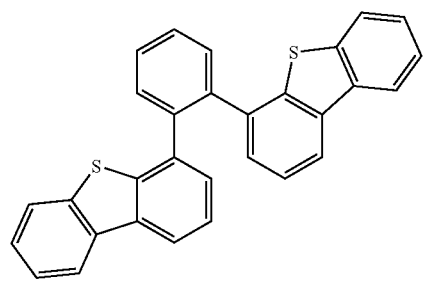
E3
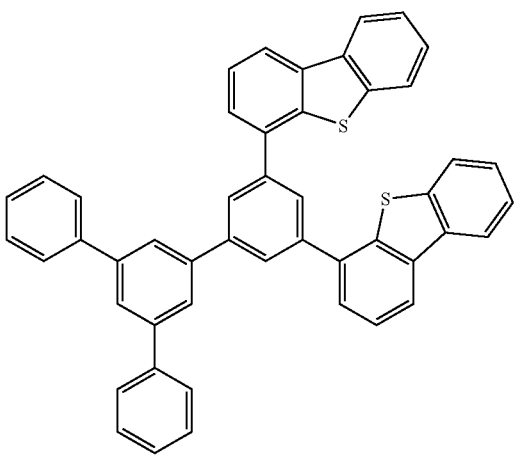
E4
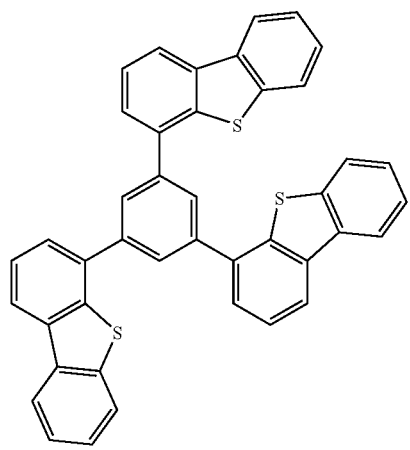
E5
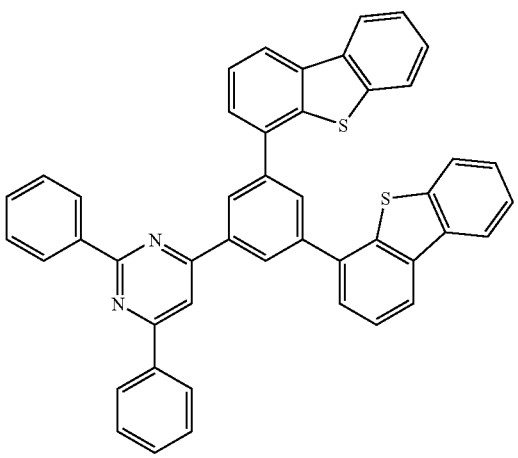

-continued
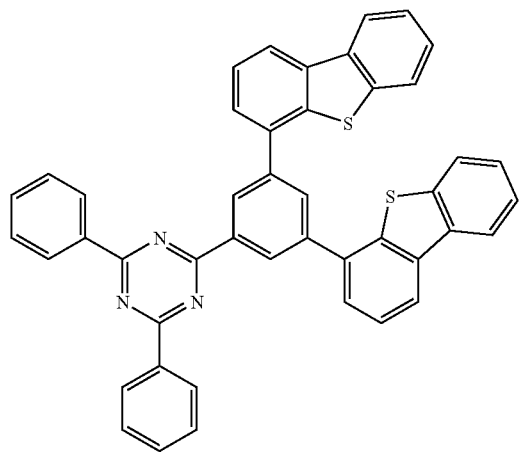
E6
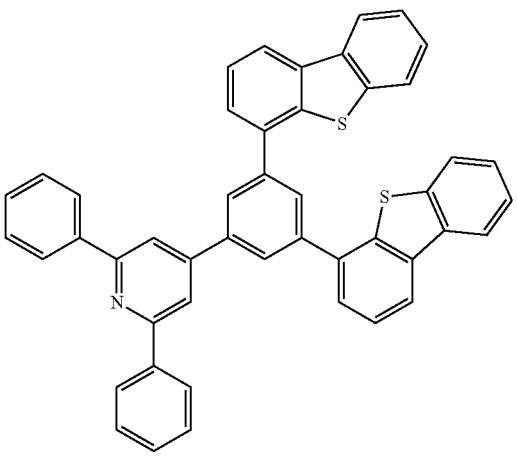
E7
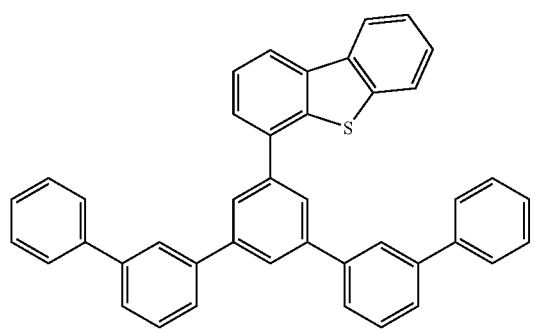
E8
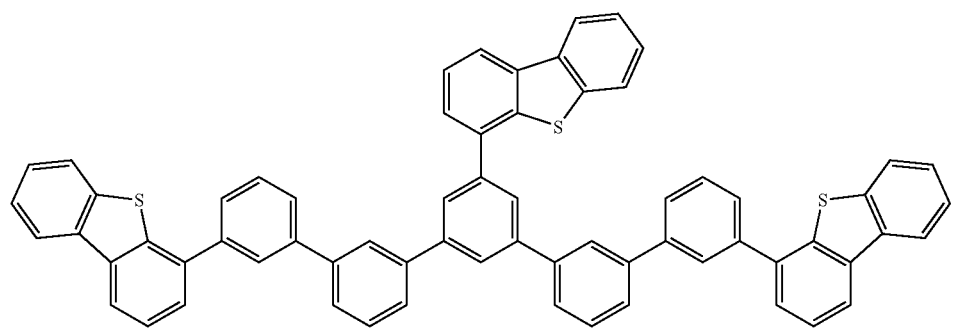
E9
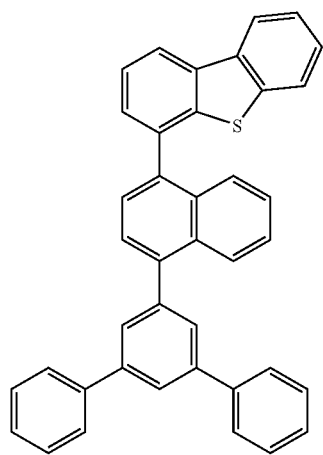
E10
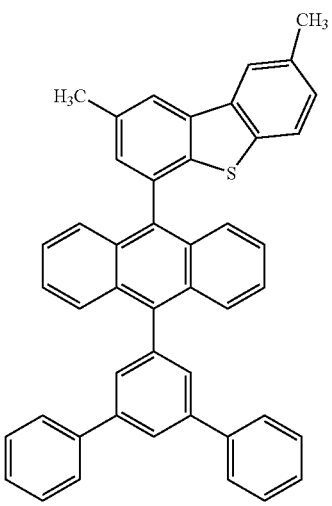
E11

-continued
E12
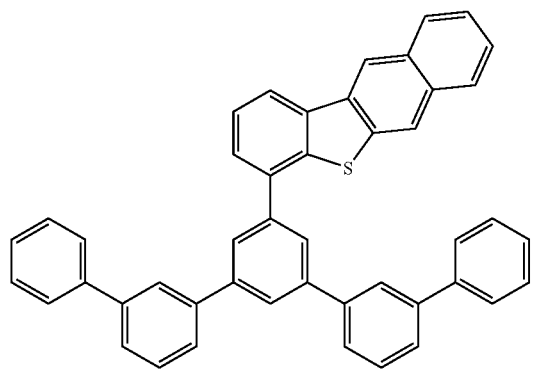
E13
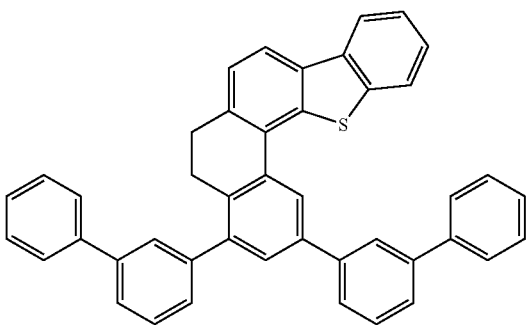
E14
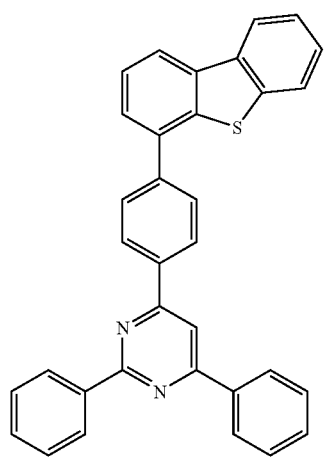
E15
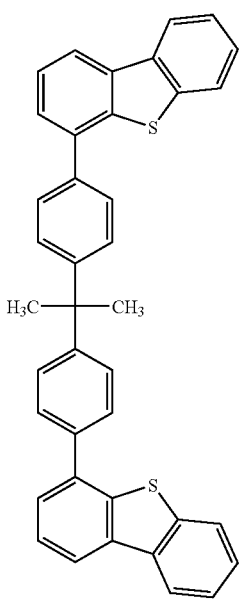
E16
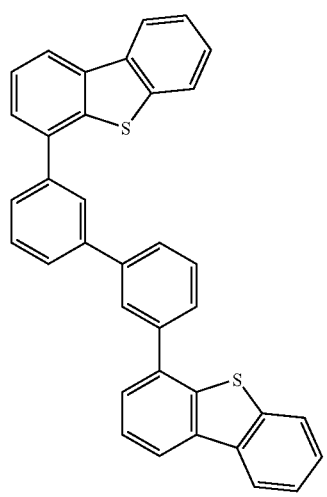
F1
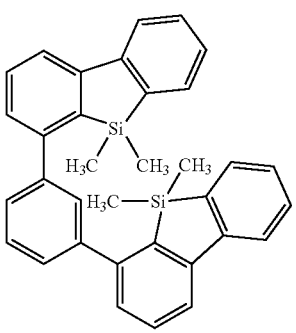

-continued
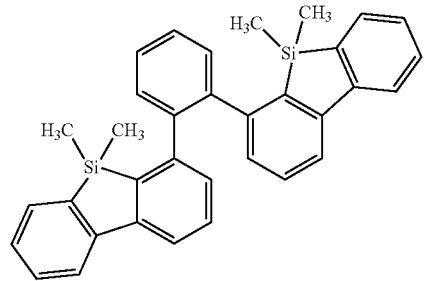
F2
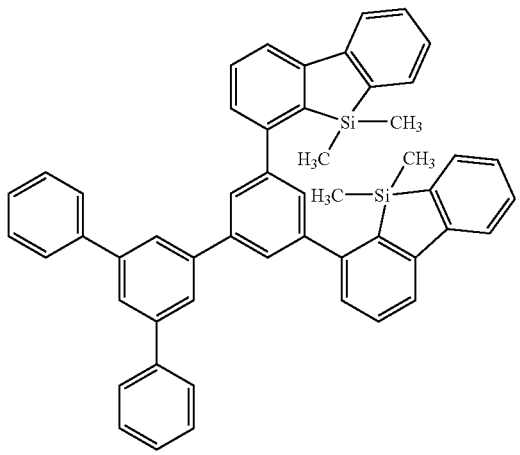
F3
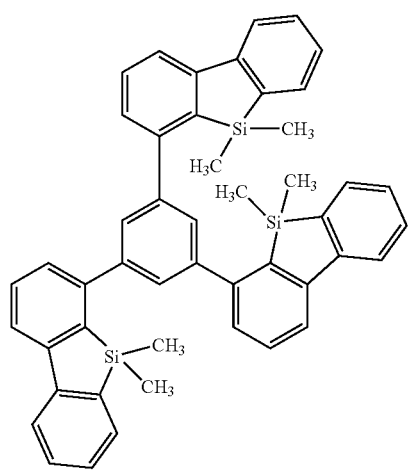
F4
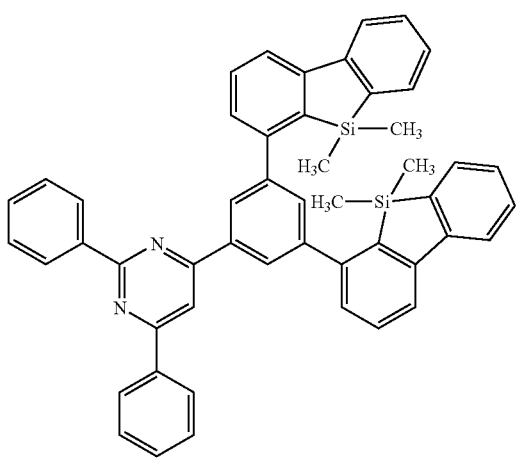
F5
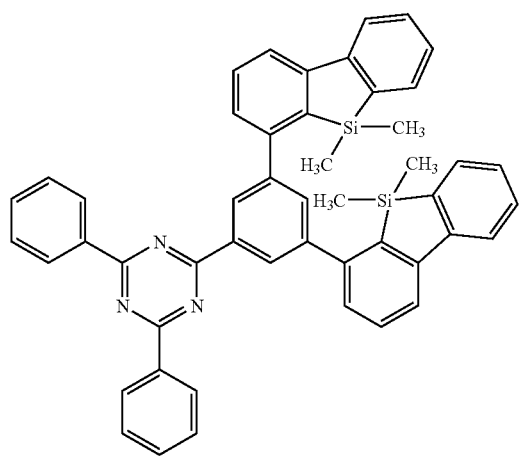
F6
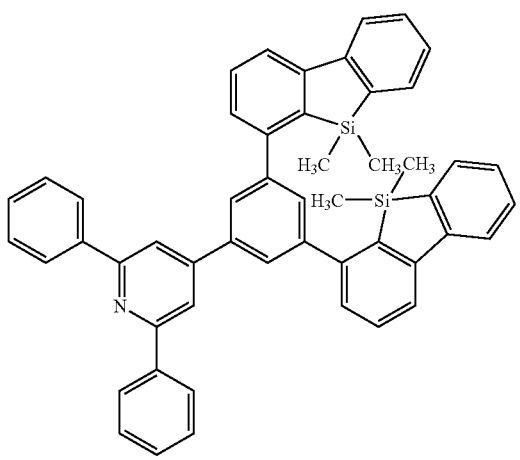
F7

-continued
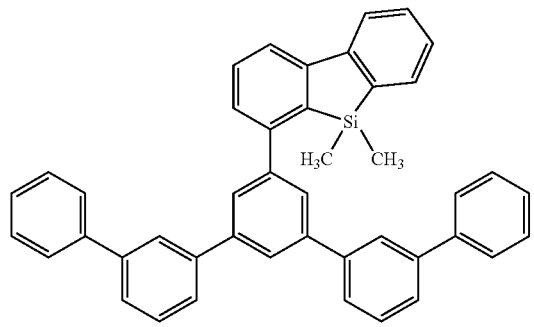
F8
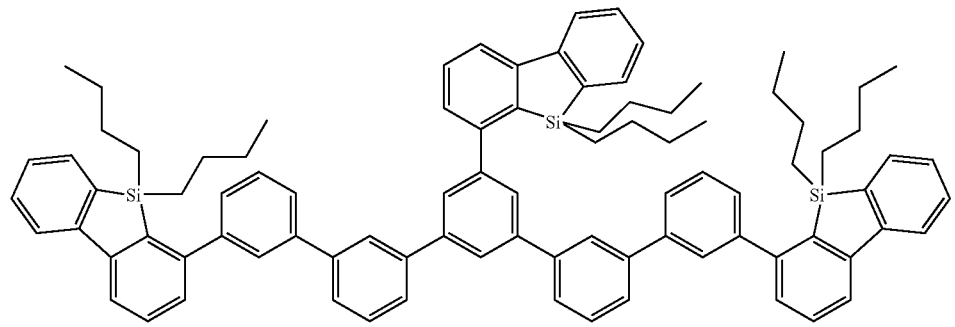
F9
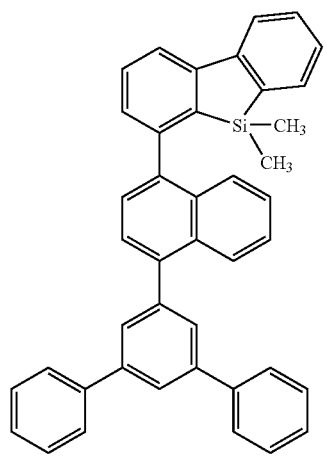
F10
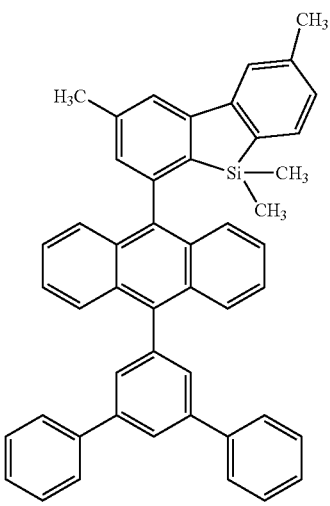
F11
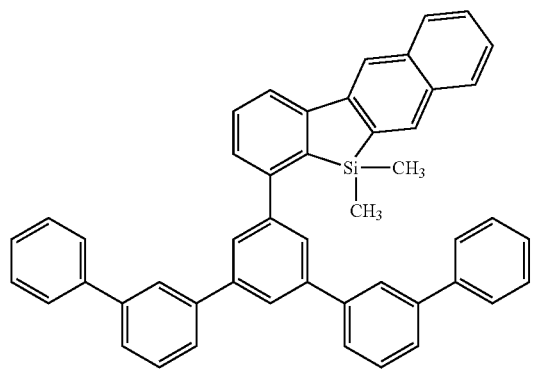
F12
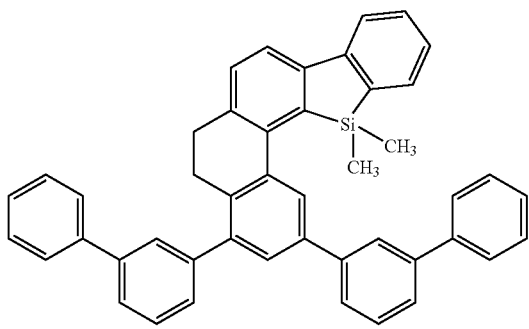
F13

-continued
F14
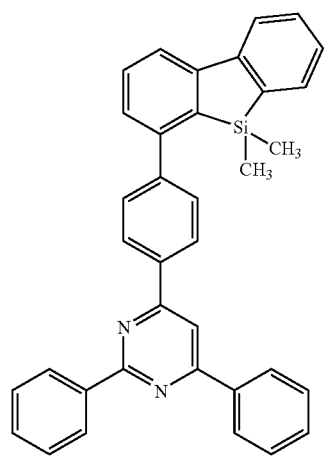
F15
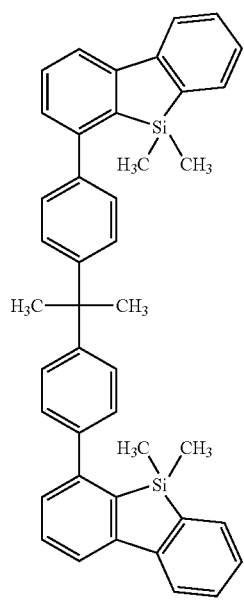
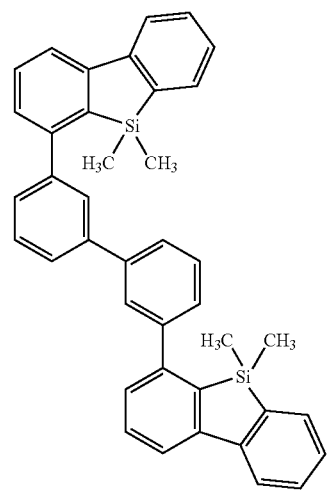
F16
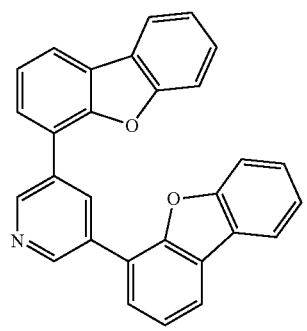
D18
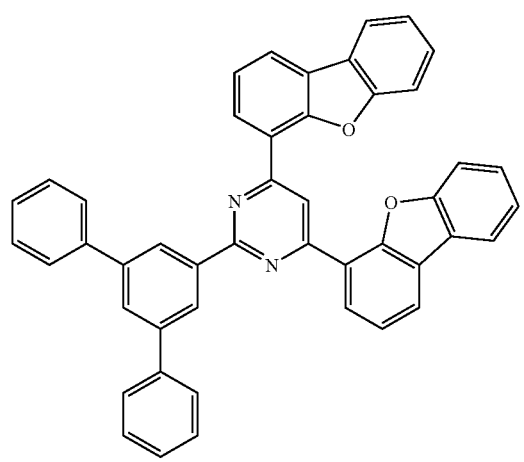
D19
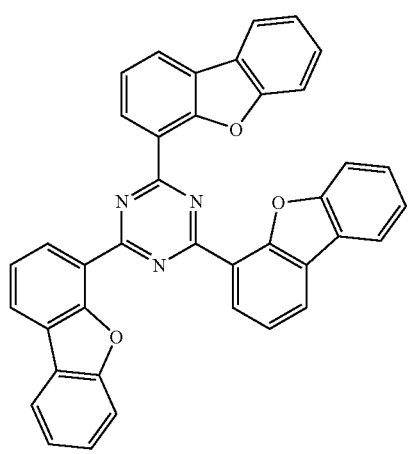

-continued
D20
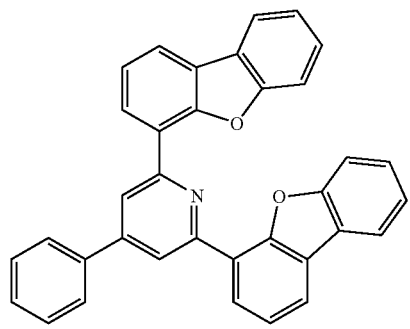
D21
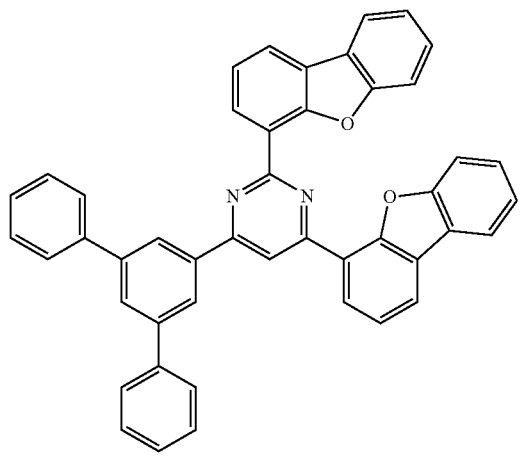
D22
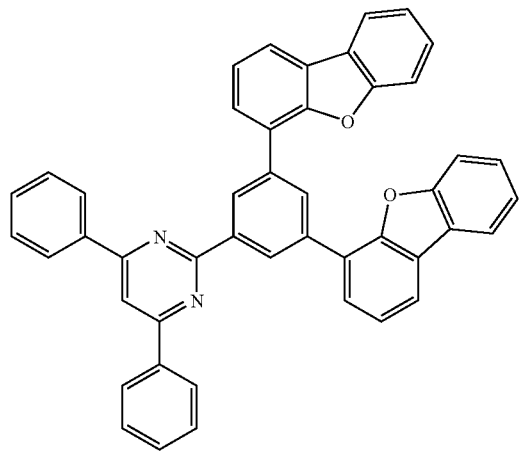
D23
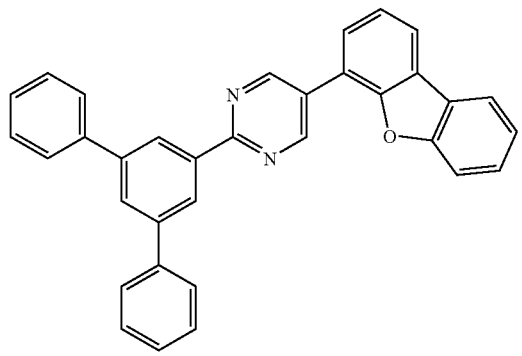
D24
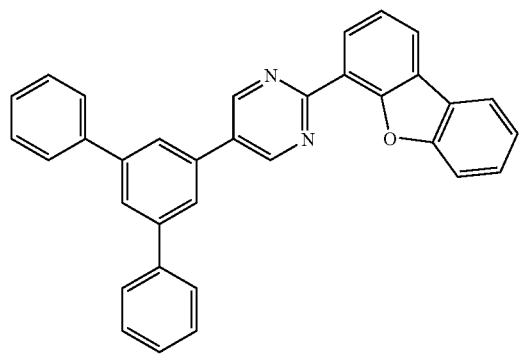
D25
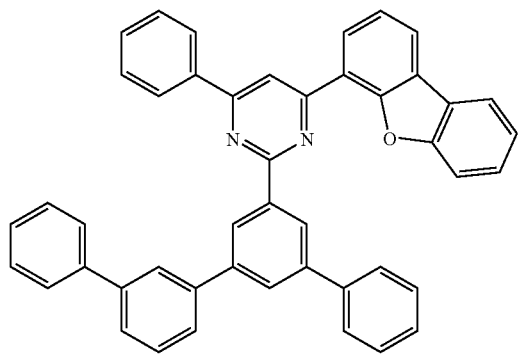

-continued
D26
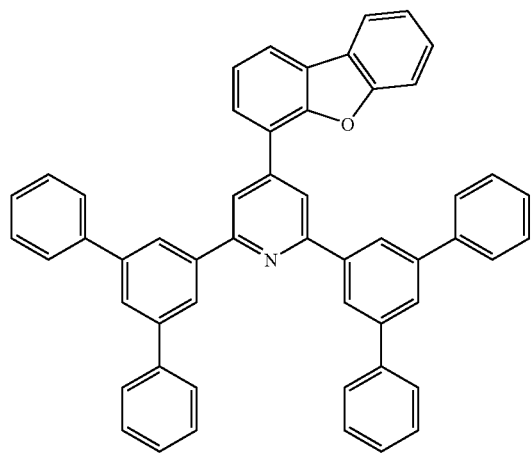
D27
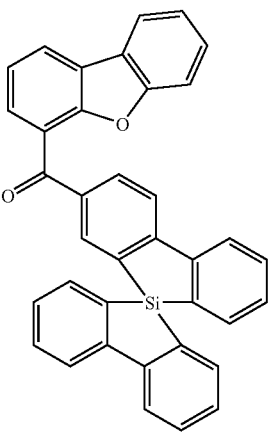
D28
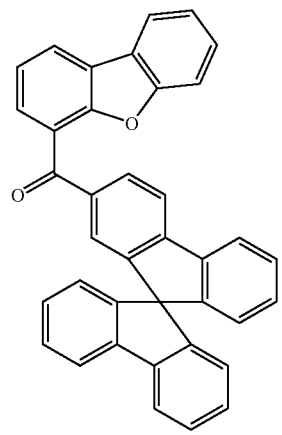
D29
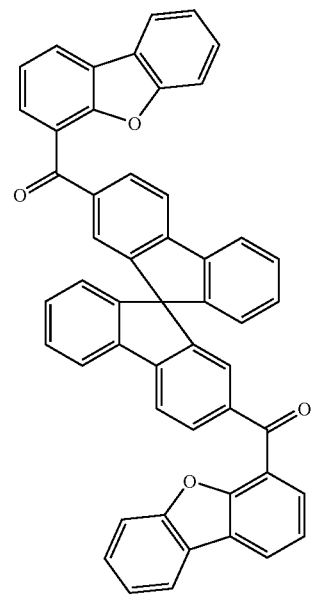
D30
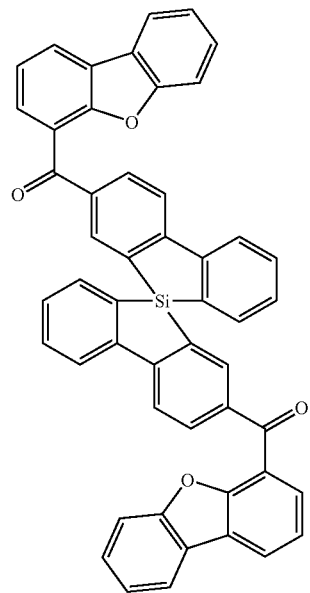
D31
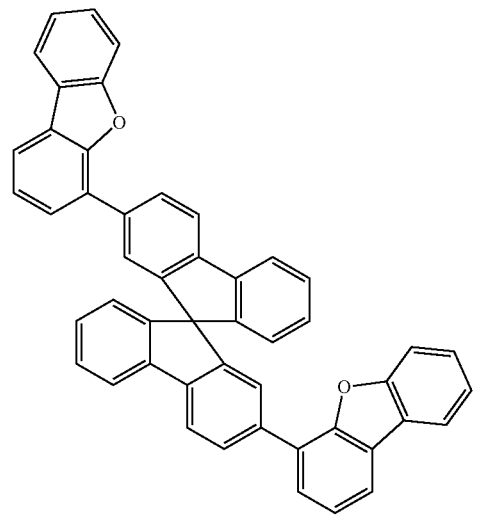

-continued
E17
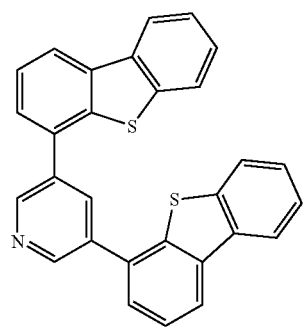
E18
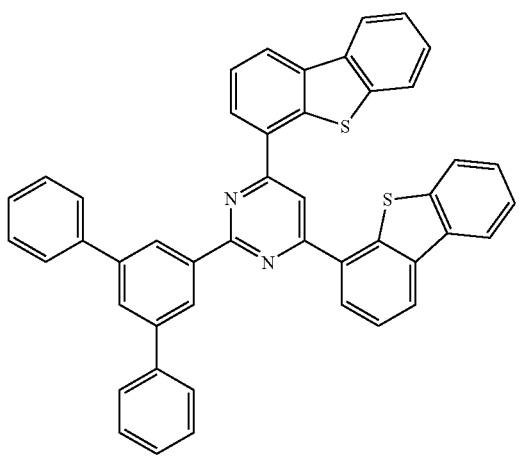
E19
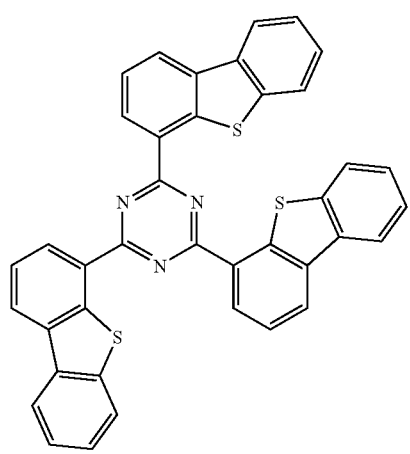
E20
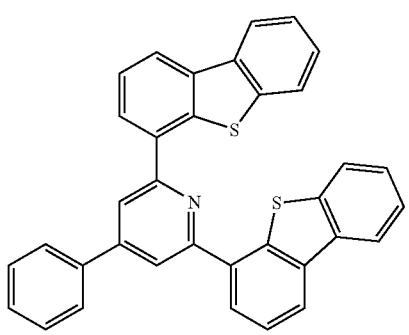
E21
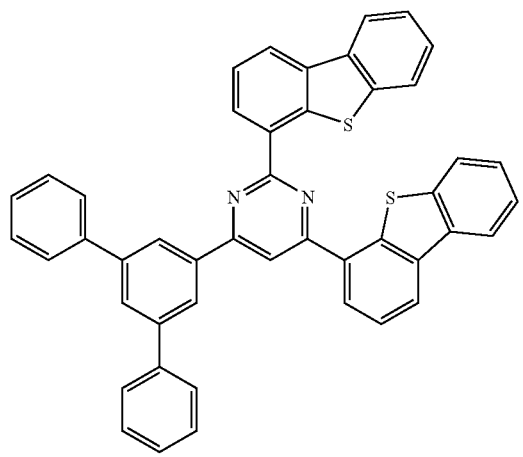
E22
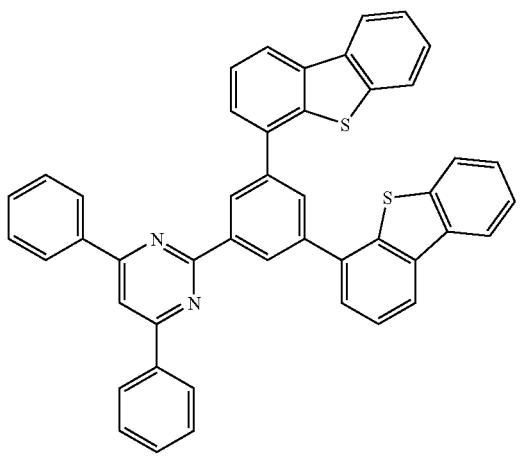

-continued
E23
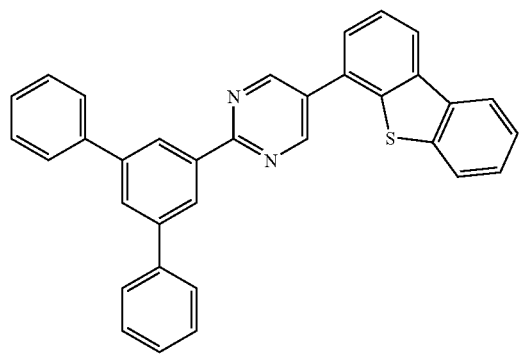
E24
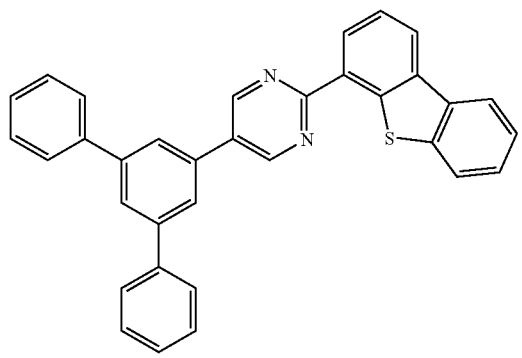
E25
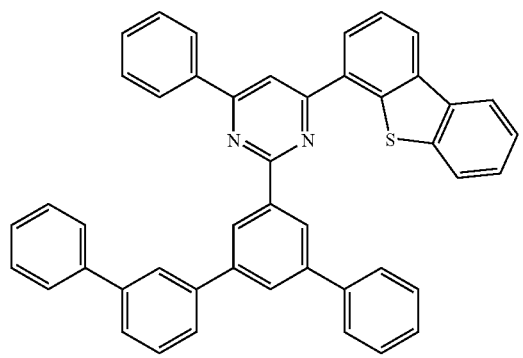
E26
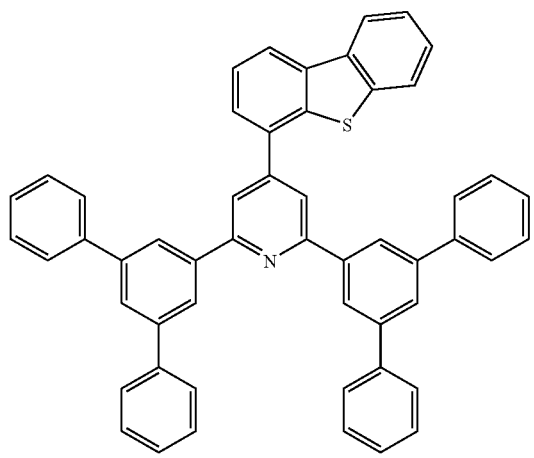
E27
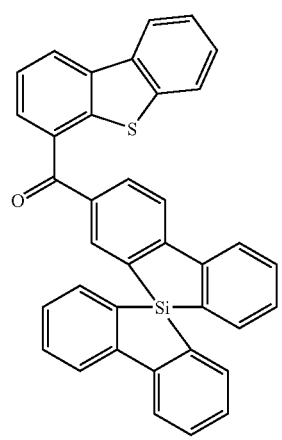
E28
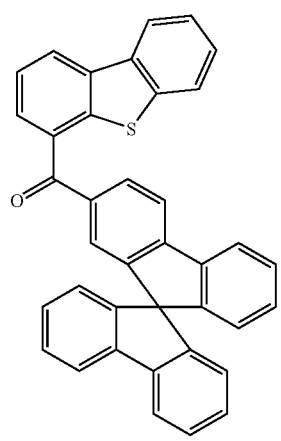

-continued
E29
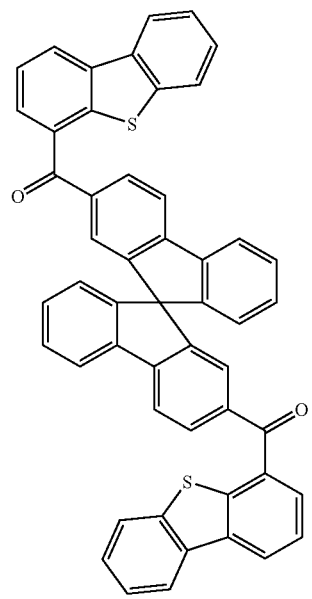
E30
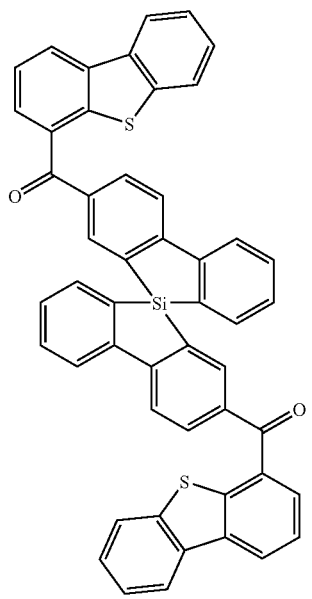
E31
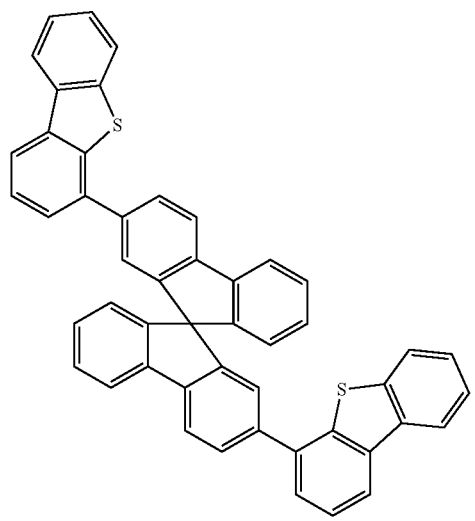
F17
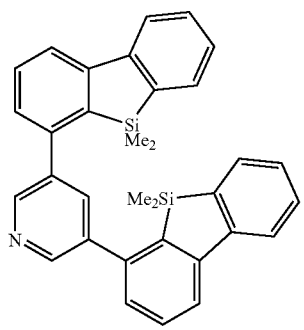
F18
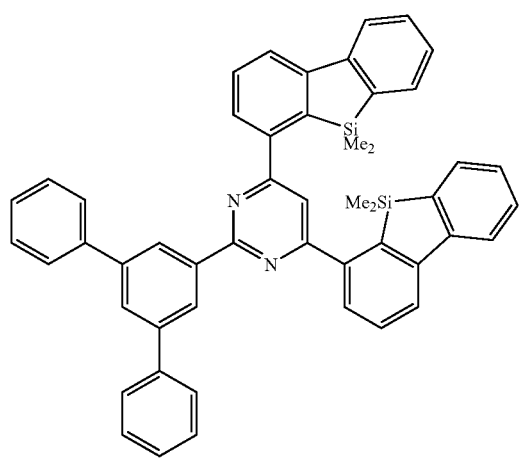
F19
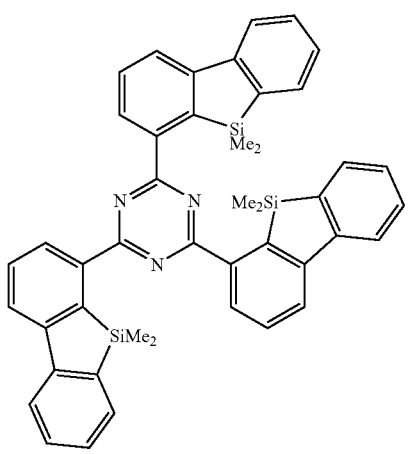

-continued
F20
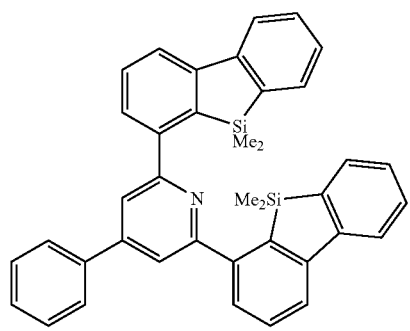
F21
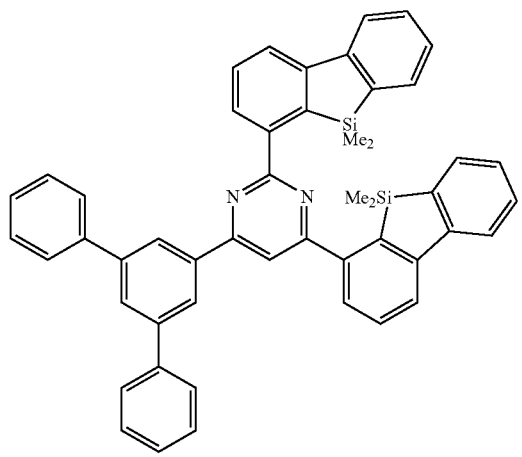
F22
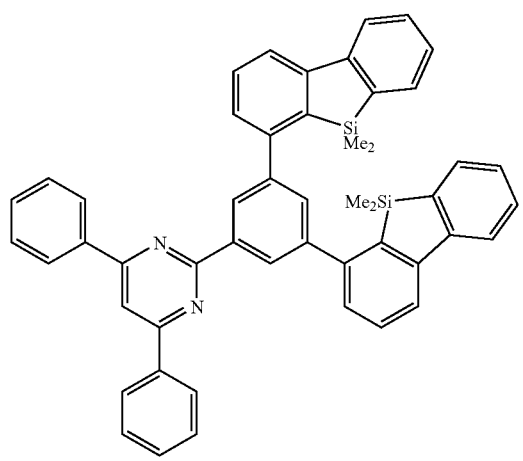
F23
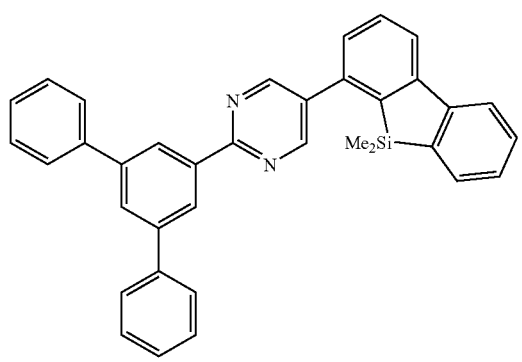
F24
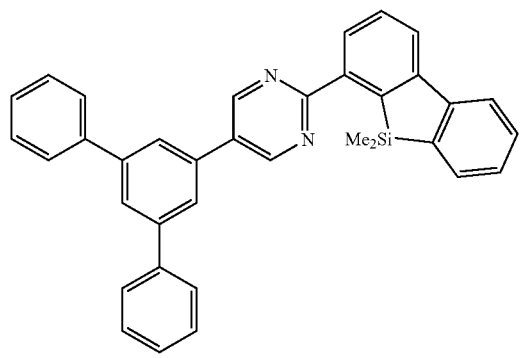
F25
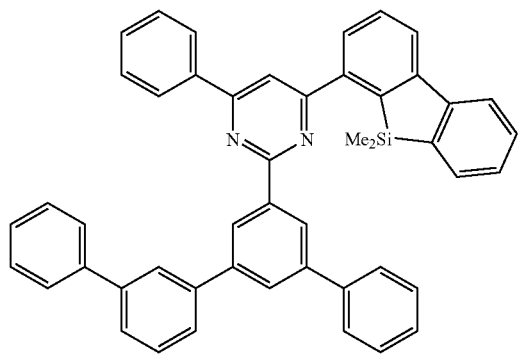

-continued
F26
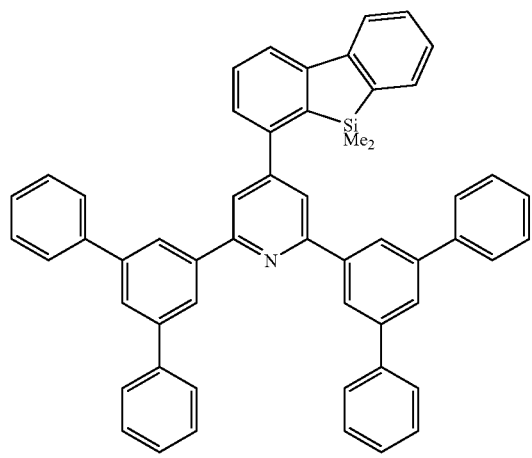
F27
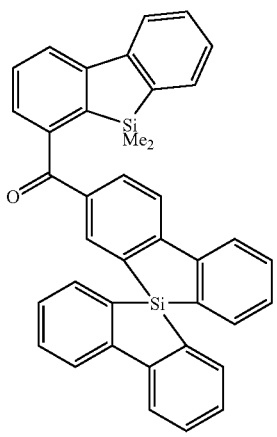
F28
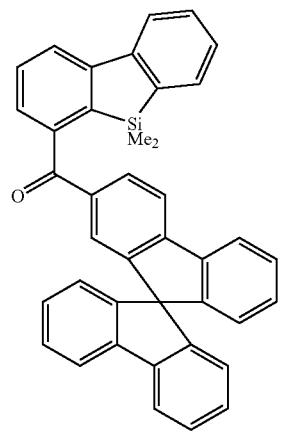
F29
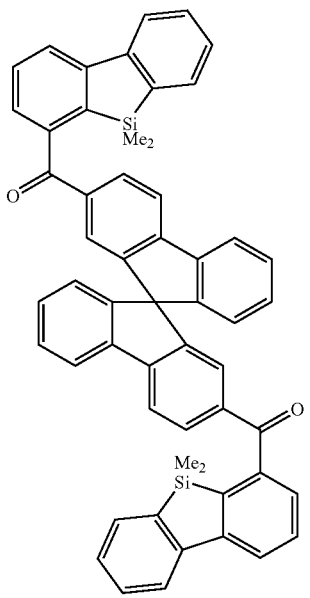
F30
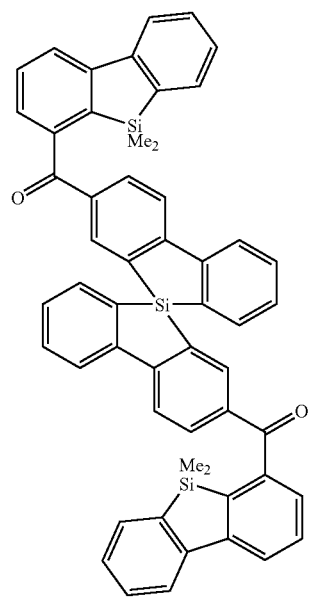
F31
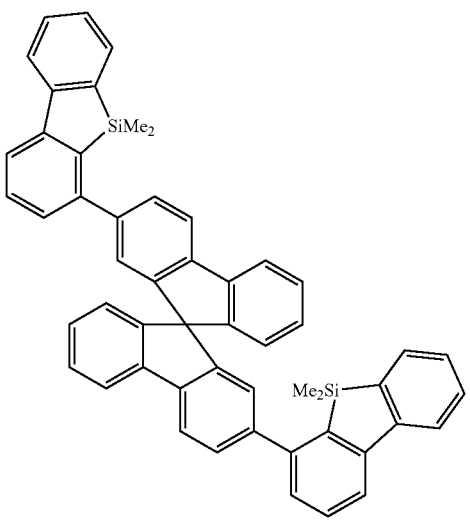

-continued
G1
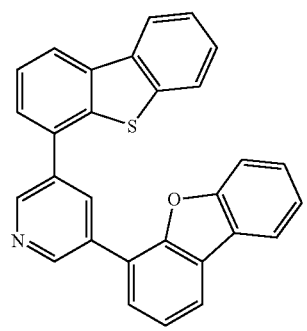
G2
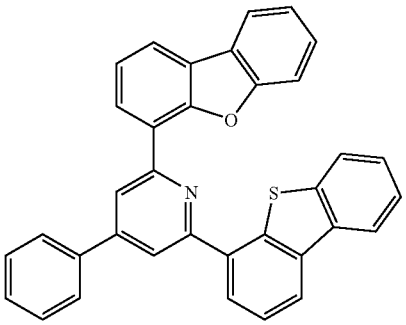
G3
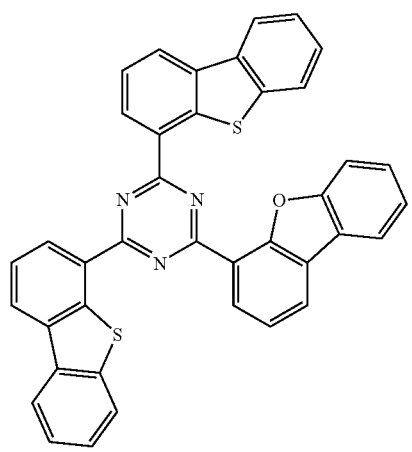
G4
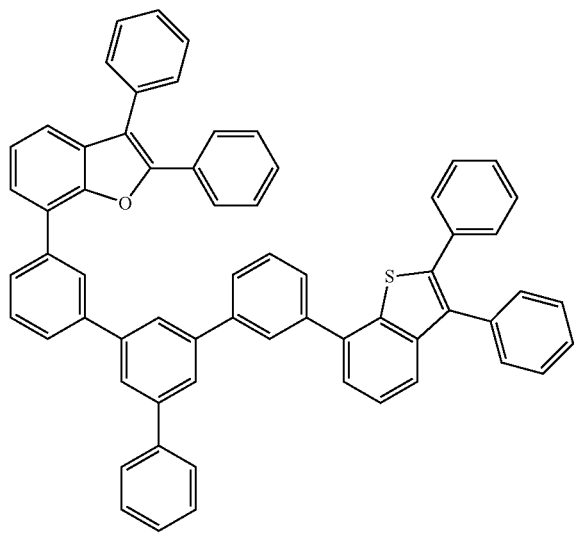
G5
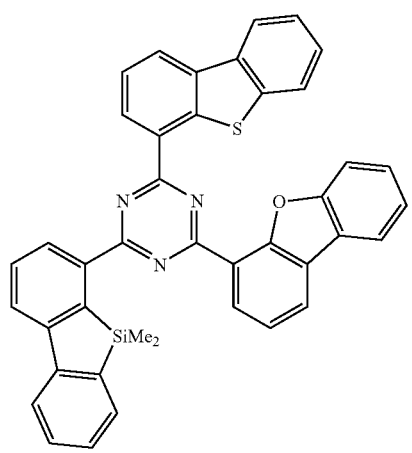
G6
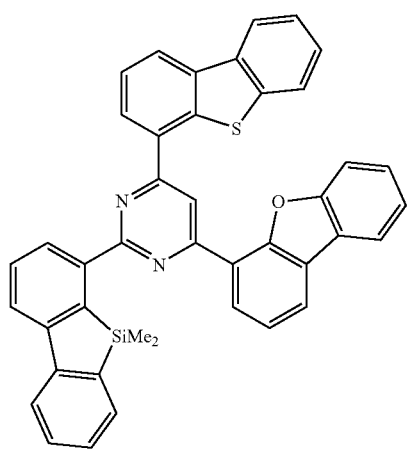

G7
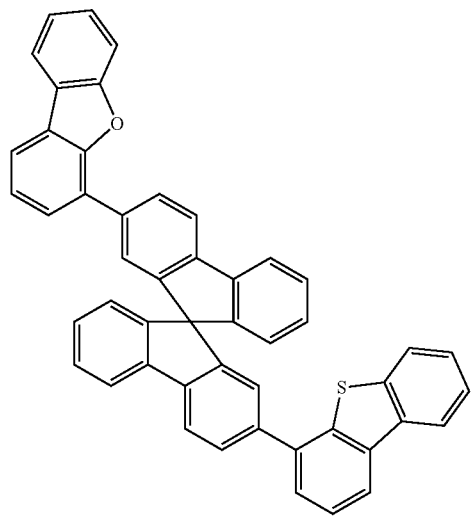
G8
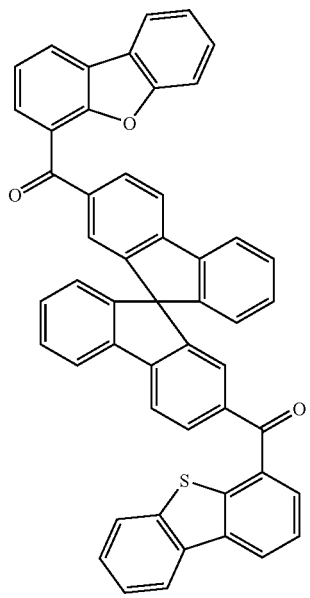
G9
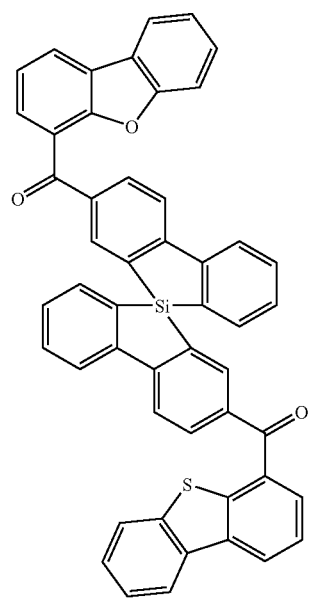
G10
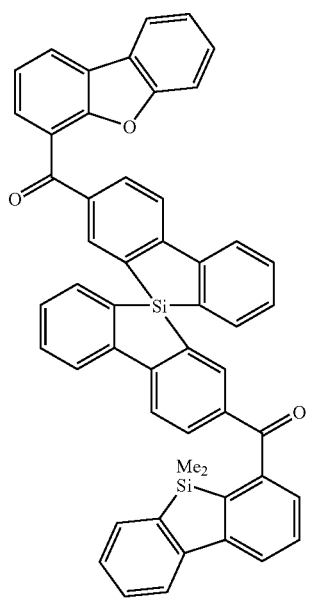

-continued
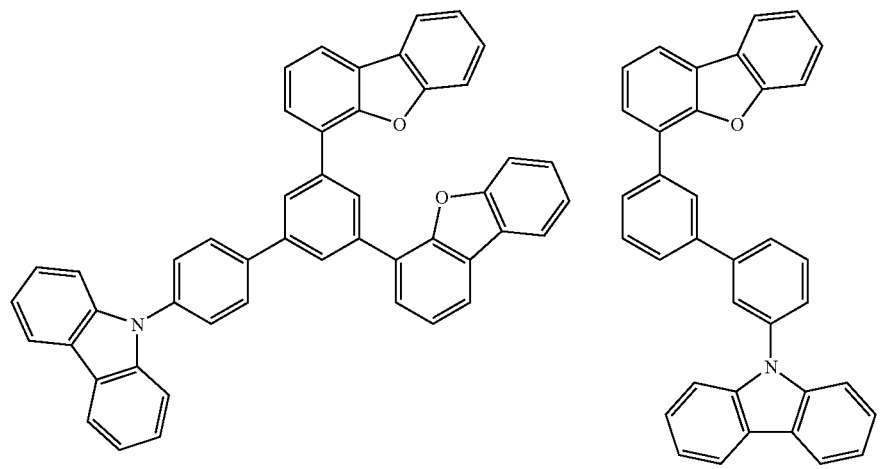
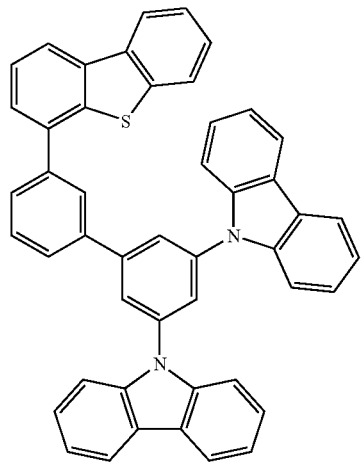
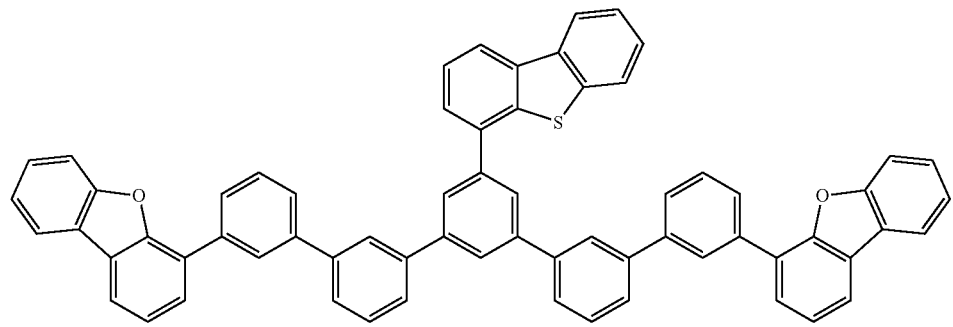
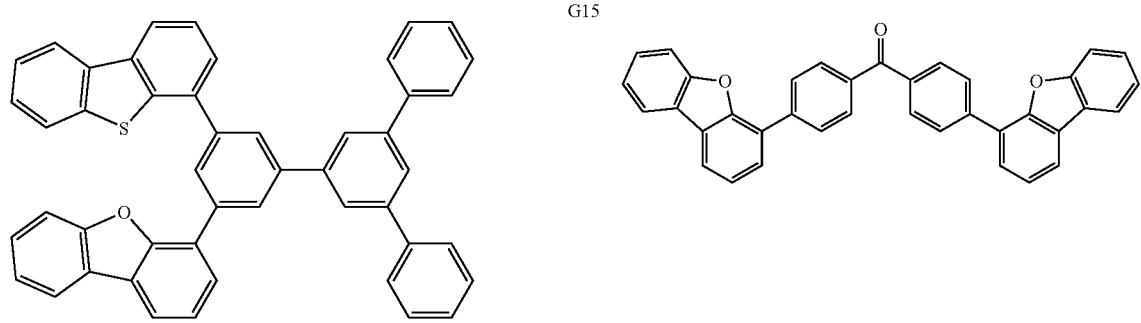

-continued

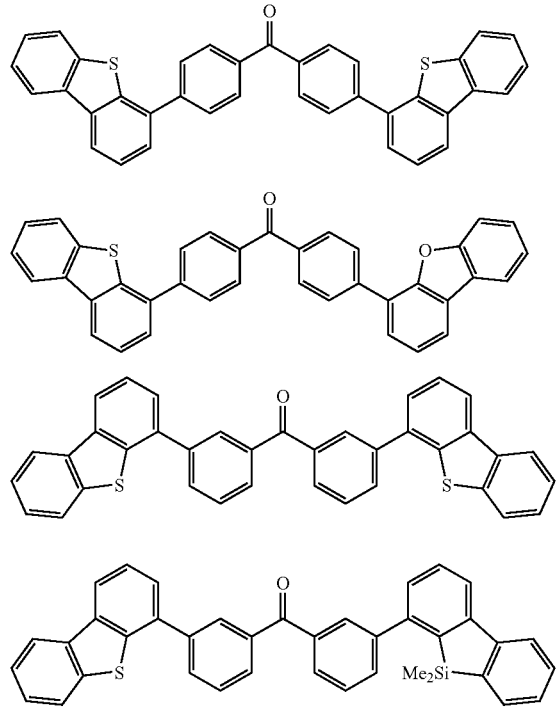

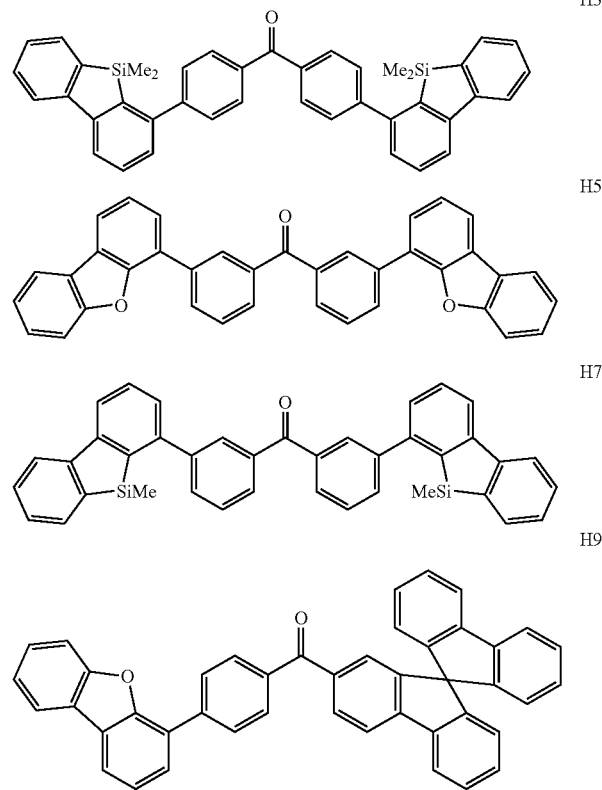

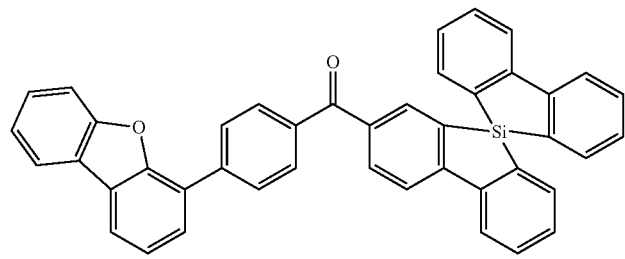

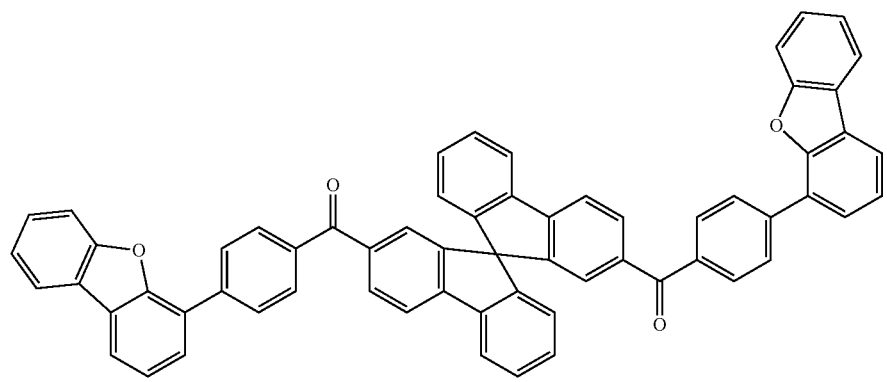

It is preferable that the material for organic EL devices of the present invention is a host material comprised in the light emitting layer of an organic EL device.

The organic EL device of the present invention will be described in the following.

The organic EL device of the present invention comprises a cathode, an anode and an organic thin film layer which comprises one layer or a plurality of layers comprising at least a light emitting layer and is disposed between the cathode and the anode, wherein at least one layer in the organic thin film layer comprises the material for organic EL devices described above.

Examples of the structure of the organic EL device of the multi-layer type include multi-layer laminate structures such as an anode/a hole transport layer (a hole injection layer)/a light emitting layer/a cathode, an anode/a light emitting layer/an electron transport layer (an electron injection layer)/a cathode, an anode/a hole transport layer (a hole injection layer)/a light emitting layer/an electron transport layer (an electron injection layer)/a cathode and an anode/a hole transport layer (a hole injection layer)/a light emitting layer/a hole blocking layer/an electron transport layer (an electron injection layer)/a cathode.

It is preferable that the light emitting layer comprises a host material and a phosphorescent light emitting material, and the host material comprises the material for organic EL devices described above.

It is preferable that the light emitting layer comprises a host material and a phosphorescent light emitting material, and light emitted from the phosphorescent light emitting material has a peak wavelength of 500 nm or shorter.

As the phosphorescent light emitting material, metal complexes such as iridium complexes, osmium complexes and platinum complexes are preferable, iridium complexes and platinum complexes are more preferable and ortho-metallated iridium complexes are most preferable since the quantum yield of phosphorescence is great and the external quantum efficiency of the light emitting device can be further increased. As for the form of the ortho-metallated complex, iridium complexes shown in the following are preferable.

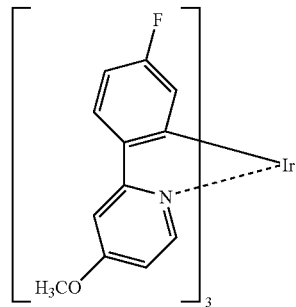

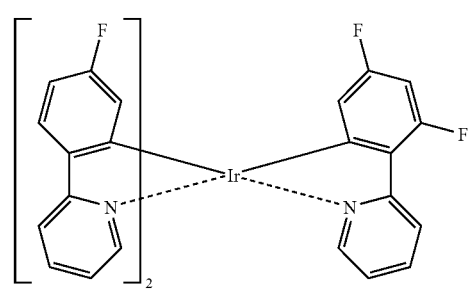

-continued
(K-8)
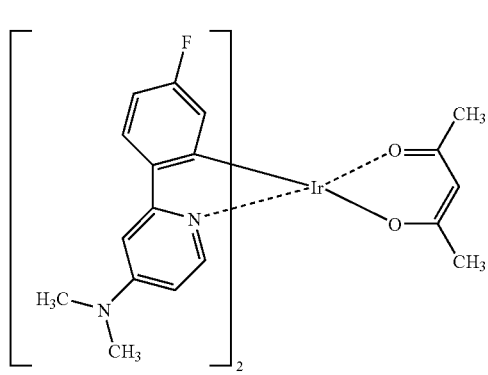
(K-9)
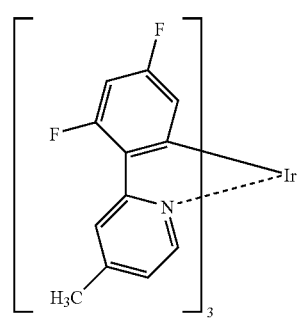
(K-10)
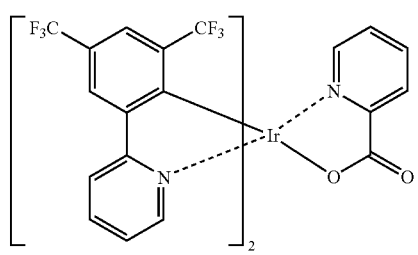
(K-11)
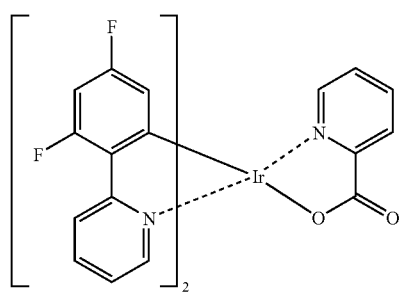
(K-12)
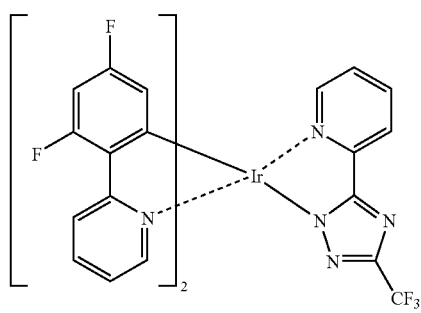
-continued
(K-13)
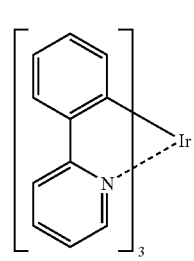
(K-14)
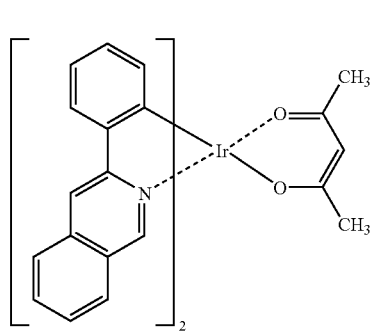
(K-15)
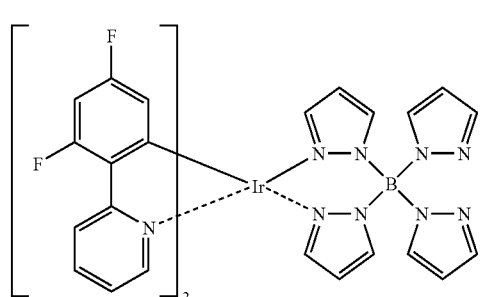
(K-16)
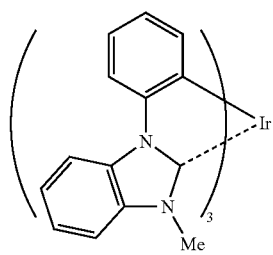
(K-17)
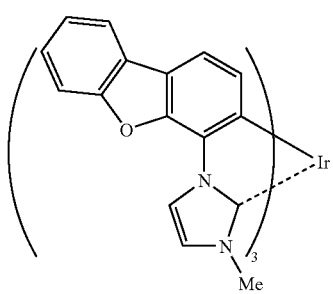

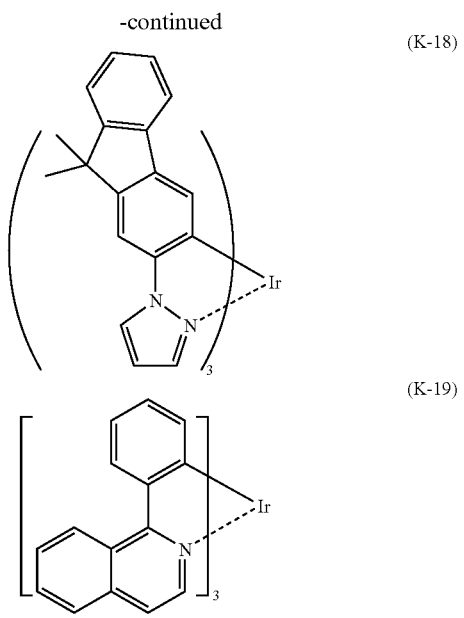

(K-18)

(K-19)

It is preferable that, in the organic EL device of the present invention, the light emitting layer comprises a host material and a phosphorescent light emitting material, and the phosphorescent light emitting material is a light emitting material having one or more carbene ligands coordinated to a metal center.

It is preferable that, in the organic EL device of the present invention, the material for organic EL devices is a host material comprised in the light emitting layer of the organic EL device.

It is preferable that, in the organic EL device of the present invention, the material for organic EL devices is a material comprised in a hole transport layer of the organic EL device.

It is preferable that, in the organic EL device of the present invention, the material for organic EL devices is a material comprised in an electron transport layer or a hole blocking layer of the organic EL device.

It is preferable that, in the organic EL device of the present invention, a reducing dopant is added into the interfacial region of the cathode and the organic thin film layer.

Examples of the reducing dopant include at least one substance selected from alkali metals, alkali metal complexes, alkali metal compounds, alkaline earth metals, alkaline earth metal complexes, alkaline earth metal compounds, rare earth metals, rare earth metal complexes and rare earth metal compounds.

Examples of the alkali metal include Na (the work function: 2.36 eV), K (the work function: 2.28 eV), Rb (the work function: 2.16 eV) and Cs (the work function: 1.95 eV). Alkali metals having a work function of 2.9 eV or smaller are preferable. Among the above alkali metals, K, Rb and Cs are more preferable, Rb and Cs are still more preferable, and Cs is most referable.

Examples of the alkaline earth metal include Ca (the work function: 2.9 eV), Sr (the work function: 2.0 to 2.5 eV) and Ba (the work function: 2.52 eV). Alkaline earth metals having a work function of 2.9 eV or smaller are preferable.

Examples of the rare earth metal include Sc, Y, Ce, Tb and Yb. Rare earth metals having a work function of 2.9 eV or smaller are preferable.

The preferable metals among the above metals have great reducing ability, and the luminance of the emitted light and the life of the organic EL device can be increased by addition of a relatively small amount into the electron injection zone.

Examples of the alkali metal compound described above include alkali metal oxides such as $Li_2O$, $Cs_2O$ and $K_2O$ and alkali metal halides such as LiF, NaF, CsF and KF. Among these compounds, alkali metal oxides and alkali metal fluorides such as LiF, $Li_2O$ and NaF are preferable.

Examples of the alkaline earth metal compound described above include BaO, SrO, CaO and mixtures thereof such as $Ba_xSr_{1-x}O$ (0<x<1) and $Ba_xCa_{1-x}O$ (0<x<1). Among these compounds, BaO, SrO and CaO are preferable.

Examples of the rare earth metal compound described above include $YbF_3$, $ScF_3$, $ScO_3$, $Y_2O_3$, $Ce_2O_3$, $GdF_3$ and $TbF_3$. Among these compounds, $YbF_3$, $ScF_3$ and $TbF_3$ are preferable.

The alkali metal complex, the alkaline earth metal complex and the rare earth metal complex are not particularly limited as long as the complexes contain at least one of the alkali metal ions, the alkaline earth metal ions and rare earth metal ions, respectively, as the metal ion. As the ligand, quinolinol, benzoquinolinol, acridinol, phenanthridinol, hydroxyphenyloxazole, hydroxyphenylthiazole, hydroxydiaryloxadiazoles, hydroxydiarylthiadiazoles, hydroxyphenylpyridine, hydroxyphenyl-benzimidazole, hydroxybenzotriazole, hydroxyfulvorane, bipyridyl, phenanthroline, phthalocyanine, porphyrin, cyclopentadiene, β-diketones, azomethines and derivatives of these compounds are preferable. However, the ligand is not limited to those described above.

As for the form of the added reducing dopant, it is preferable that the reducing dopant is added in a manner such that a layer or islands are formed in the interfacial region described above. As the process for adding the reducing dopant, it is preferable that an organic material which is a light emitting material or an electron injection material forming the interfacial region is vapor deposited while the reducing dopant is simultaneously vapor deposited in accordance with the resistance heating method so that the reducing dopant is dispersed in the organic material. The concentration of the dispersion expressed as the ratio of the amounts by mole of the organic substance to the reducing dopant is in the range of 100:1 to 1:100 and preferably in the range of 5:1 to 1:5.

When the reducing dopant is added to form a layer, the reducing dopant alone is vapor deposited in accordance with the resistance heating method to form a layer preferably having a thickness of 0.1 to 15 nm after a layer of an organic material such as the light emitting material and the electron injection material is formed as the interfacial region.

When the reducing dopant is added to form islands, the reducing dopant alone is vapor deposited in accordance with the resistance heating method to form islands preferably having a thickness of 0.05 to 1 nm after islands of an organic material such as the light emitting material and the electron injection material are formed as the interfacial region.

It is preferable that the relative amounts by mole of the main component and the reducing dopant in the organic EL device of the present invention is in the range of 5:1 to 1:5 and more preferably in the range of 2:1 to 1:2.

It is preferable that, in the organic EL device of the present invention, an electron injection layer is disposed between the light emitting layer and the cathode, and the electron injection layer comprises a cyclic derivative having one or more nitrogen atoms as the main component.

As the electron transport material used for the above electron injection layer, aromatic heterocyclic compounds having one or more heteroatoms in the molecule are preferable, and cyclic derivatives having one or more nitrogen atoms are more preferable.

As the cyclic derivative having one or more nitrogen atoms, for example, compounds represented by general formula (A) are preferable.

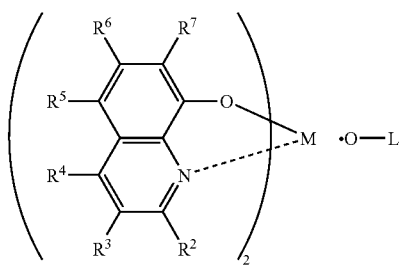

(A)

$R^2$ to $R^7$ each independently represent hydrogen atom, a halogen atom, an oxyl group, an amino group or a hydrocarbon group having 1 to 40 carbon atoms, and these groups may be substituted.

Examples of the halogen atom include the halogen atoms described above. Examples of the amino group which may be substituted include the alkylamino groups, the arylamino groups and the aralkylamino groups described above.

Examples of the hydrocarbon group having 1 to 40 carbon atoms include alkyl groups, alkenyl groups, cycloalkyl groups, alkoxyl groups, aryl groups, heterocyclic groups, aralkyl groups, aryloxyl groups and alkoxylcarbonyl groups, which may be substituted or unsubstituted. Examples of the alkyl group, the alkenyl group, the cycloalkyl group, the alkoxyl group, the aryl group, the heterocyclic group, the aralkyl group and the aryloxyl group include the groups described above as the examples of the corresponding groups. The alkoxylcarbonyl group is represented by —COOY', and examples of the group represented by Y' include the groups described above as the examples of the alkyl group.

M represents aluminum (Al), gallium (Ga) or indium (In), and In is preferable.

L in general formula (A) represents a group represented by the following general formula (A') or (A"):

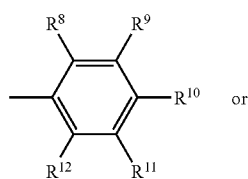

(A')

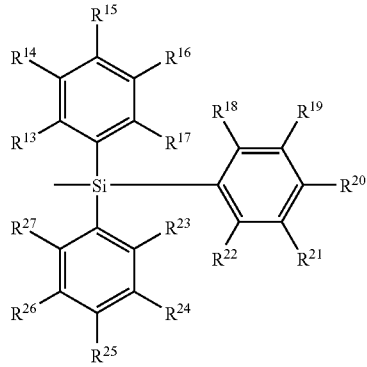

(A")

In the above general formulae, $R^8$ to $R^{12}$ each independently represent hydrogen atom or a substituted or unsubstituted hydrocarbon group having 1 to 40 carbon atoms, and adjacent groups may form a cyclic structure. $R^{13}$ to $R^{27}$ each independently represent hydrogen atom or a substituted or unsubstituted hydrocarbon group having 1 to 40 carbon atoms, and adjacent groups may form a cyclic structure.

Examples of the hydrocarbon group having 1 to 40 carbon atoms represented by $R^8$ to $R^{12}$ and $R^{13}$ to $R^{27}$ in general formulae (A') and (A") include the groups described above as the examples of the groups represented by $R^2$ to $R^7$.

Examples of the divalent group which is the cyclic group formed by bonding of the adjacent groups represented by $R^8$ to $R^{12}$ and $R^{13}$ to $R^{27}$ include tetramethylene group, pentamethylene group, hexamethylene group, diphenylmethan-2,2'-diyl group, diphenylethan-3,3'-diyl group and diphenylpropan-4,4'-diyl group.

Specific examples of the metal chelate complex having a ring having one or more nitrogen atoms represented by general formula (A) are shown in the following. However, the metal chelate complex having a ring having one or more nitrogen atoms is not limited to the compounds shown as the examples.

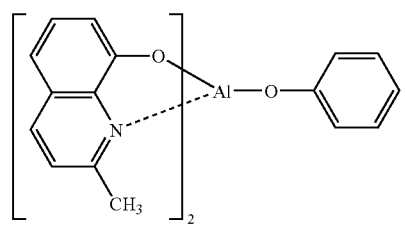

(A-1)

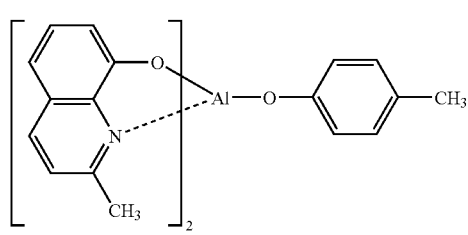

(A-2)

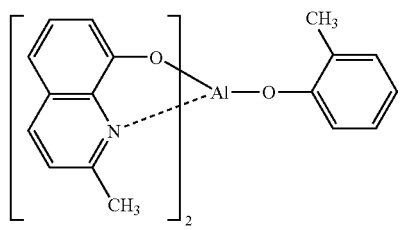 (A-3)
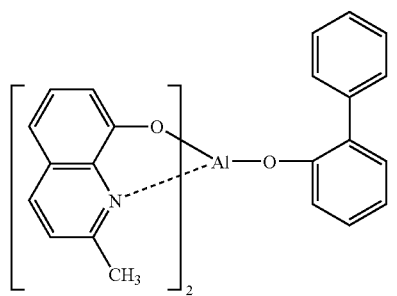 (A-4)
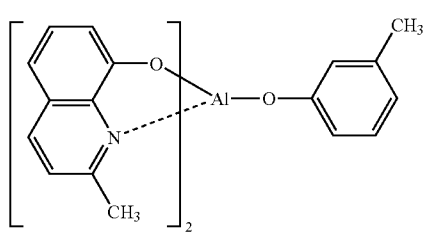 (A-5)
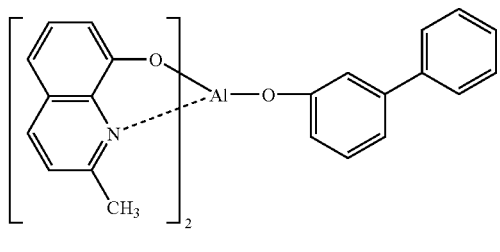 (A-6)
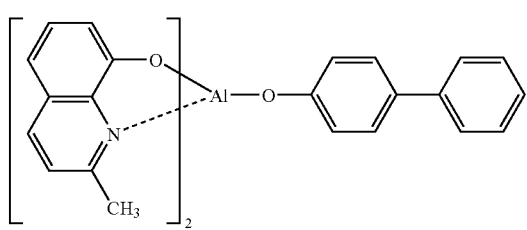 (A-7)
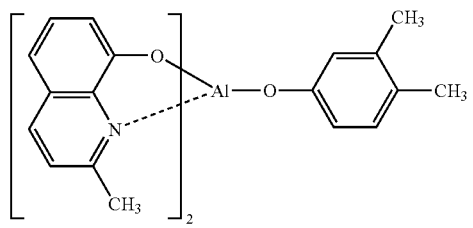 (A-8)
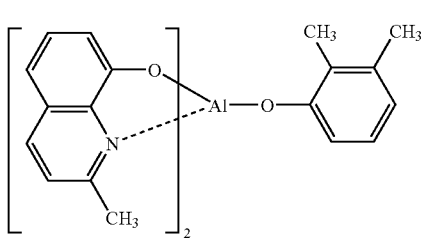 (A-9)
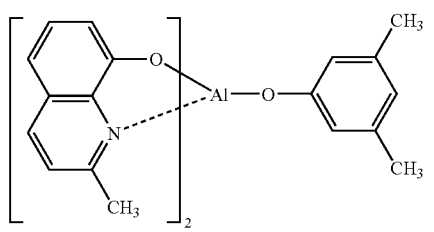 (A-10)
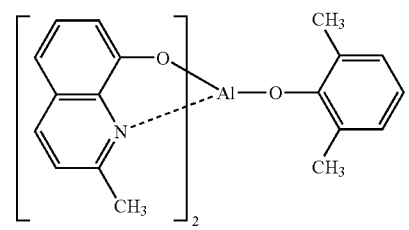 (A-11)
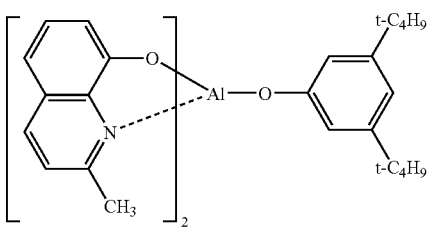 (A-12)
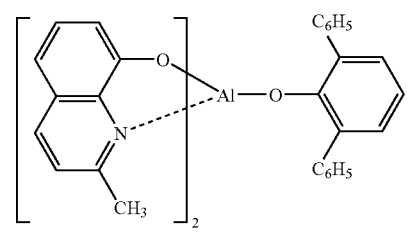 (A-13)
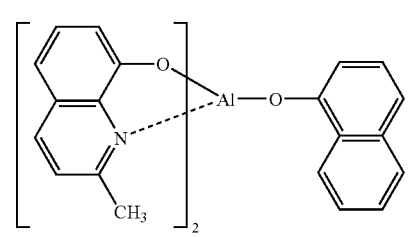 (A-14)
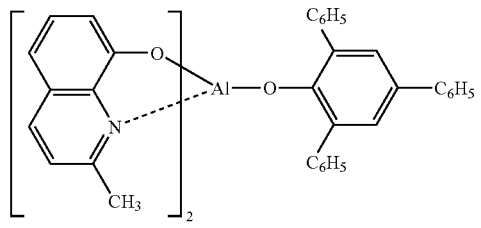 (A-15)

-continued
(A-16)
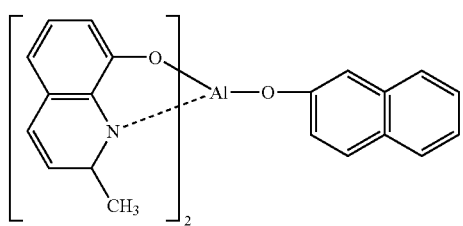
(A-17)
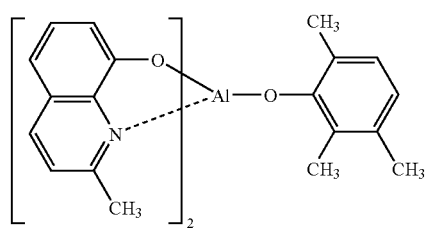
(A-18)
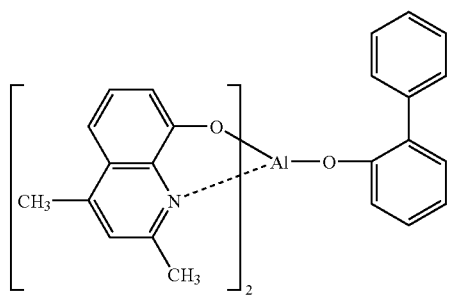
(A-19)
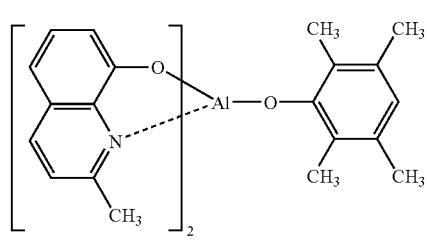
(A-20)
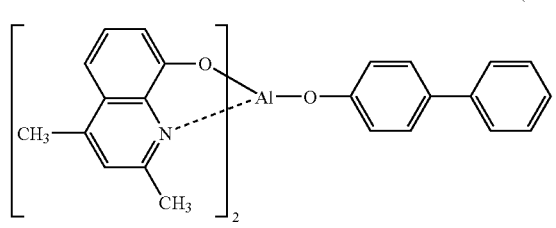
(A-21)
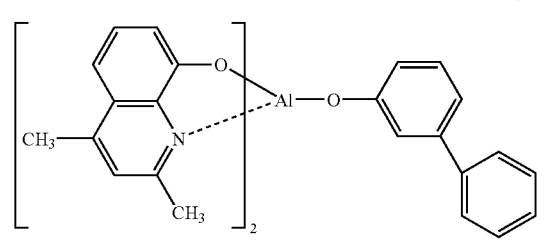
-continued
(A-22)
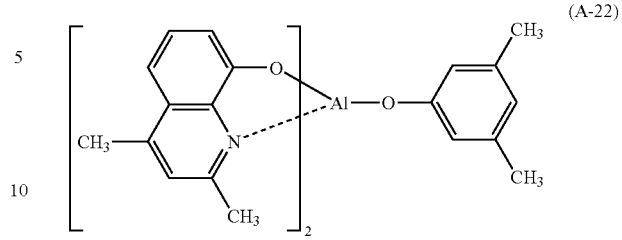
(A-23)
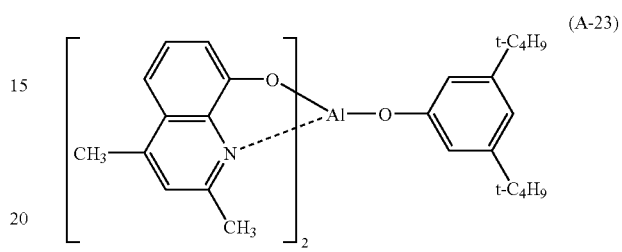
(A-24)
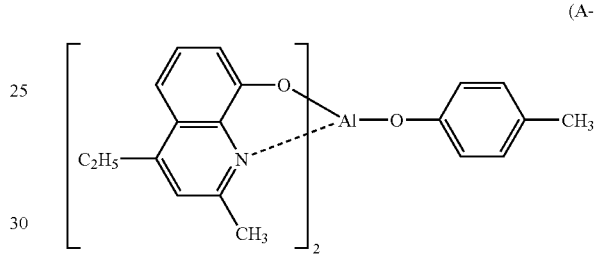
(A-25)
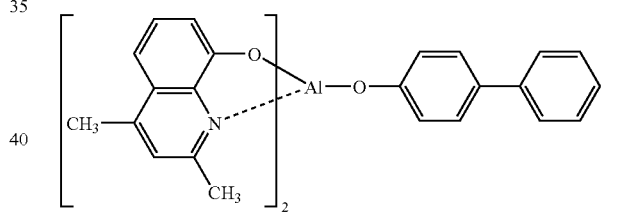
(A-26)
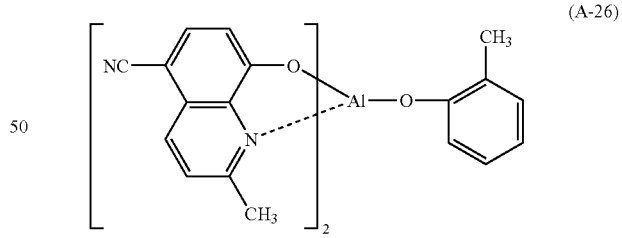
(A-27)
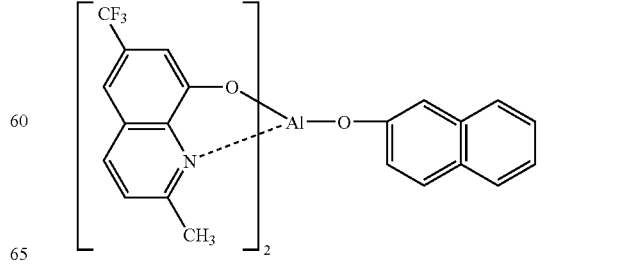

-continued

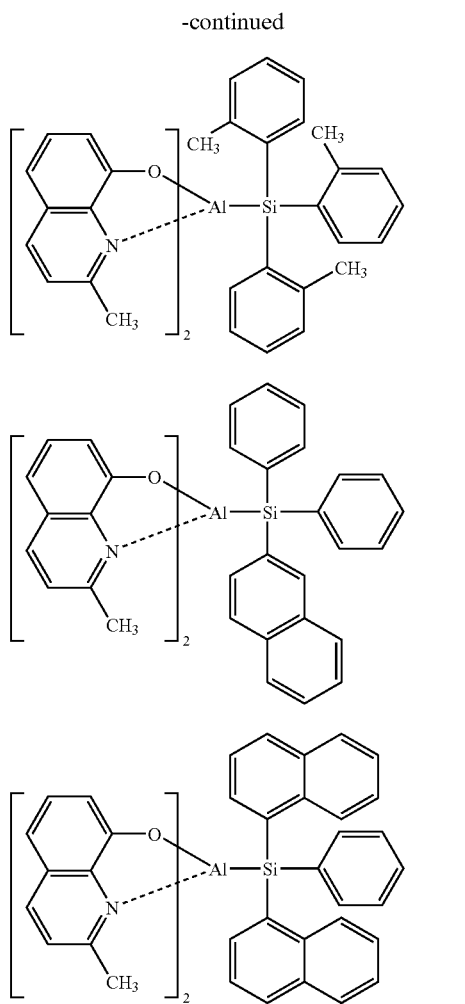

(A-28)
(A-29)
(A-30)
(A-31)

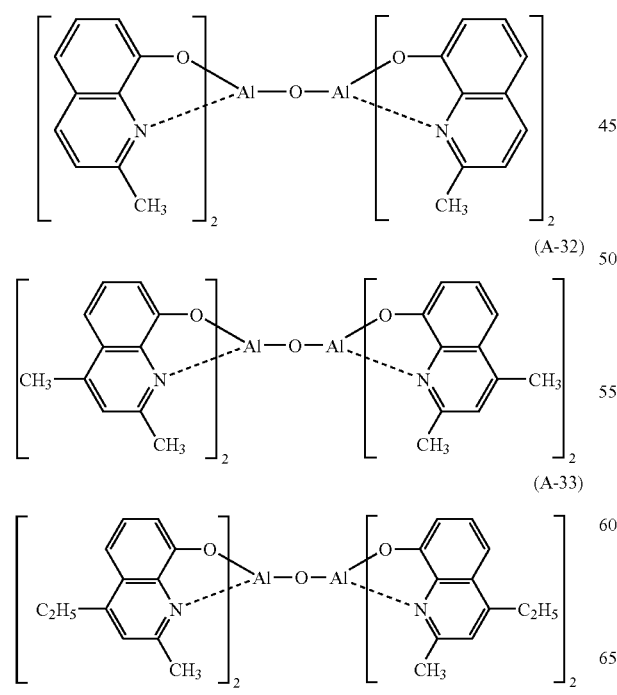

(A-32)
(A-33)

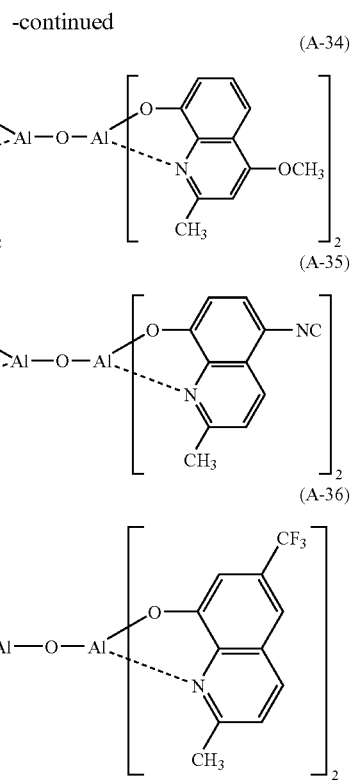

(A-34)
(A-35)
(A-36)

As the cyclic derivative having one or more nitrogen atoms of the main component of the electron injection layer, five-membered derivatives having one or more nitrogen atoms are also preferable. Examples of the five-membered ring include imidazole ring, triazole ring, tetrazole ring, oxadiazole ring, thiadiazole ring, oxatriazole ring and thiatriazole ring. Examples of the five-membered cyclic derivative having one or more nitrogen atoms include derivatives having benzimidazole ring, derivatives having benzotriazole ring, derivatives having pyridinoimidazole ring, derivatives having pyrimidinoimidazole ring and derivatives having pyridazino-imidazole ring. Derivatives represented by the following general formula (B) are preferable:

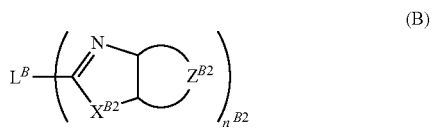

(B)

In general formula (B), $L^B$ represents a linking atom or group having a valence of two or greater. Examples of the linking atom and group preferably include carbon atom, silicon atom, nitrogen atom, boron atom, oxygen atom, sulfur atom, a metal atom such as barium atom and beryllium atom, aromatic hydrocarbon cyclic groups and aromatic heterocyclic groups. The linking atom or group is more preferably carbon atom, nitrogen atom, silicon atom, boron atom, oxygen atom, sulfur atom, an aryl group or an aromatic heterocyclic group, and most preferably carbon atom, silicon atom, an aryl group or an aromatic heterocyclic group.

The aryl group and the aromatic heterocyclic group represented by $L^B$ may have substituents. As the substituent, alkyl groups, alkenyl groups, alkynyl groups, aryl groups, amino groups, alkoxyl groups, aryloxyl groups, acyl groups, alkoxycarbonyl groups, aryloxycarbonyl groups, acyloxyl groups, acylamino groups, alkoxycarbonylamino groups, aryloxycarbonylamino groups, sulfonylamino group, sulfamoyl group, carbamoyl group, alkylthio groups, arylthio groups, sulfonyl group, halogen atoms, cyano group and aromatic heterocyclic groups are preferable; alkyl groups, aryl groups, alkoxyl groups, aryloxyl groups, halogen atoms, cyano group and aromatic heterocyclic groups are more preferable; alkyl groups, aryl groups, alkoxyl groups, aryloxyl groups and aromatic heterocyclic groups are still more preferable; and alkyl groups, aryl groups, alkoxyl groups and aromatic heterocyclic groups are most preferable.

Examples of the bonding atom and group represented by $L^B$ include atoms and groups shown in the following:

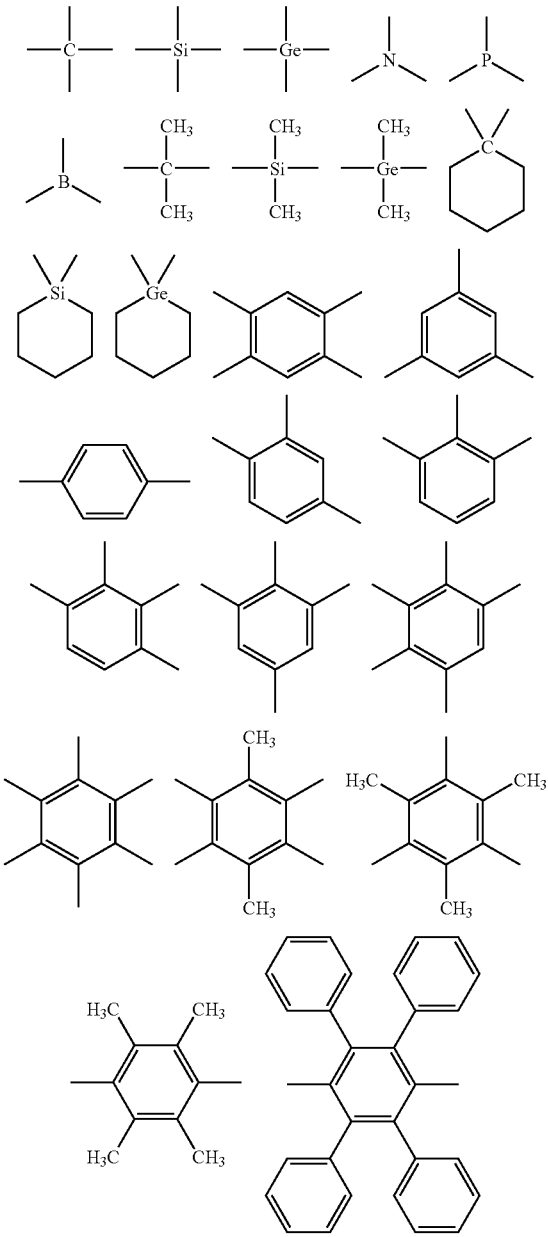

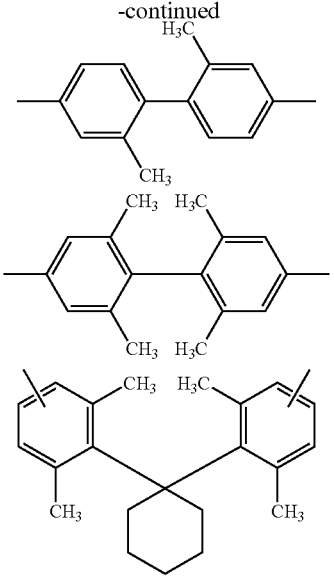

In formula (B), $X^{B2}$ represents —O—, —S— or a group represented by =N.$R^{B2}$. $R^{B2}$ represents hydrogen atom, an aliphatic hydrocarbon group, an aryl group or a heterocyclic group.

The aliphatic hydrocarbon group represented by $R^{B2}$ is a linear, branched or cyclic alkyl group (an alkyl group preferably having 1 to 20 carbon atoms, more preferably having 1 to 12 carbon atoms and most preferably having 1 to 8 carbon atoms, such as methyl group, ethyl group, isopropyl group, t-butyl group, n-octyl group, n-decyl group, n-hexadecyl group, cyclopropyl group, cyclopentyl group and cyclohexyl group), alkenyl group (an alkenyl group preferably having 2 to 20 carbon atoms, more preferably having 2 to 12 carbon atoms and most preferably having 2 to 8 carbon atoms, such as vinyl group, allyl group, 2-butenyl group and 3-pentenyl group) or alkynyl group (an alkynyl group preferably having 2 to 20 carbon atoms, more preferably having 2 to 12 carbon atoms and most preferably having 2 to 8 carbon atoms, such as propargyl group and 3-pentynyl group) and is preferably an alkyl group.

The aryl group represented by $R^{B2}$ is an aryl group having a single ring or a condensed ring preferably having 6 to 30 carbon atoms, more preferably having 6 to 20 carbon atoms and most preferably having 6 to 12 carbon atoms. Examples of the aryl group include phenyl group, 2-methylphenyl group, 3-methylphenyl group, 4-methylphenyl group, 2-methoxyphenyl group, 3-trifluoromethylphenyl group, pentafluoro-phenyl group, 1-naphthyl group and 2-naphthyl group.

The heterocyclic group represented by $R^{B2}$ is a heterocyclic group having a single ring or a condensed ring and preferably having 1 to 20 carbon atoms, more preferably having 1 to 12 carbon atoms and most preferably having 2 to 10 carbon atoms, and preferably an aromatic heterocyclic group having at least one of nitrogen atom, oxygen atom, sulfur atom and selenium atom. Examples of the heterocyclic group include groups derived from pyrrolidine, piperidine, piperazine, morpholine, thiophene, selenophene, furan, pyrrol, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthylidine, quinoxaline, quinazoline, cinnoline, puteridine, acridine, phenanthroline, phenazine, tetrazole, benzimidazole, benzoxazole, benzothiazole, benzotriazole, tetrazaindene, carbazole and azepine; preferably groups derived from furan, thiophene, pyridine, pyrazine, pyrimidine, pyridazine, triazine, quinoline, phthalazine, naphthylidine, quinoxaline or quinazoline; more preferably groups derived from furan, thiophene, pyridine or quinoline; and most preferably the group derived from quinoline.

The aliphatic hydrocarbon group, the aryl group and the heterocyclic group which are represented by $R^{B2}$ may have substituents. Examples of the substituent include the substituents described above as the examples of the substituent to the group represented by $L^B$. Preferable examples of the substituent include the substituents described above as the preferable examples of the substituent to the group represented by $L^B$.

$R^{B2}$ preferably represents an aliphatic hydrocarbon group, an aryl group or a heterocyclic group, more preferably an aliphatic hydrocarbon group (preferably having 6 to 30 carbon atoms, more preferably 6 to 20 carbon atoms and most preferably 6 to 12 carbon atoms) or an aryl group and most preferably an aliphatic hydrocarbon group (preferably having 1 to 20 carbon atoms, more preferably 1 to 12 carbon atoms and most preferably 2 to 10 carbon atoms).

$X^{B2}$ preferably represents —O— or a group represented by =N—$R^{B2}$, more preferably a group represented by =N—$R^{B2}$ and most preferably a group represented by =N—$R^{B2}$.

$Z^{B2}$ represents a group of atoms necessary for forming an aromatic ring. The aromatic ring formed with the group of atoms represented by $Z^{B2}$ may be any of an aromatic hydrocarbon ring and an aromatic heterocyclic ring. Examples of the aromatic ring include benzene ring, pyridine ring, pyrazine ring, pyrimidine ring, pyridazine ring, triazine ring, pyrrol ring, furan ring, thiophene ring, selenophene ring, tellurophene ring, imidazole ring, thiazole ring, selenazole ring, tellurazole ring, thiadiazole ring, oxadiazole ring and pyrazole ring. Among these rings, benzene ring, pyridine ring, pyrazine ring, pyrimidine ring and pyridazine ring are preferable, benzene ring, pyridine ring and pyrazine ring are more preferable, benzene ring and pyridine ring are still more preferable, and pyridine ring is most preferable.

The aromatic ring formed with the group of atoms represented by $Z^{B2}$ may form a condensed ring in combination with other rings and may have substituents. Examples of the substituent include the substituents described above as the examples of the substituent to the groups represented by $L^B$. As the substituent, alkyl groups, alkenyl groups, alkynyl groups, aryl groups, amino groups, alkoxyl groups, aryloxyl groups, acyl groups, alkoxycarbonyl groups, aryloxycarbonyl groups, acyloxyl groups, acylamino groups, alkoxycarbonylamino groups, aryloxycarbonylamino groups, sulfonylamino group, sulfamoyl group, carbamoyl group, alkylthio groups, arylthio groups, sulfonyl group, halogen atoms, cyano group and heterocyclic groups are preferable; alkyl groups, aryl groups, alkoxyl groups, aryloxyl groups, halogen atoms, cyano group and heterocyclic groups are more preferable; alkyl groups, aryl groups, alkoxyl groups, aryloxyl groups and aromatic heterocyclic groups are still more preferable; and alkyl groups, aryl groups, alkoxyl groups and aromatic heterocyclic groups are most preferable.

$n^{B2}$ represents an integer of 1 to 4 and preferably 2 or 3.

Among the five-membered derivative having one or more nitrogen atoms represented by the above general formula (B), compounds represented by the following general formula (B') are preferable.

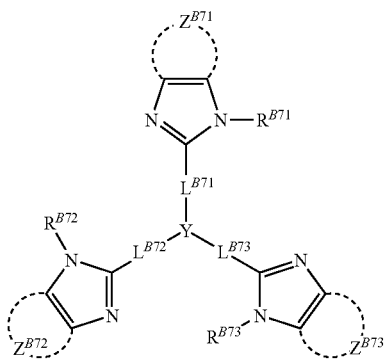

(B')

In general formula (B'), $R^{B71}$, $R^{B72}$ and $R^{B73}$ are each as defined for $R^{B2}$ in general formula (B), and preferable groups are the same as those represented by $R^{B2}$.

$Z^{B71}$, $Z^{B72}$ and $Z^{B73}$ are each as defined for $Z^{B2}$ in general formula (B), and preferable groups are the same as those represented by $Z^{B2}$.

$L^{B71}$, $L^{B72}$ and $L^{B73}$ each represent a linking group. Examples of the group include divalent groups derived from the groups described as the examples of the group represented by $L^B$ in general formula (B). The linking group is preferably the single bond, a divalent aromatic hydrocarbon cyclic group, a divalent aromatic heterocyclic group or a linking group obtained as a combination of these groups, and more preferably the single bond. The groups represented by $L^{B71}$, $L^{B72}$ and $L^{B73}$ may have substituents. Examples of the substituent include the substituents described above as the examples of the substituent to the groups represented by $L^B$ in general formula (B). Preferable examples of the substituent include the substituents described above as the preferable examples of the substituent to the groups represented by $L^B$ in general formula (B).

Y represents nitrogen atom, 1,3,5-benzenetriyl group or 2,4,6-triazinetriyl group. 1,3,5-Benzenetriyl group may have substituents at the 2-, 4- and 6-positions. Examples of the substituent include alkyl groups, aromatic hydrocarbon cyclic groups and halogen atoms.

Examples of the five-membered cyclic derivative having one or more nitrogen atoms which is represented by general formula (B) or (B') are shown in the following. However, the five-membered cyclic derivative having one or more nitrogen atoms is not limited to the compounds shown as the examples.

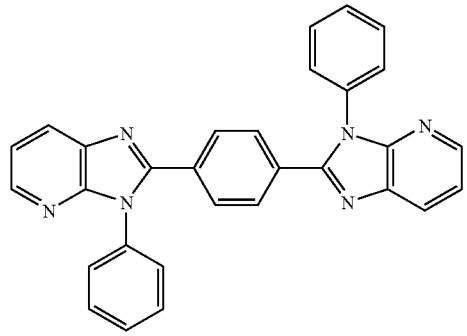

(B-1)

-continued
(B-2)
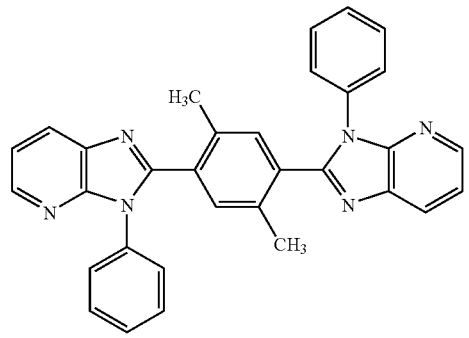
(B-3)
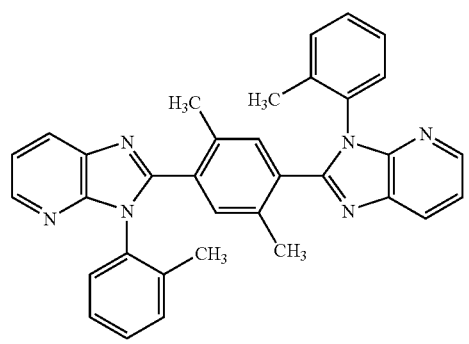
(B-4)
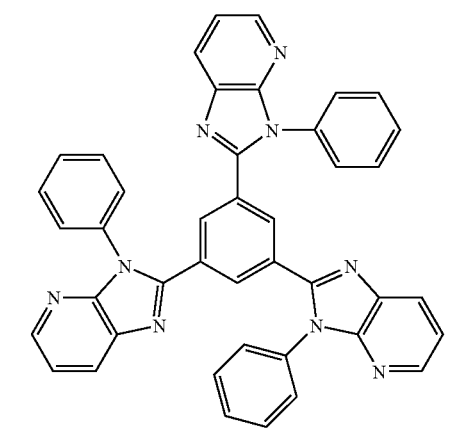
(B-5)
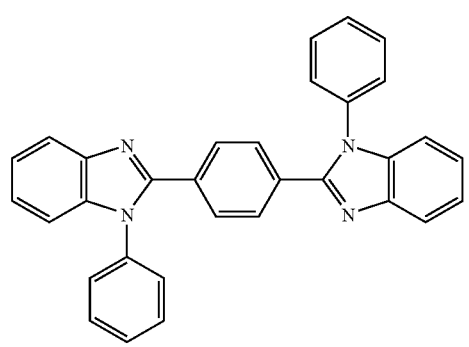
-continued
(B-6)
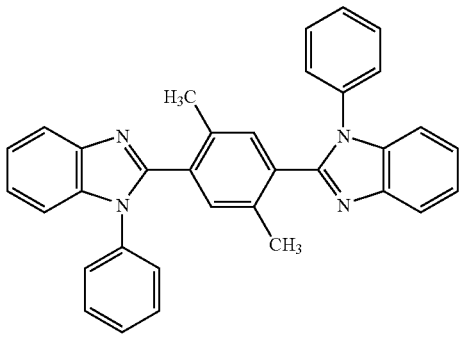
(B-7)
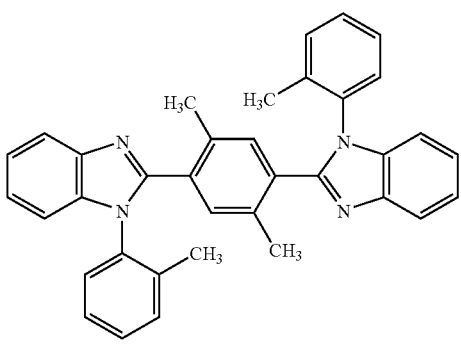
(B-8)
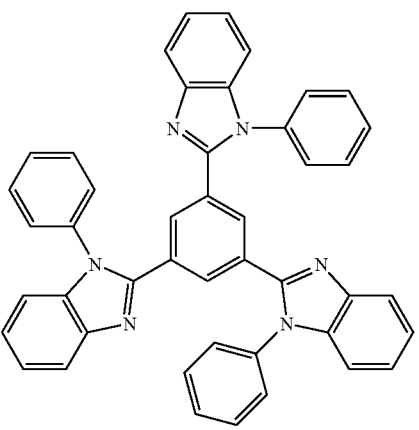
(B-9)
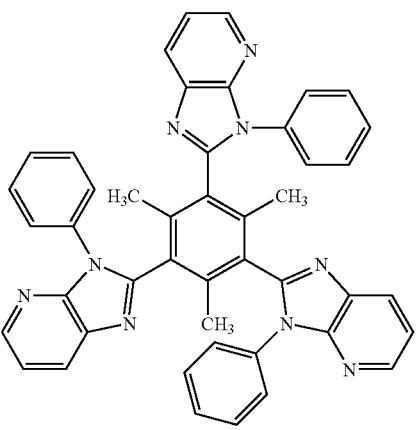

-continued
(B-10)
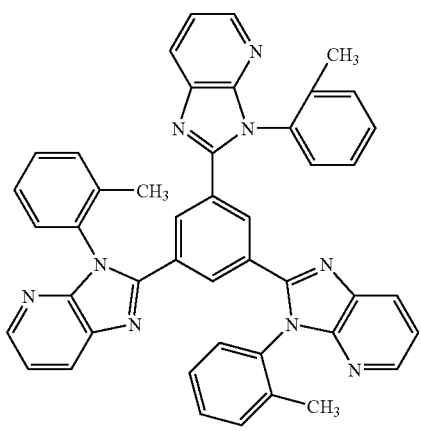
(B-11)
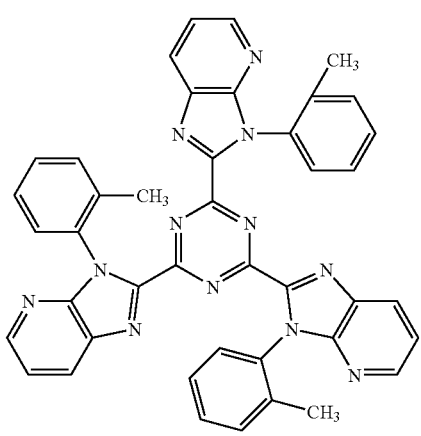
(B-12)
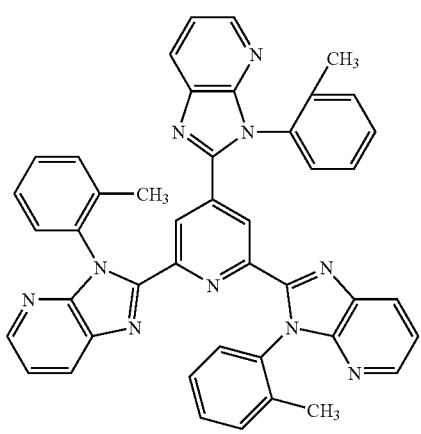
-continued
(B-13)
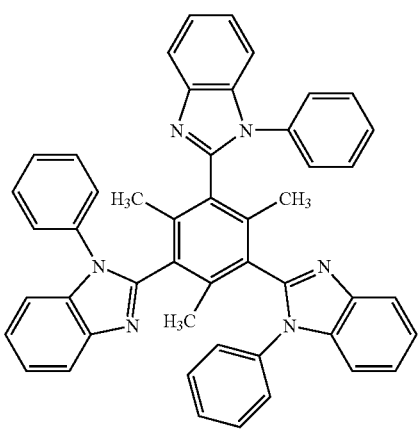
(B-14)
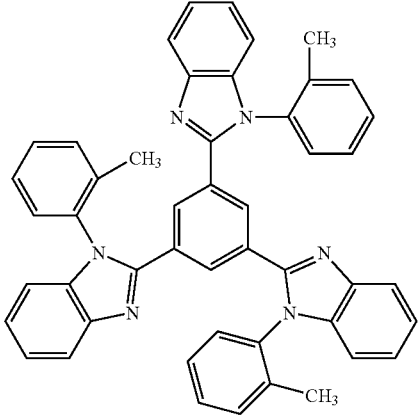
(B-15)
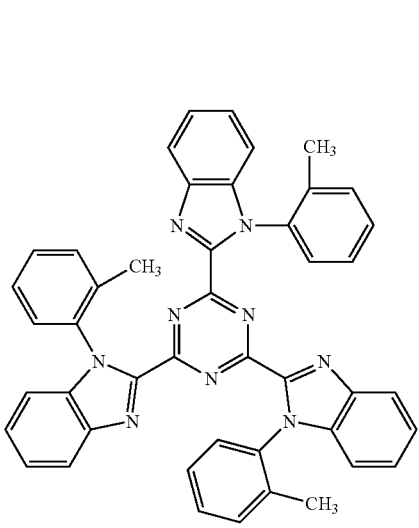

-continued (B-16)

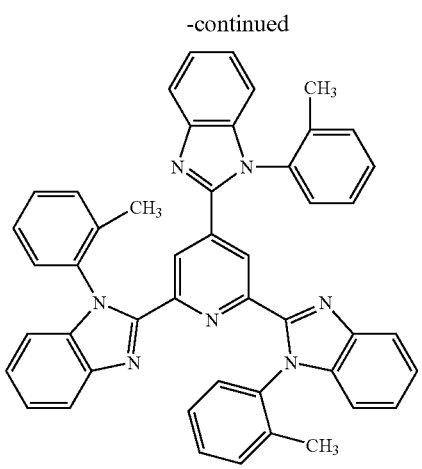

It is preferable that an insulating material or a semiconductor of an inorganic compound is used as the substance constituting the electron injection layer for the substance other than the ring derivative having one or more nitrogen atoms. When the electron injection layer comprises the insulating material or the semiconductor, leak of the electric current can be effectively prevented, and the electron injection property can be improved.

As the insulating material, at least one metal compound selected from the group consisting of chalcogenides of alkali metals, chalcogenides of alkaline earth metals, halides of alkali metals and halides of alkaline earth metals is preferable. It is preferable that the electron injection layer comprises the above metal compound since the electron injection property can be further improved. Preferable examples of the chalcogenide of an alkali metal include $Li_2O$, $K_2O$, $Na_2S$, $Na_2Se$ and $Na_2O$. Preferable examples of the chalcogenide of an alkaline earth metal include CaO, BaO, SrO, BeO, BaS and CaSe. Preferable examples of the halide of an alkali metal include LiF, NaF, KF, LiCl, KCl and NaCl. Preferable examples of the halide of an alkaline earth metal include fluoride such as $CaF_2$, $BaF_2$, $SrF_2$, $MgF_2$ and $BeF_2$ and halides other than the fluorides.

Examples of the semiconductor include oxides, nitrides and oxide nitrides comprising at least one element selected from Ba, Ca, Sr, Yb, Al, Ga, In, Li, Na, Cd, Mg, Si, Ta, Sb and Zn used singly or in combination of two or more. It is preferable that the inorganic compound constituting the electron injection layer forms crystallite or amorphous insulating thin film. When the electron injection layer is constituted with the insulating thin film described above, a more uniform thin film can be formed, and defects of pixels such as dark spots can be decreased. Examples of the inorganic compound include chalcogenides of alkali metals, chalcogenides of alkaline earth metals, halides of alkali metals and halides of alkaline earth metals which are described above.

It is also preferable that the electron injection layer in the present invention comprises the reducing dopant described above.

The anode of the organic EL device plays the role of injection holes into the hole transport layer or the light emitting layer. It is effective that the anode has a work function of 4.5 eV or greater. Examples of the material of the anode used in the present invention include indium tin oxide alloys (ITO), tin oxides (NESA), gold, silver, platinum and copper. As the cathode, a material having a small work function is preferable so that electrons can be injected into the electron transport layer or the light emitting layer. The material of the cathode is not particularly limited. Examples of the material of the cathode include indium, aluminum, magnesium, magnesium-indium alloys, magnesium-aluminum alloys, aluminum-lithium alloys, aluminum-scandium-lithium alloys and magnesium-silver alloys.

The process for forming the layers in the organic EL device of the present invention is not particularly limited. A conventional process such as the vacuum vapor deposition process and the spin coating process can be used. The organic thin film layer which comprises the compound represented by any one of general formulae (1) to (3) and used in the organic EL device of the present invention can be formed in accordance with the vacuum vapor deposition process or the molecular beam epitaxy process (the MBE process) or, using a solution prepared by dissolving the compound into a solvent, in accordance with a conventional coating process such as the dipping process, the spin coating process, the casting process, the bar coating process and the roll coating process.

The thickness of each organic layer in the organic EL device of the present invention is not particularly limited. In general, an excessively thin layer tends to have defects such as pin holes, and an excessively thick layer requires a high applied voltage to decrease the efficiency. In general, a thickness in the range of several nanometers to 1 μm is preferable.

EXAMPLES

The present invention will be described more specifically with reference to examples in the following.

Synthesis Example 1

Synthesis of D1

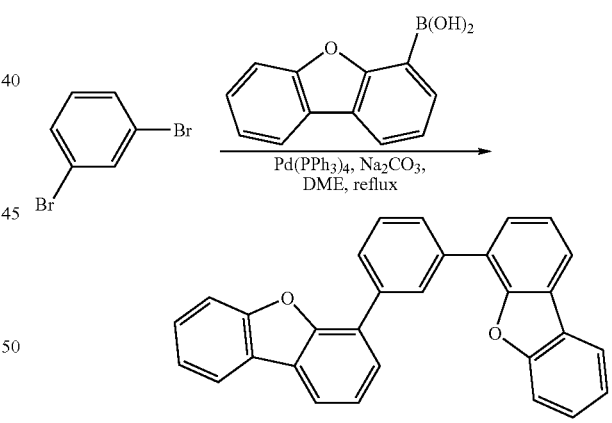

Into a 300 ml three-necked flask, 3.75 g (17.7 mmole) of 4-dibenzofuranboric acid and 1.02 g (0.885 mmole) of tetrakis-(triphenylphosphine)palladium were placed under the atmosphere of argon, and the flask was purged with argon. To the above mixture, 53.1 ml of 1,2-dimethoxyethane, 0.810 ml (6.73 mmole) of 1,4-dibromobenzene and 26.6 ml of a 2.0 M aqueous solution of sodium carbonate (53.1 mmole) were added, and the resultant mixture was heated under the atmosphere of argon in the refluxing condition for 8 hours. After the reaction fluid was filtered, the obtained solid substance was washed with water, methanol and methylene chloride, and 2.72 g (6.63 mmole; the yield: 98%) of Compound D1 was obtained. The obtained substance was identified to be the object compound in accordance with 90 MHz ¹H-NMR and FD-MS (the field desorption mass spectroscopy). The result of FD-MS is shown in the following.

FD-MS: calcd. for $C_{30}H_{18}O_2$=410; found: m/z=410 (M⁺, 100)

The obtained compound was purified by sublimation at 190° C. The purity of the compound obtained after the purification by sublimation was 99.8%.

Synthesis Example 2

Synthesis of E1

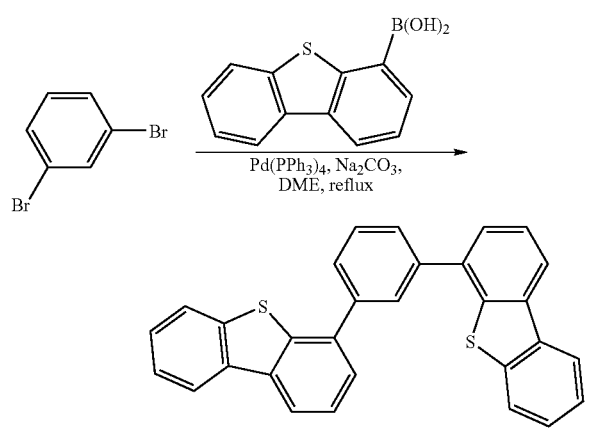

Into a 300 ml three-necked flask, 3.42 g (15.0 mmole) of 4-dibenzothiopheneboric acid and 0.867 g (0.750 mmole) of tetrakis(triphenylphosphine)palladium were placed under the atmosphere of argon, and the flask was purged with argon. To the above mixture, 45.0 ml of 1,2-dimethoxyethane, 0.688 ml (5.70 mmole) of 1,4-dibromo-benzene and 22.5 ml of a 2.0 M aqueous solution of sodium carbonate (45.0 mmole) were added, and the resultant mixture was heated under the atmosphere of argon in the refluxing condition for 8 hours. After the reaction fluid was filtered, the obtained solid substance was washed with water, methanol and methylene chloride, and 1.64 g (3.71 mmole; the yield: 54%) of Compound E1 was obtained. The obtained substance was identified to be the object compound in accordance with 90 MHz ¹H-NMR and FD-MS (the field desorption mass spectroscopy). The result of FD-MS is shown in the following.

FD-MS: calcd. for $C_{30}H_{18}S_2$=442; found: m/z=442 (M⁺, 100)

The obtained compound was purified by sublimation at 230° C.

The purity of Compound 2 obtained after the purification by sublimation was 99.7%.

Synthesis Example 3

Synthesis of Compound E4

The route of synthesis of Compound E4 is shown in the following.

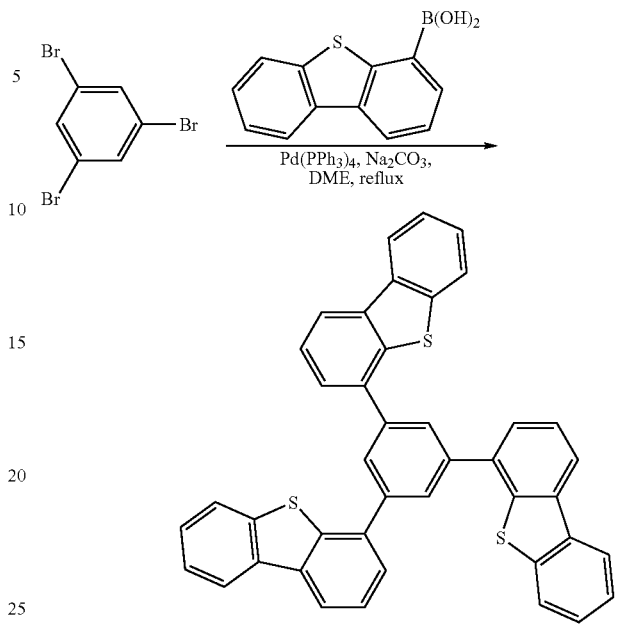

Into a 300 ml three-necked flask, 6.04 g (26.5 mmole) of 4-dibenzothiopheneboric acid, 2.25 g (7.14 mmole) of 1,3,5-tribromo-benzene and 2.30 g (1.99 mmole) of tetrakis(triphenylphosphine)-palladium were placed under the atmosphere of argon, and the flask was purged with argon. To the above mixture, 79.5 ml of 1,2-dimethoxy-ethane and 39.8 ml of a 2.0 M aqueous solution of sodium carbonate (79.5 mmole) were added, and the resultant mixture was heated under the atmosphere of argon in the refluxing condition for 16 hours. After the reaction fluid was filtered, the obtained solid substance was washed with water, methanol and methylene chloride, and 1.78 g (2.85 mmole; the yield: 40%) of Compound E4 was obtained. The obtained substance was identified to be the object compound in accordance with 90 MHz ¹H-NMR and FD-MS (the field desorption mass spectroscopy). The result of FD-MS is shown in the following.

FD-MS; calcd. for $C_{42}H_{24}S_3$=624; found: m/z=624 (M⁺, 100)

The obtained compound was purified by sublimation at 260° C. The purity of the compound obtained after the purification by sublimation was 99.4%.

Synthesis Example 4

Synthesis of Compound E2

The route of synthesis of Compound E2 is shown in the following.

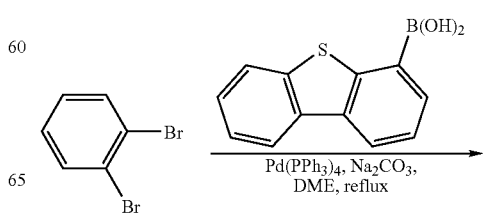

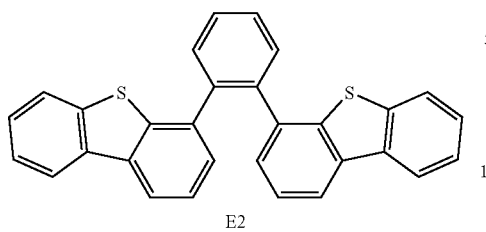

E2

Into a 300 ml three-necked flask, 4.04 g (17.7 mmole) of 4-dibenzothiopheneboric acid and 1.02 g (0.885 mmole) of tetrakis(triphenylphosphine)palladium were placed under the atmosphere of argon, and the flask was purged with argon. To the above mixture, 53.1 ml of 1,2-dimethoxyethane, 0.800 ml (6.73 mmole) of 1,2-dibromo-benzene and 26.6 ml of a 2.0 M aqueous solution of sodium carbonate (53.1 mmole) were added, and the resultant mixture was heated under the atmosphere of argon in the refluxing condition for 8 hours. After the reaction fluid was filtered, the obtained solid substance was purified in accordance with the silica gel column chromatography (the elution solvent: methylene chloride/hexane=1/3), and 1.92 g (4.34 mmole; the yield: 64%) of Compound E2 was obtained. The obtained substance was identified to be the object compound in accordance with 90 MHz $^1$H-NMR and FD-MS (the field desorption mass spectroscopy). The result of FD-MS is shown in the following.

FD-MS: calcd. for $C_{30}H_{18}S_2$=442; found: m/z=442 (M$^+$, 100)

The obtained compound was purified by sublimation at 210° C.

The purity of the compound obtained after the purification by sublimation was 99.4%.

Synthesis Example 5

Synthesis of Compound E3

The route of synthesis of Compound E3 is shown in the following.

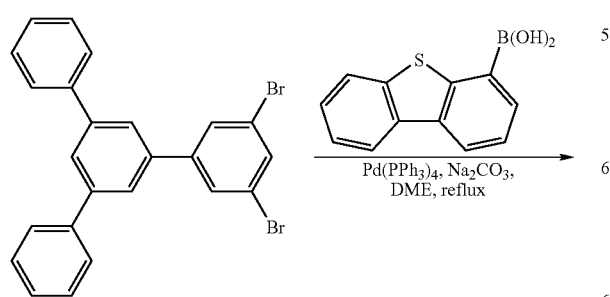

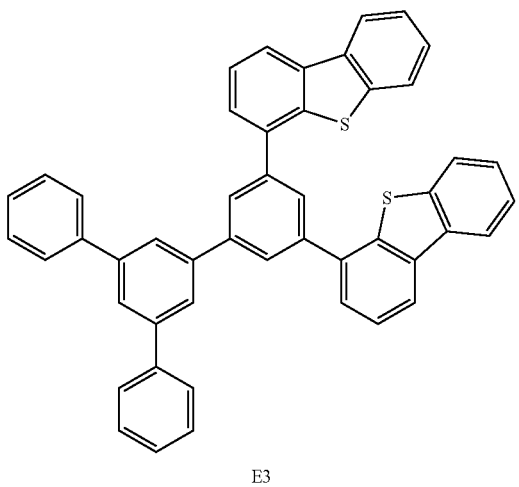

E3

Into a 300 ml three-necked flask, 1.41 g (6.17 mmole) of 4-dibenzothiopheneboric acid, 1.20 g (2.59 mmole) of aryl dibromide and 0.356 g (0.309 mmole) of tetrakis(triphenylphosphine)palladium were placed under the atmosphere of argon, and the flask was purged with argon. To the above mixture, 18.5 ml of 1,2-dimethoxyethane and 9.25 ml of a 2.0 M aqueous solution of sodium carbonate (18.5 mmole) were added, and the resultant mixture was heated under the atmosphere of argon in the refluxing condition for 8 hours. To the reaction fluid, 100 ml of water and 100 ml of methylene chloride were added, and the organic layer was separated and dried with anhydrous magnesium sulfate. After the dried solution was concentrated under a reduced pressure using an evaporator, the formed solid substance was purified in accordance with the silica gel column chromatography (the elution solvent: methylene chloride/hexane=1/3), and 1.30 g (1.94 mmole; the yield: 75%) of Compound E3 was obtained. The obtained substance was identified to be the object compound in accordance with 90 MHz $^1$H-NMR and FD-MS (the field desorption mass spectroscopy). The result of FD-MS is shown in the following.

FD-MS: calcd. for $C_{48}H_{30}S_2$=670; found: m/z=670 (M$^+$, 100)

The obtained compound was purified by sublimation at 210° C. The purity of Compound E3 obtained after the purification by sublimation was 99.5%.

Synthesis Example 6

Synthesis of Compound D3

The route of synthesis of Compound D3 is shown in the following.

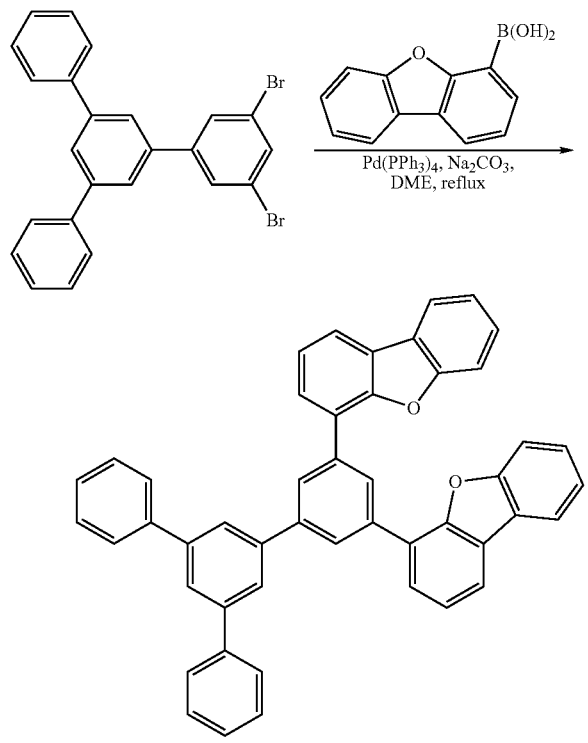

D3

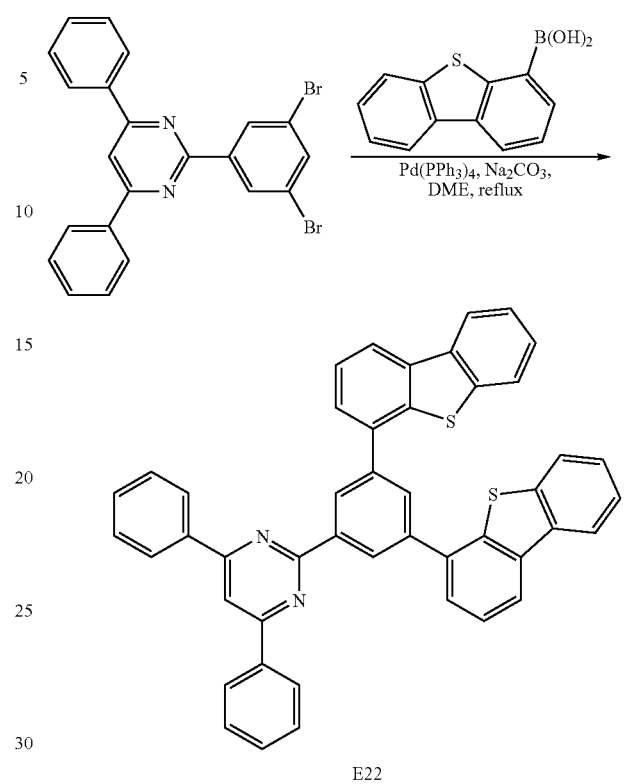

E22

Into a 300 ml three-necked flask, 2.31 g (10.9 mmole) of 4-dibenzofuranboric acid, 2.12 g (4.57 mmole) of aryl dibromide and 0.630 g (0.545 mmole) of tetrakis(triphenylphosphine)palladium were placed under the atmosphere of argon, and the flask was purged with argon. To the above mixture, 32.7 ml of 1,2-dimethoxyethane and 16.4 ml of a 2.0 M aqueous solution of sodium carbonate (32.7 mmole) were added, and the resultant mixture was heated under the atmosphere of argon in the refluxing condition for 8 hours. To the reaction fluid, 100 ml of water and 100 ml of methylene chloride were added, and the organic layer was separated and dried with anhydrous magnesium sulfate. After the dried solution was concentrated under a reduced pressure using an evaporator, the formed solid substance was purified in accordance with the silica gel column chromatography (the elution solvent: methylene chloride/hexane=1/3), and 1.90 g (2.97 mmole; the yield: 65%) of Compound D3 was obtained. The obtained substance was identified to be the object compound in accordance with 90 MHz $^1$H-NMR and FD-MS (the field desorption mass spectroscopy). The result of FD-MS is shown in the following.

FD-MS: calcd. for $C_{48}H_{30}O_2$=638; found: m/z=638 ($M^+$, 100)

The obtained compound was purified by sublimation at 200° C. The purity of Compound D3 obtained after the purification by sublimation was 99.7%.

Synthesis Example 7

Synthesis of Compound E22

The route of synthesis of Compound E22 is shown in the following.

Into a 300 ml three-necked flask, 4.33 g (19.0 mmole) of 4-dibenzothiopheneboric acid, 3.75 g (8.00 mmole) of an aryl dibromide and 1.10 g (0.950 mmole) of tetrakis(triphenylphosphine)palladium were placed under the atmosphere of argon, and the flask was purged with argon. To the above mixture, 57.0 ml of 1,2-dimethoxyethane and 28.5 ml of a 2.0 M aqueous solution of sodium carbonate (57.0 mmole) were added, and the resultant mixture was heated under the atmosphere of argon in the refluxing condition for 16 hours. After the reaction fluid was filtered, the obtained solid substance was washed with water, methanol and methylene chloride, and 1.70 g (2.53 mmole: the yield: 32%) of Compound E22 was obtained. The obtained substance was identified to be the object compound in accordance with 90 MHz $^1$H-NMR and FD-MS (the field desorption mass spectroscopy). The result of FD-MS is shown in the following.

FD-MS: calcd. for $C_{46}H_{28}N_2S_2$=672; found: m/z=672 ($M^+$, 100)

The obtained compound was purified by sublimation at 350° C. The purity of Compound E22 obtained after the purification by sublimation was 99.3%.

Synthesis Example 8

Synthesis of Compound D22

The route of synthesis of Compound D22 is shown in the following.

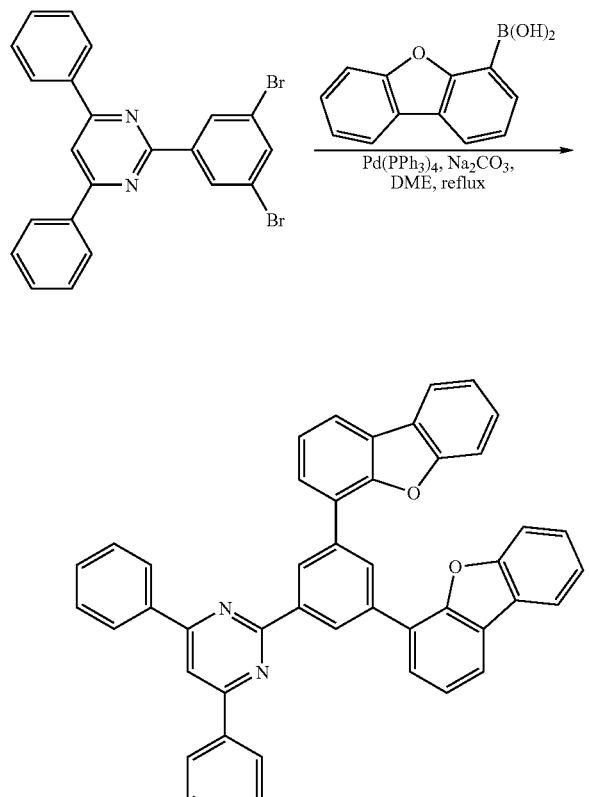

D22

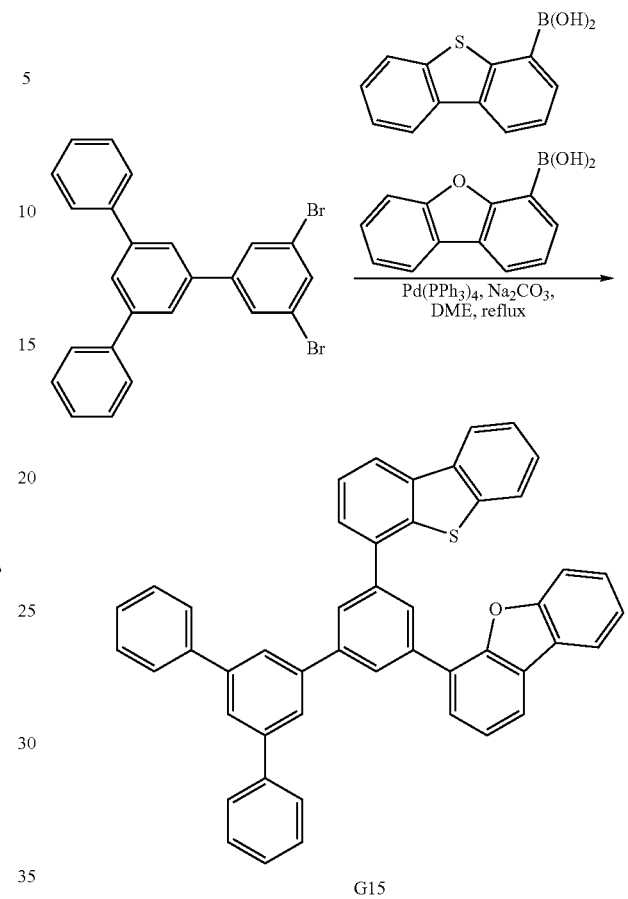

G15

Into a 300 ml three-necked flask, 4.87 g (22.9 mmole) of 4-dibenzofuranboric acid, 4.50 g (9.65 mmole) of aryl dibromide and 1.32 g (1.15 mmole) of tetrakis(triphenylphosphine)palladium were placed under the atmosphere of argon, and the flask was purged with argon. To the above mixture, 68.7 ml of 1,2-dimethoxyethane and 34.4 ml of a 2.0 M aqueous solution of sodium carbonate (68.7 mmole) were added, and the resultant mixture was heated under the atmosphere of argon in the refluxing condition for 16 hours. After the reaction fluid was filtered, the obtained solid substance was washed with water, methanol and methylene chloride, and 2.78 g (4.34 mmole; the yield: 45%) of Compound D22 was obtained. The obtained substance was identified to be the object compound in accordance with 90 MHz $^1$H-NMR and FD-MS (the field desorption mass spectroscopy). The result of FD-MS is shown in the following.

FD-MS: calcd. for $C_{46}H_{28}N_2O_2=640$; found: m/z=640 (M$^+$, 100)

The obtained compound was purified by sublimation at 330° C. The purity of Compound D22 obtained after the purification by sublimation was 99.5%.

Synthesis Example 9

Synthesis of Compound G15

The route of synthesis of Compound G15 is shown in the following.

Into a 300 ml three-necked flask, 2.31 g (10.9 mmole) of 4-dibenzofuranboric acid, 2.48 g (10.9 mmole) 4-dibenzothiopheneboric acid, 4.21 g (9.07 mmole) of aryl dibromide and 1.26 g (1.09 mmole) of tetrakis(triphenylphosphine)palladium were placed under the atmosphere of argon, and the flask was purged with argon. To the above mixture, 65.4 ml of 1,2-dimethoxyethane and 32.7 ml of a 2.0 M aqueous solution of sodium carbonate (65.4 mmole) were added, and the resultant mixture was heated under the atmosphere of argon in the refluxing condition for 16 hours. To the reaction fluid, 100 ml of water and 100 ml of methylene chloride were added, and the organic layer was separated and dried with anhydrous magnesium sulfate. After the dried solution was concentrated under a reduced pressure using an evaporator, the formed solid substance was purified in accordance with the silica gel column chromatography (the elution solvent: methylene chloride/hexane=1/3), and 1.49 g (2.27 mmole; the yield: 25%) of Compound G15 was obtained. The obtained substance was identified to be the object compound in accordance with 90 MHz $^1$H-NMR and FD-MS (the field desorption mass spectroscopy). The result of FD-MS is shown in the following.

FD-MS: calcd. for $C_{48}H_{30}OS=654$; found: m/z=654 (M$^+$, 100)

The obtained compound was purified by sublimation at 200° C. The purity of Compound G15 obtained after the purification by sublimation was 99.2%.

Synthesis Example 10

Synthesis of Compound H2

The route of synthesis of Compound H2 is shown in the following.

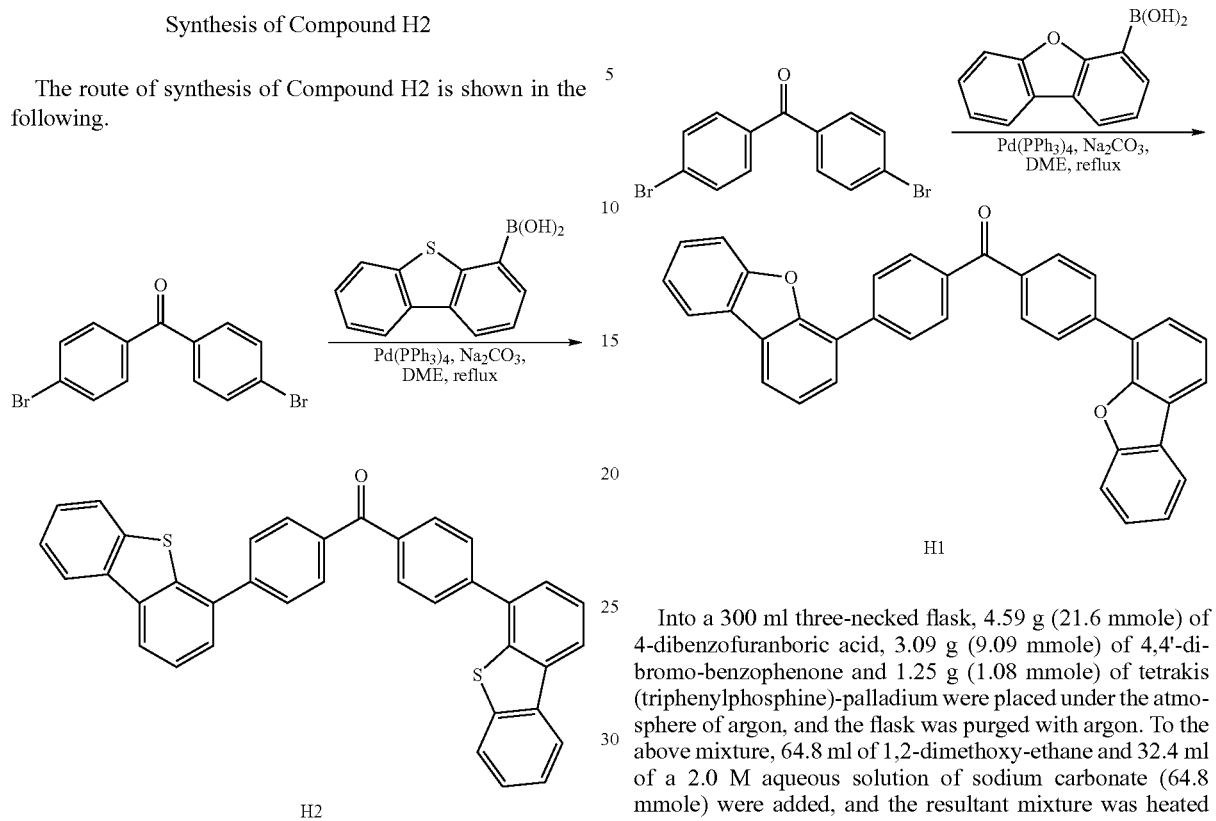

H2

Into a 300 ml three-necked flask, 4.44 g (19.5 mmole) of 4-dibenzothiopheneboric acid, 2.78 g (8.18 mmole) of 4,4'-dibromo-benzophenone and 1.13 g (0.975 mmole) of tetrakis(triphenylphosphine)-palladium were placed under the atmosphere of argon, and the flask was purged with argon. To the above mixture, 58.5 ml of 1,2-dimethoxyethane and 29.3 ml of a 2.0 M aqueous solution of sodium carbonate (58.5 mmole) were added, and the resultant mixture was heated under the atmosphere of argon in the refluxing condition for 8 hours. After the reaction fluid was filtered, the obtained solid substance was washed with water, methanol and toluene, and 3.31 g (6.05 mmole; the yield: 74%) of Compound H2 was obtained. The obtained substance was identified to be the object compound in accordance with 90 MHz $^1$H-NMR and FD-MS (the field desorption mass spectroscopy). The result of FD-MS is shown in the following.

FD-MS: calcd. for $C_{37}H_{22}OS_2$=546; found: m/z=546 (M$^+$, 100)

The obtained compound was purified by sublimation at 320° C. The purity of Compound H2 obtained after the purification by sublimation was 99.0%.

Synthesis Example 11

Synthesis of Compound H1

The route of synthesis of Compound H1 is shown in the following.

H1

Into a 300 ml three-necked flask, 4.59 g (21.6 mmole) of 4-dibenzofuranboric acid, 3.09 g (9.09 mmole) of 4,4'-dibromo-benzophenone and 1.25 g (1.08 mmole) of tetrakis(triphenylphosphine)-palladium were placed under the atmosphere of argon, and the flask was purged with argon. To the above mixture, 64.8 ml of 1,2-dimethoxy-ethane and 32.4 ml of a 2.0 M aqueous solution of sodium carbonate (64.8 mmole) were added, and the resultant mixture was heated under the atmosphere of argon in the refluxing condition for 8 hours. After the reaction fluid was filtered, the obtained solid substance was washed with water, methanol and toluene, and 2.67 g (5.18 mmole; the yield: 57%) of Compound H1 was obtained. The obtained substance was identified to be the object compound in accordance with 90 MHz $^1$H-NMR and FD-MS (the field desorption mass spectroscopy). The result of FD-MS is shown in the following.

FD-MS: calcd. for $C_{37}H_{22}O_3$=514; found: m/z=514 (M$^+$, 100)

The obtained compound was purified by sublimation at 315° C. The purity of Compound H1 obtained after the purification by sublimation was 99.2%.

Example 1

Preparation of an Organic EL Device

A glass substrate of 25 mm×75 mm×1.1 mm thickness having an ITO transparent electrode (manufactured by GEOMATEC Company) was cleaned by application of ultrasonic wave in isopropyl alcohol for 5 minutes and then by exposure to ozone generated by ultraviolet light for 30 minutes. The cleaned glass substrate having the transparent electrode was attached to a substrate holder of a vacuum vapor deposition apparatus. On the surface of the cleaned substrate at the side having the transparent electrode, a film of HTM (the formula shown in the following) having a thickness of 100 nm was formed in a manner such that the formed film covered the transparent electrode. The formed film of HTM worked as the hole injection and transport layer. Following the formation of the hole injection and transport layer, Compound D1 as the host compound and Complex P expressed by the formula shown in the following were vapor deposited simultaneously on the formed film of HTM in accordance with the resistance heating method so that a film having a thickness of 30 nm was formed. The concentration of Complex P was 7% by weight. The formed film of the host compound and Compound D1 worked as the light emitting layer. Following the formation of the light emitting layer, a film having a thickness of 25 nm of ETM1 shown in the following was formed and, then, a film having a thickness of 5 nm of ETM2 shown in the following was formed on the formed film of ETM1. The layers of ETM1 and ETM2 worked as the electron transport layer and the electron injection layer, respectively. Then, LiF was vapor deposited at a rate of 1 Å/min to form a film having a thickness of 0.1 nm so that an electron injection electrode (the cathode) was formed. On the formed LiF layer, metallic aluminum was vapor deposited to form a film having a thickness of 150 nm so that a metal cathode having a thickness of 150 nm was formed. Thus, an organic EL device was prepared.

(Evaluation of the Light Emitting Property of the Organic EL Device)

The organic EL device prepared as described above was driven under a direct current (the current density J=1 mA/cm$^2$) to emit light. The luminance (L) was measured, and the efficiency of light emission (L/J) was obtained. The results are shown in Table 1.

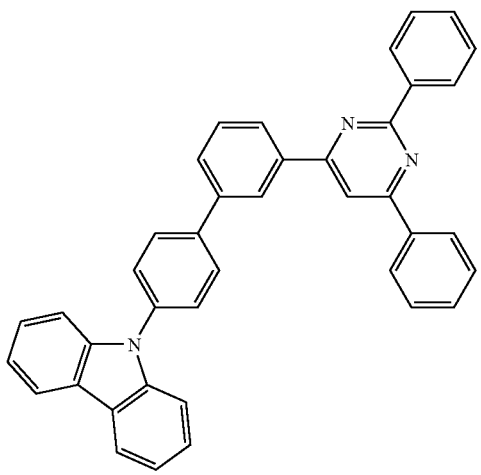

ETM1

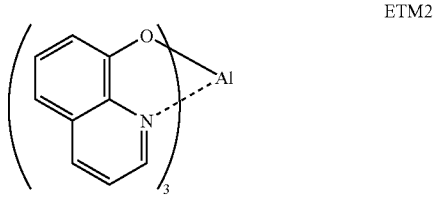

ETM2

HT

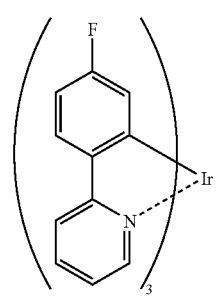

Complex P

Examples 2 to 9

Organic EL devices were prepared in accordance with the same procedures as those conducted in Example 1 except that compounds described in the column of the host compound in Table 1 were used as the host compound in place of Compound D1. The efficiency of light emission of the obtained organic EL devices each was measured in accordance with the same procedure as that conducted in Example 1. The results are shown in Table 1.

Comparative Examples 1 to 3

Organic EL devices were prepared in accordance with the same procedures as those conducted in Example 1 except that compounds described in International Patent Publication No. WO 2004/096945, Japanese Patent Application Laid-Open No. Heisei 5 (1993)-109485 and Japanese Patent Application Laid-Open No. 2004-214050 were used as the host compound in Comparative Examples 1, 2 and 3, respectively, in place of Compound D1. The formulae are shown in the following. The efficiency of light emission of the obtained organic EL devices was measured in accordance with the same procedure as that conducted in Example 1. The results are shown in Table 1.

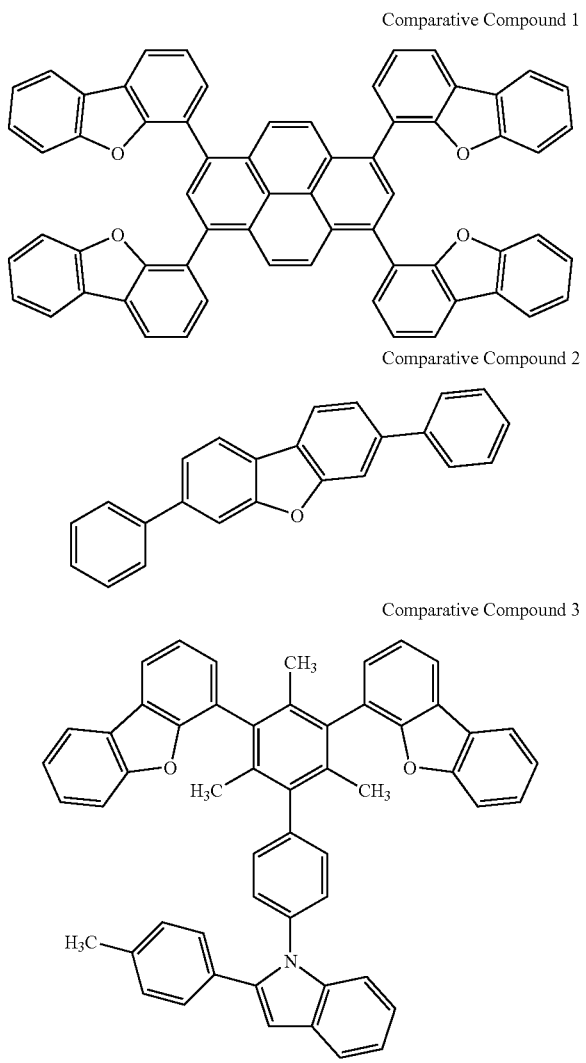

Comparative Compound 1

Comparative Compound 2

Comparative Compound 3

TABLE 1

| Host compound | J (mA/cm$^2$) | L (cd/m$^2$) | L/J (cd/A) |
|---|---|---|---|
| D1 | 1.0 | 400 | 40 |
| E1 | 1.0 | 284 | 28 |
| E4 | 1.0 | 310 | 31 |
| E2 | 1.0 | 295 | 30 |
| E3 | 1.0 | 456 | 46 |
| D3 | 1.0 | 482 | 48 |
| D22 | 1.0 | 405 | 41 |
| E22 | 1.0 | 325 | 33 |
| G15 | 1.0 | 358 | 36 |
| H1 | 1.0 | 328 | 33 |
| H2 | 1.0 | 444 | 44 |
| Comparative Example 1 | 1.0 | 20 | 2.0 |
| Comparative Example 2 | 1.0 | 32 | 3.2 |
| Comparative Example 3 | 1.0 | 139 | 14 |

The results in Table 1 show that the organic EL devices using the compound of the present invention in the light emitting layer exhibited greater efficiencies of light emission. It is shown that the compound of the present invention is useful for application to organic EL devices.

INDUSTRIAL APPLICABILITY

As described specifically in the above, the organic EL device exhibiting a great efficiency of light emission, having no defect pixels, exhibiting excellent heat resistance and having a long life can be obtained when the material for organic EL devices of the present invention comprising the compound represented by any one of general formulae (1) to (14) is used and, therefore, the organic EL device of the present invention is very useful as the light source for various electronic instruments.

The invention claimed is:

1. A material for organic electroluminescence devices, which comprises a compound represented by following general formula (3):

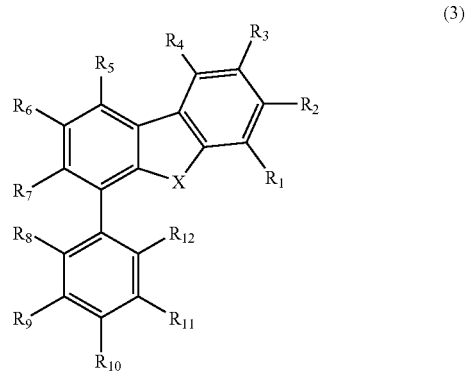

(3)

wherein $R_1$ to $R_{12}$ each independently represent hydrogen atom, a halogen atom, an alkyl group having 1 to 40 carbon atoms which may have substituents, a heterocyclic group having 3 to 60 carbon atoms and having no skeleton structure of benzotriazole which may have substituents, an alkoxyl group having 1 to 40 carbon atoms which may have substituents, an aryl group having 6 to 60 carbon atoms which may have substituents, an aryloxyl group having 6 to 60 carbon atoms which may have substituents, an aralkyl group having 7 to 60 carbon atoms which may have substituents, an alkenyl group having 2 to 40 carbon atoms which may have substituents, an alkylamino group having 1 to 40 carbon atoms which may have substituents, an aralkylamino group having 7 to 60 carbon atoms which may have substituents, an alkylsilyl group having 3 to 20 carbon atoms which may have substituents, an arylsilyl group having 8 to 40 carbon atoms which may have substituents, a ketoaryl group having 7 to 40 carbon atoms which may have substituents, a halogenated alkyl group having 1 to 40 carbon atoms which may have substituents or cyano group provided that each R8 to R12 do not represent an alkyl group having 1 to 40 carbon atoms which may have substituents, an aralkyl group having 7 to 60 carbon atoms which may have substituents, an alkenyl group having 2 to 40 carbon atoms which may have substituents, or a halogenated alkyl group having 1 to 40 carbon atoms which may have substituents;

at least one of $R_8$ to $R_{12}$ representing hydrogen atom;

adjacent groups among groups represented by $R_1$ to $R_4$, among groups represented by $R_5$ to $R_7$ and among groups represented by $R_8$ to $R_{12}$ may be bonded to each other to form a saturated or unsaturated cyclic structure; and X represents sulfur atom, oxygen atom or a substituted silicon atom represented by SiRaRb, Ra and Rb each independently representing an alkyl group having 1 to 40 carbon atoms, provided that the compound excludes 1,3,5-tris(4-dibenzothiophenyl)benzene.

2. An organic electroluminescence device comprising a cathode, an anode and an organic thin film layer which comprises one layer or a plurality of layers comprising at least a light emitting layer and is disposed between the cathode and the anode, wherein at least one layer in the organic thin film layer comprises a material for organic electroluminescence devices described in claim 1.

3. An organic electroluminescence device according to claim 2, wherein the light emitting layer comprises a host material and a phosphorescent light emitting material, and the host material comprises a material for organic electroluminescence devices described in claim 1.

4. An organic electroluminescence device according to claim 3, wherein light emitted from the phosphorescent light emitting material has a peak wavelength of 500 nm or shorter.

5. An organic electroluminescence device according to claim 3, wherein the phosphorescent light emitting material is a compound having a metal selected from Er, Os and Pt.

6. An organic electroluminescence device according to claim 3, wherein the phosphorescent light emitting material is a light emitting material having one or more carbene ligands coordinated to a metal center.

7. An organic electroluminescence device according to claim 2, wherein the material for organic electroluminescence devices is a host material comprised in the light emitting layer of the organic electroluminescence device.

8. An organic electroluminescence device according to claim 2, wherein the material for organic electroluminescence devices is a material comprised in a hole transport layer of the organic electroluminescence device.

9. An organic electroluminescence device according to claim 2, wherein the material for organic electroluminescence devices is a material comprised in an electron transport layer or a hole blocking layer of the organic electroluminescence device.

10. An organic electroluminescence device according to claim 2, wherein a reducing dopant is added into an interfacial region of the cathode and the organic thin film layer.

11. An organic electroluminescence device according to claim 2, wherein an electron injection layer is disposed between the light emitting layer and the cathode, and the electron injection layer comprises a cyclic derivative having one or more nitrogen atoms as a main component.

* * * * *